US011923252B2

(12) United States Patent
Yeong et al.

(10) Patent No.: US 11,923,252 B2
(45) Date of Patent: Mar. 5, 2024

(54) SEMICONDUCTOR DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Sai-Hooi Yeong, Zhubei (TW); Bo-Feng Young, Taipei (TW); Chi-On Chui, Hsinchu (TW); Chih-Chieh Yeh, Taipei (TW); Cheng-Hsien Wu, Hsinchu (TW); Chih-Sheng Chang, Hsinchu (TW); Tzu-Chiang Chen, Hsinchu (TW); I-Sheng Chen, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 531 days.

(21) Appl. No.: 17/159,823

(22) Filed: Jan. 27, 2021

(65) Prior Publication Data
US 2021/0175129 A1 Jun. 10, 2021

Related U.S. Application Data

(63) Continuation-in-part of application No. 16/700,227, filed on Dec. 2, 2019, now Pat. No. 11,056,401,
(Continued)

(51) Int. Cl.
*H01L 21/8238* (2006.01)
*H01L 27/092* (2006.01)
(Continued)

(52) U.S. Cl.
CPC ............ *H01L 21/823857* (2013.01); *H01L 21/823807* (2013.01); *H01L 21/823885* (2013.01);
(Continued)

(58) Field of Classification Search
CPC . H01L 21/823857; H01L 27/092–0928; H01L 29/0673; H01L 29/42392
See application file for complete search history.

(56) References Cited

U.S. PATENT DOCUMENTS 9,209,247 B2   12/2015   Colinge et al.
9,236,267 B2   1/2016    De et al.
(Continued)

OTHER PUBLICATIONS

Hsing-Huang Tseng et al., "The Progress and Challenges of Threshold Voltage Control of High-k/Metal-Gated Devices for Advanced Technologies (Invited Paper)", Microelectronic Engineering 86 (2009), p. 1722-1727.

(Continued)

*Primary Examiner* — Daniel P Shook
(74) *Attorney, Agent, or Firm* — Birch, Stewart, Kolasch & Birch, LLP

(57) ABSTRACT

A semiconductor device includes a first set of nanostructures stacked over a substrate in a vertical direction, and each of the first set of nanostructures includes a first end portion and a second end portion, and a first middle portion laterally between the first end portion and the second end portion. The first end portion and the second end portion are thicker than the first middle portion. The semiconductor device also includes a first plurality of semiconductor capping layers around the first middle portions of the first set of nanostructures, and a gate structure around the first plurality of semiconductor capping layers.

20 Claims, 53 Drawing Sheets

Related U.S. Application Data which is a continuation of application No. 16/234,916, filed on Dec. 28, 2018, now Pat. No. 10,504,796, which is a continuation of application No. 15/632,449, filed on Jun. 26, 2017, now Pat. No. 10,170,374.

(60) Provisional application No. 62/475,341, filed on Mar. 23, 2017.

(51) Int. Cl.
  *H01L 29/06* (2006.01)
  *H01L 29/423* (2006.01)
  *H01L 29/786* (2006.01)

(52) U.S. Cl.
  CPC ........ *H01L 27/092* (2013.01); *H01L 29/0673* (2013.01); *H01L 29/42392* (2013.01); *H01L 29/78696* (2013.01)

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2016/0079358 A1 | 3/2016 | Doornbos et al. | |
| 2017/0103986 A1 | 4/2017 | Kim et al. | |
| 2017/0110201 A1 | 4/2017 | Lien et al. | |
| 2021/0359142 A1* | 11/2021 | Huang | H01L 29/0673 |

OTHER PUBLICATIONS

Koji Kita et al., "Intrinsic Origin of Electric Dipoles Formed at High-k/SiO2 Interface", Department of Materials Engineering, The University of Tokyo, Electronic Devices Meeting, 2008, IEDM 2008, IEEE International.

Sang Young Lee et al., "The VFB Modulation Effect of Atomic Layer Deposited Al2O3, SrO, La2O3 Capping Layers with HfO2 gate Dielectrics", The Electrochemical Society, ECS Transactions, 33 (3) 53-58 (2010).

* cited by examiner

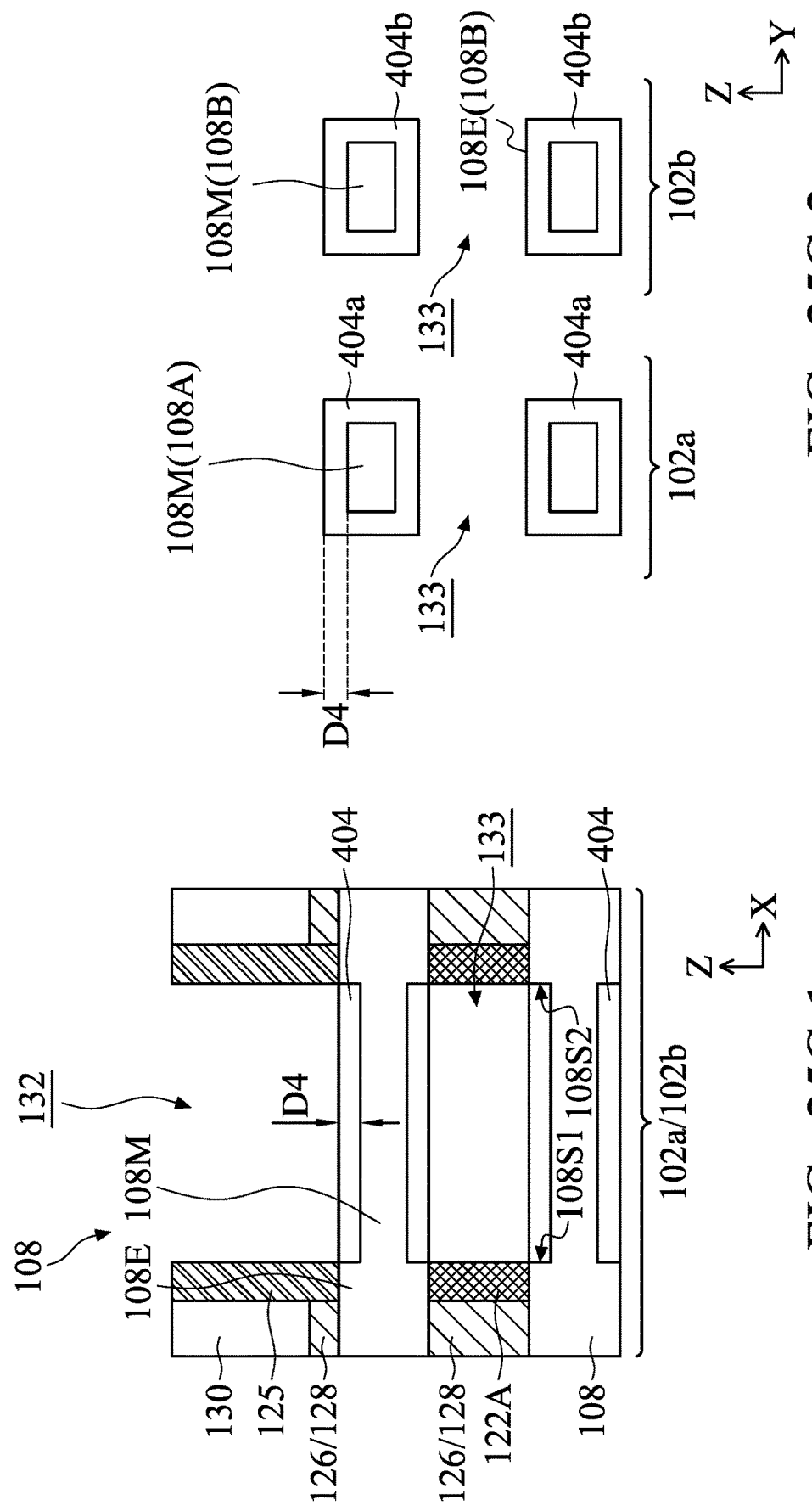

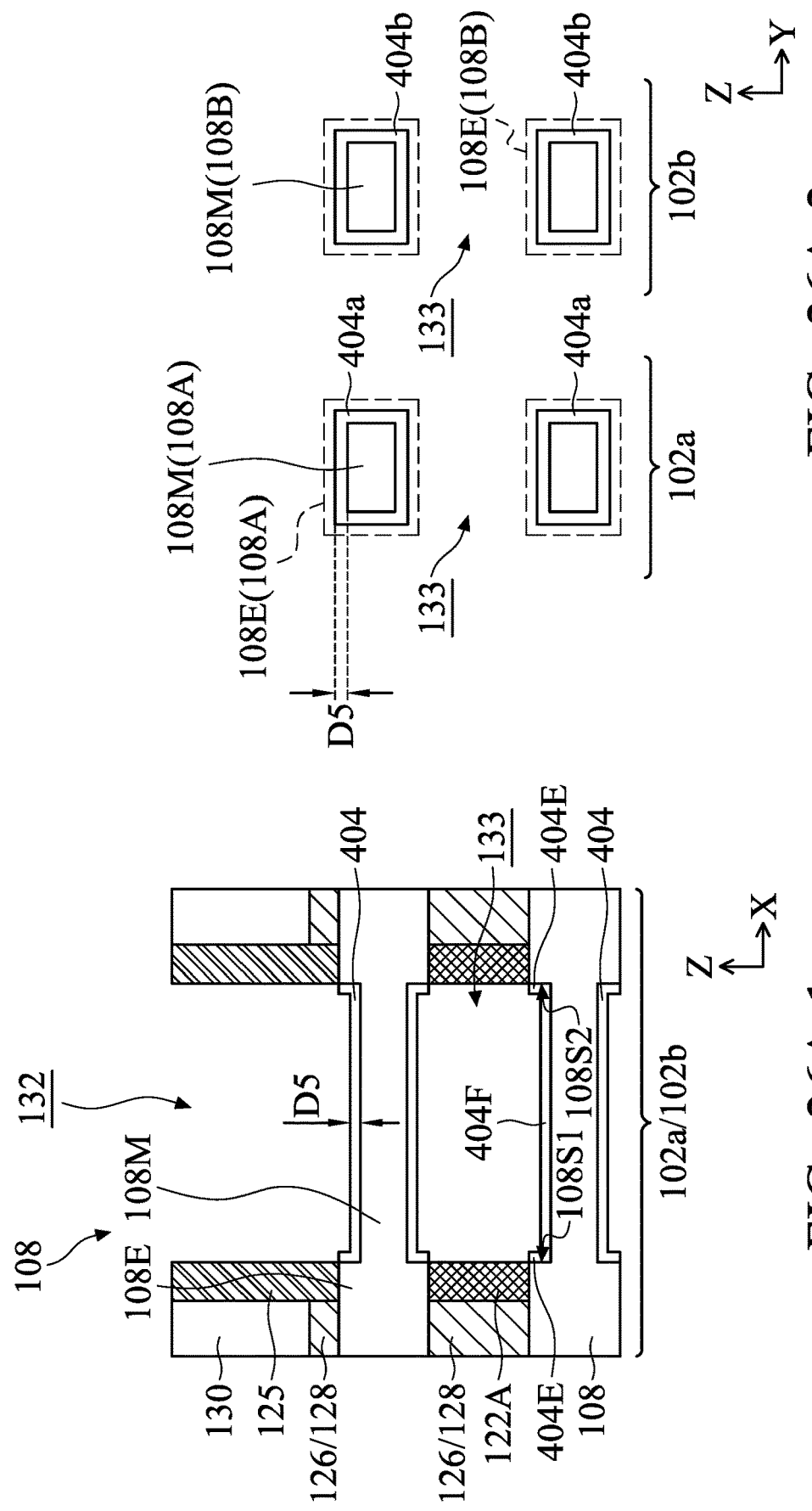

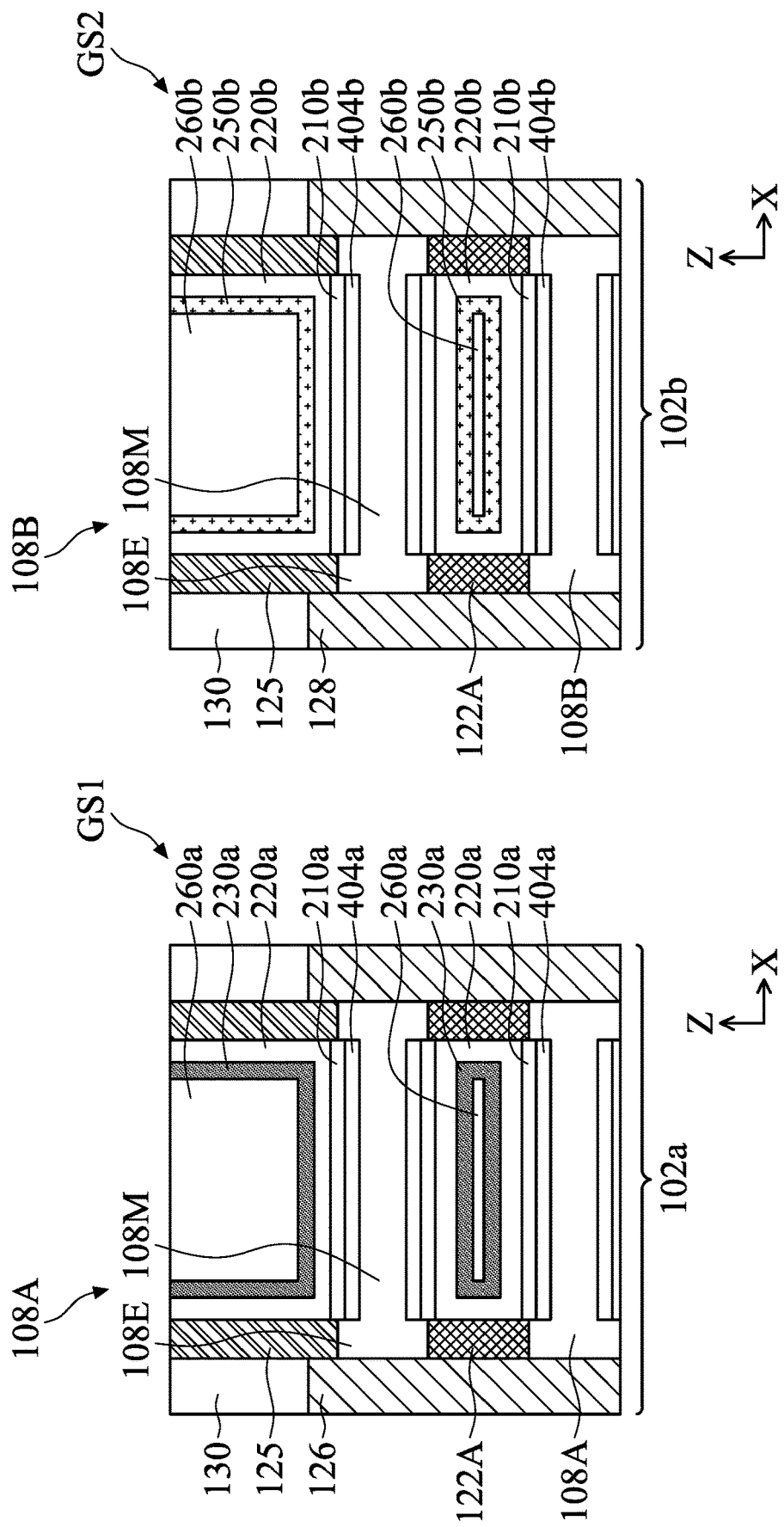

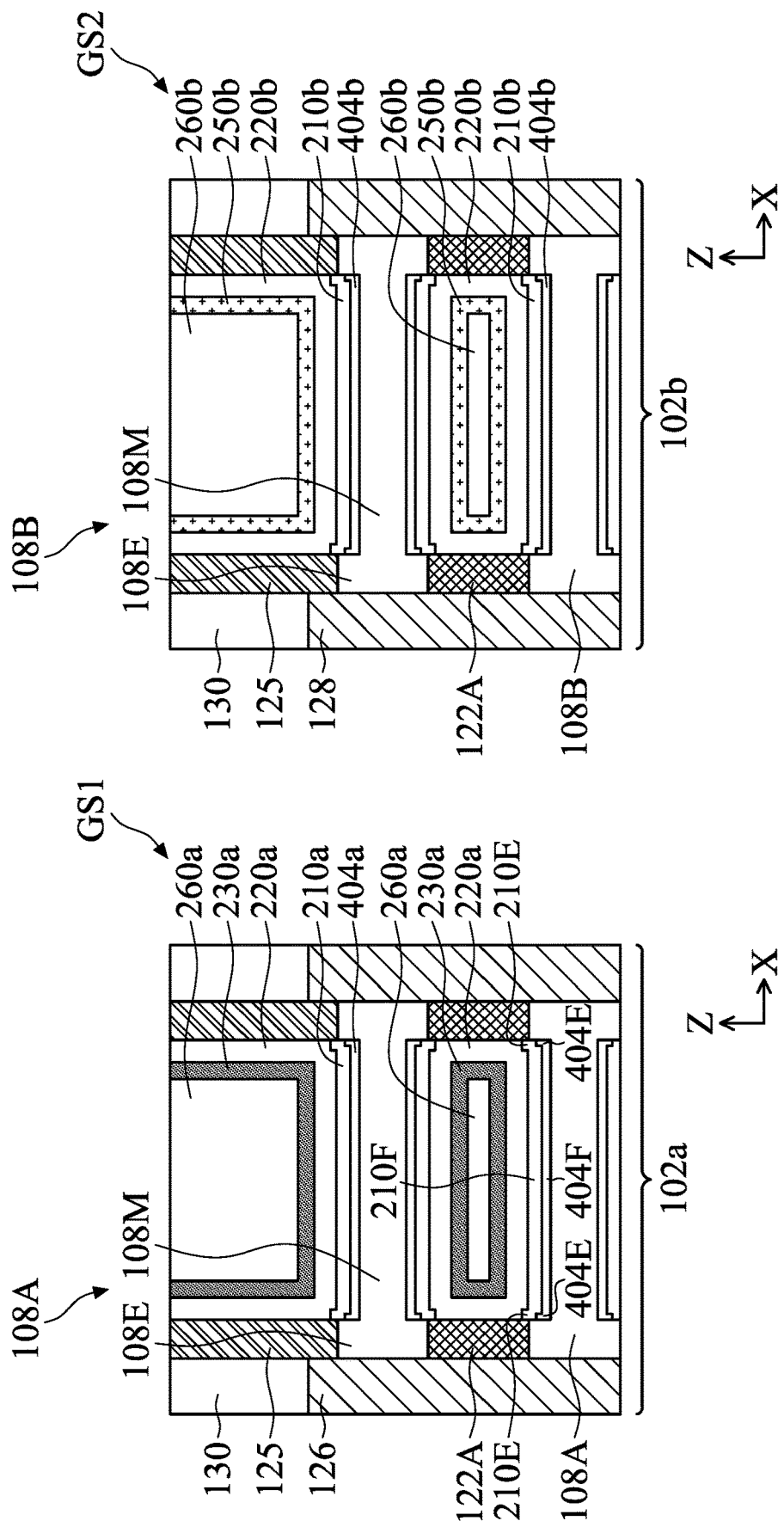

SEMICONDUCTOR DEVICE AND METHOD FOR MANUFACTURING THE SAME

RELATED APPLICATIONS

The present application is a Continuation-In-Part application of U.S. application Ser. No. 16/700,227, filed on Dec. 2, 2019, which is Continuation Application of U.S. Ser. No. 16/234,916 filed on Dec. 28, 2018, which is Continuation Application of Ser. No. 15/632,449 filed on Jun. 26, 2017, which claims priority to U.S. Provisional Application Ser. No. 62/475,341, filed on Mar. 23, 2017, which are incorporated herein by reference in their entirety.

BACKGROUND

Complementary metal oxide semiconductor (CMOS) technology, formed by establishing an n-type field effect transistor and a p-type field effect transistor on a semiconductor device, is used in IC manufacturing. Technological advances in IC materials and design have produced generations of ICs where each generation has smaller and more complex circuits than the previous generation. As a result, n-type field effect transistors and p-type field effect transistors on semiconductor devices have been scaled down as well.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 25A-1 to 25D-3 illustrate one or more steps of forming a semiconductor device in accordance with some embodiments of the present disclosure.

FIGS. 26A-1 to 26B-3 illustrate one or more steps of forming a semiconductor device in accordance with some embodiments of the present disclosure.

FIGS. 27A-1 to 27B-3 illustrate one or more steps of forming a semiconductor device in accordance with some embodiments of the present disclosure.

FIGS. 28-1 to 28-3 illustrate one or more steps of forming a semiconductor device in accordance with some embodiments of the present disclosure.

FIGS. 29-1 and 29-2 are cross-sectional views of the semiconductor device in accordance with some embodiments of the present disclosure.

FIGS. 30-1 and 30-2 are cross-sectional views of the semiconductor device in accordance with some embodiments of the present disclosure.

FIGS. 31-1 and 31-2 are cross-sectional views of the semiconductor device in accordance with some embodiments of the present disclosure.

FIGS. 32-1 and 32-2 are cross-sectional views of the semiconductor device in accordance with some embodiments of the present disclosure.

DETAILED DESCRIPTION

Figure 1:
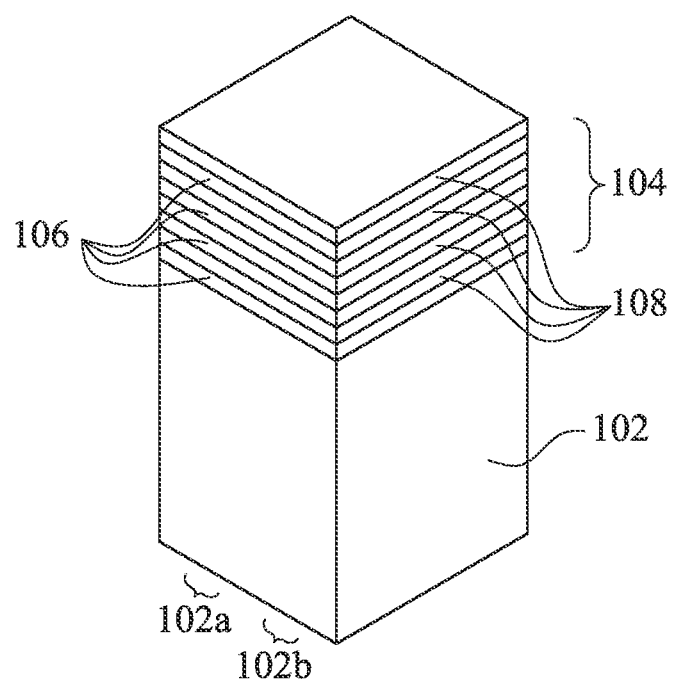
FIGS. 1-16 illustrate a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate-all-around (GAA) transistor structures may be patterned using any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-16 illustrate a method of forming a semiconductor device in accordance with some embodiments of the present disclosure. Reference is made to FIG. 1. An epitaxial stack 104 is formed over the substrate 102. In some embodiments, the substrate 102 may be a semiconductor substrate such as a silicon substrate. In some embodiments, the substrate 102 may include various layers, including conductive or insulating layers formed on a semiconductor substrate. In some embodiments, different doping profiles (e.g., n wells, p wells) may be formed on the substrate 102 in device regions 102*a* and 102*b* designed for different device types (e.g., n-type field effect transistors (NFET), p-type field effect transistors (PFET)). The doping may include ion implantation of dopants and/or diffusion processes. In some embodiments, the substrate 102 may also include other semiconductors such as germanium, silicon carbide (SiC), silicon germanium (SiGe), or diamond. In some embodiments, the substrate 102 may include a compound semiconductor and/or an alloy semiconductor. In some embodiments, the substrate 102 may optionally include an epitaxial layer (epi-layer), may be strained for performance enhancement, may include a silicon-on-insulator (SOI) structure, and/or have other suitable enhancement features.

The epitaxial stack 104 includes first epitaxial layers 106 of a first composition interposed by second epitaxial layers 108 of a second composition. The first and second composition can be different. In some embodiments, the first epitaxial layers 106 are SiGe and the second epitaxial layers 108 are silicon (Si). In some embodiments, the first epitaxial layers 106 and the second epitaxial layers 108 have different oxidation rates and/or etch selectivity. In some embodiments, the first epitaxial layers 106 include SiGe and the second epitaxial layers 108 include Si, and the Si oxidation rate of the second epitaxial layers 108 is less than the SiGe oxidation rate of the first epitaxial layers 106.

The second epitaxial layers 108 or portions thereof may form a channel region of a semiconductor device. In some embodiments, the second epitaxial layers 108 may be referred to as "nanowires" used to form a channel region of a semiconductor device such as a gate-all-around (GAA) transistor. These "nanowires" are also used to form portions of the source/drain features of the GAA transistor. As the term is used herein, "nanowires" refers to semiconductor layers that are cylindrical in shape as well as other configurations such as, bar-shaped. The use of the second epitaxial layers 108 to define a channel or channels of the semiconductor device is further provided below.

It should be noted that four layers of each of the first epitaxial layers 106 and the second epitaxial layers 108 are illustrated in FIG. 1, and this is for illustrative purpose and not intended to be limiting beyond what is specifically recited in the claims. It should be appreciated that any number of epitaxial layers can be formed in the epitaxial stack 104; the number of layers depending on the desired number of channels regions for the GAA transistor. In some embodiments, the number of second epitaxial layers 108 is between two and ten.

In some embodiments, the first epitaxial layers 106 are substantially uniform in thickness. In some embodiments, the second epitaxial layers 108 are substantially uniform in thickness. As described in more detail below, the second epitaxial layers 108 may serve as channel region(s) for a subsequently-formed GAA transistor and its thickness chosen based on device performance considerations. The first epitaxial layers 106 may serve to define at least one gap distance between adjacent channel region(s) for a subsequently-formed GAA device and its thickness chosen based on device performance considerations.

In some embodiments, epitaxial growth of the layers of the epitaxial stack 104 may be performed by a molecular beam epitaxy (MBE) process, a metalorganic chemical vapor deposition (MOCVD) process, and/or other suitable epitaxial growth processes. In some embodiments, the epitaxially grown layers (e.g., the first epitaxial layers 106 and the second epitaxial layers 108) include the same material as the substrate 102. In some embodiments, the epitaxially grown layers (e.g., the first epitaxial layers 106 and the second epitaxial layers 108) include a different material than the substrate 102. As stated above, in at least some examples, the first epitaxial layers 106 include at least one epitaxially grown silicon germanium (SiGe) layer and the second epitaxial layers 108 include at least one epitaxially grown silicon (Si) layer. In some embodiments, either of the first epitaxial layers 106 and the second epitaxial layers 108 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or a combination thereof. As discussed, the materials of the first epitaxial layers 106 and the second epitaxial layers 108 may be chosen based on providing differing oxidation and/or different etch selectivity properties. In some embodiments, the first epitaxial layers 106 and the second epitaxial layers 108 are substantially dopant-free where for example, no intentional doping is performed during the epitaxial growth process.

Figure 2A:
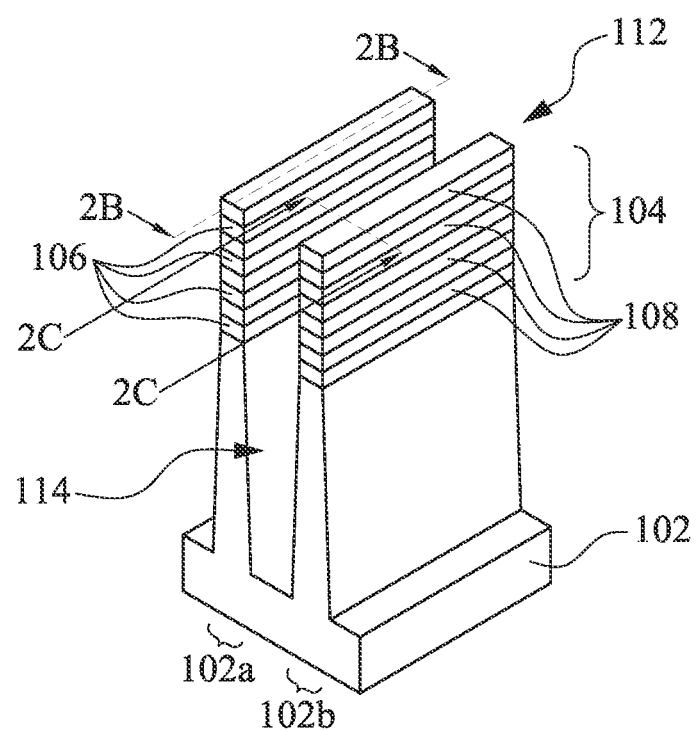
Figure 2B:
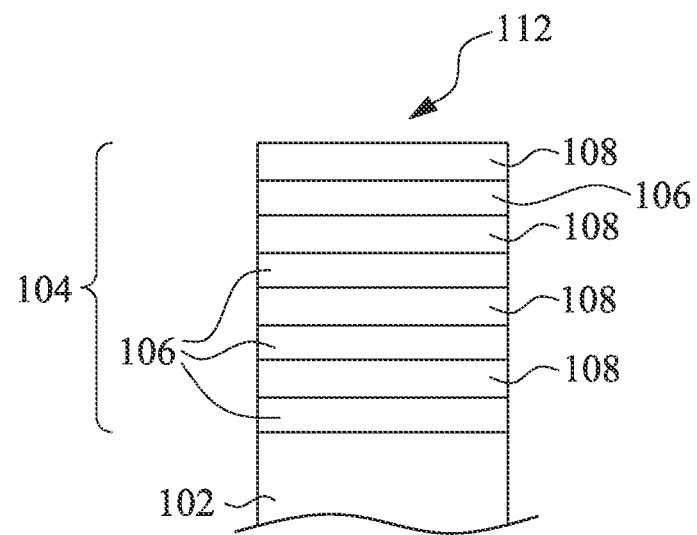
Figure 2C:
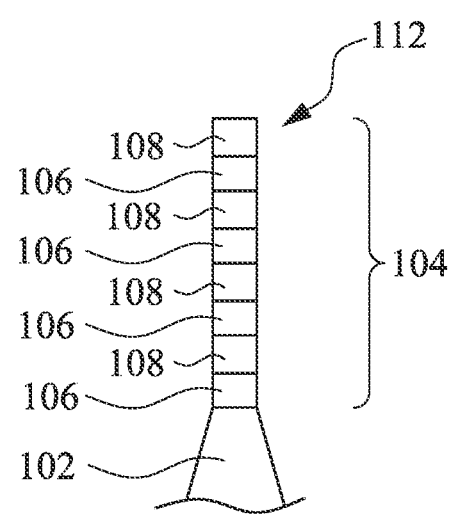

Reference is made to FIGS. 2A, 2B, and 2C, wherein FIGS. 2B and 2C are cross-sectional views taken along lines 2B and 2C in FIG. 2A. Fin elements 112 extending from the substrate 102 are formed. In some embodiments, each of the fin elements 112 includes a substrate portion formed from the substrate 102, and portions of each of the epitaxial layers of the epitaxial stack 104 including the first epitaxial layers 106 and the second epitaxial layers 108.

In some embodiments, the fin elements 112 may be fabricated using any suitable process, including photolithography and etch processes. The photolithography process may include forming a photoresist layer over the substrate 102 (e.g., over the epitaxial stack 104), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the epitaxial stack 104, while an etch process forms trenches 114 in unprotected regions through the masking element, thereby leaving the plurality of extending fin elements 112. In some embodiments, the trenches 114 may be etched using a dry etch (e.g., reactive ion etching), a wet etch, and/or other suitable processes.

Figure 3A:
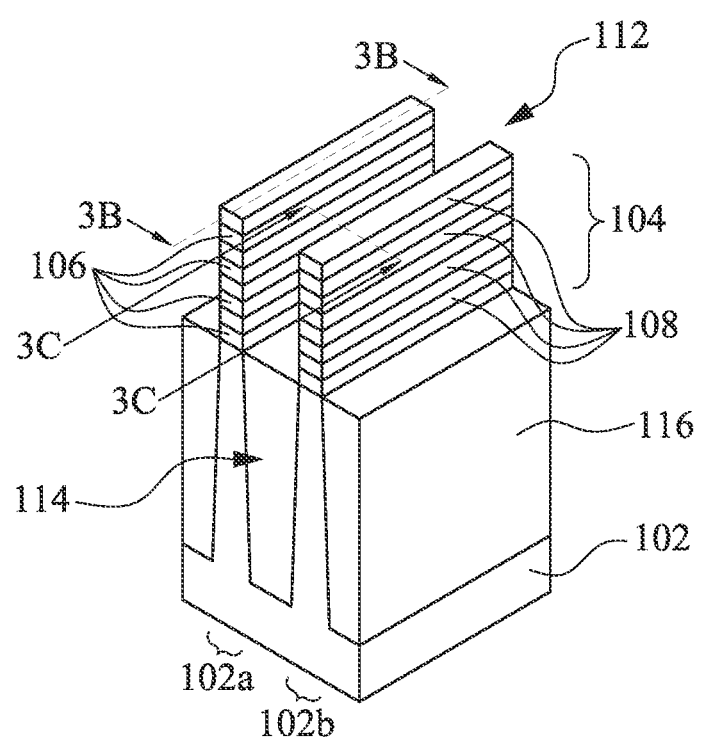
Figure 3B:
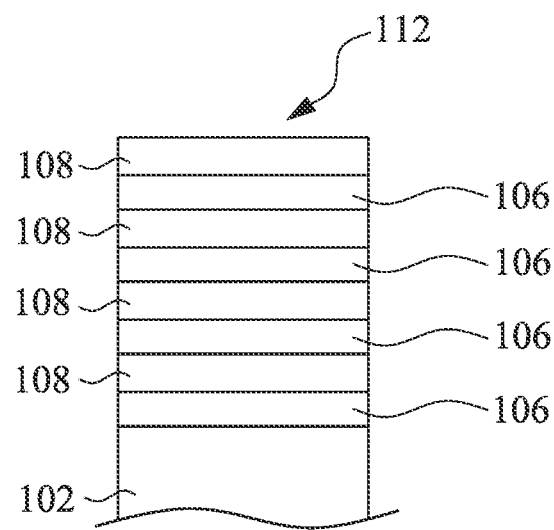
Figure 3C:
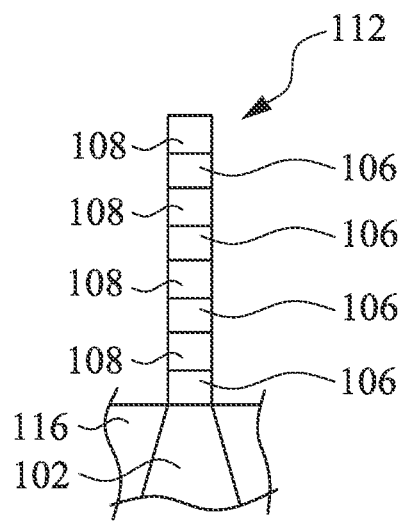

Reference is made to FIGS. 3A, 3B, and 3C, wherein FIGS. 3B and 3C are cross-sectional views taken along lines 3B and 3C in FIG. 3A. The trenches 114 are filled with dielectric material to form isolation features 116. The isolation features 116 can be referred to as shallow trench isolation (STI) features interposing the fin elements 112. In some embodiments, the isolation features 116 may include $SiO_2$, $Si_3N_4$, $SiO_xN_y$, fluorine-doped silicate glass (FSG), a low-k dielectric, combinations thereof, and/or other suitable materials. In some embodiments, the isolation features 116 may be deposited by a CVD process, a subatmospheric CVD (SACVD) process, a flowable CVD process, an ALD process, a PVD process, and/or other suitable process. In some embodiments, after deposition of the isolation features 116, an annealing process can be performed, for example, to improve the quality of the isolation features 116. In some embodiments, the isolation features 116 may include a multi-layer structure, for example, having one or more liner layers.

In some embodiments in which forming the STI features, after deposition of the isolation features 116, the deposited dielectric material is thinned and planarized by a chemical mechanical polishing (CMP) process. The CMP process may planarize top surfaces of the isolation features 116. In some embodiments, the STI features interposing the fin elements 112 are recessed, such that the fin elements 112 extend above the isolation features 116. In some embodiments, the recessing may include a dry etching process, a wet etching process, and/or a combination thereof. In some embodiments, a recessing depth is controlled (e.g., by controlling an etching time) so as to result in a desired height of the exposed upper portion of the fin elements 112, and the height exposes each of the layers of the epitaxial stack 104.

Numerous other embodiments of methods to form fin elements 112 on the substrate 102 may also be used including, for example, defining the fin region (e.g., by mask or isolation regions) and epitaxially growing the epitaxial stack 104 in the form of the fin elements 112. In some embodiments, forming the fin elements 112 may include a trim process to decrease the width of the fins, and the trim process may include wet or dry etching processes.

Figure 4A:
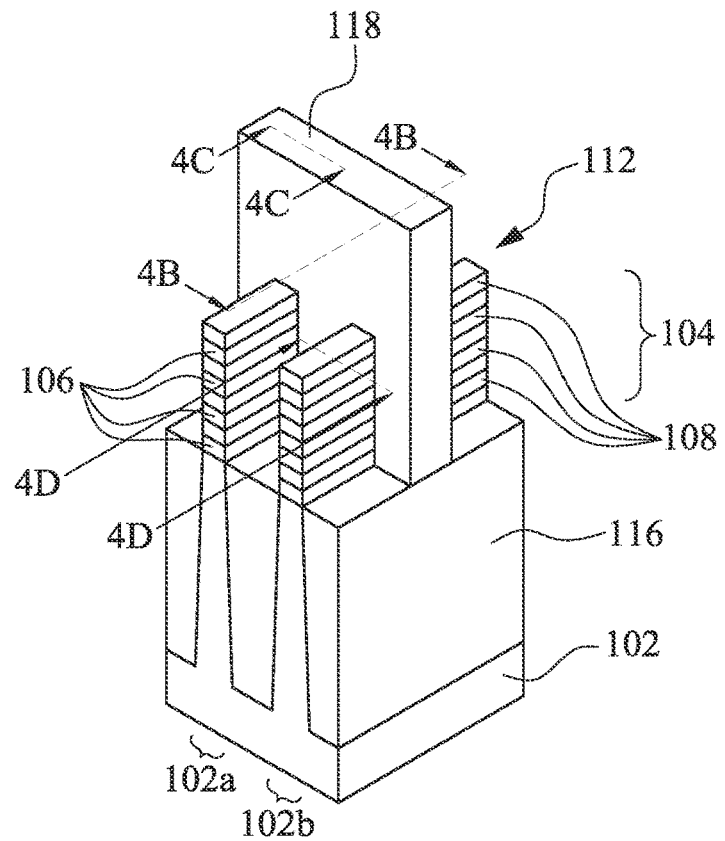
Figure 4B:
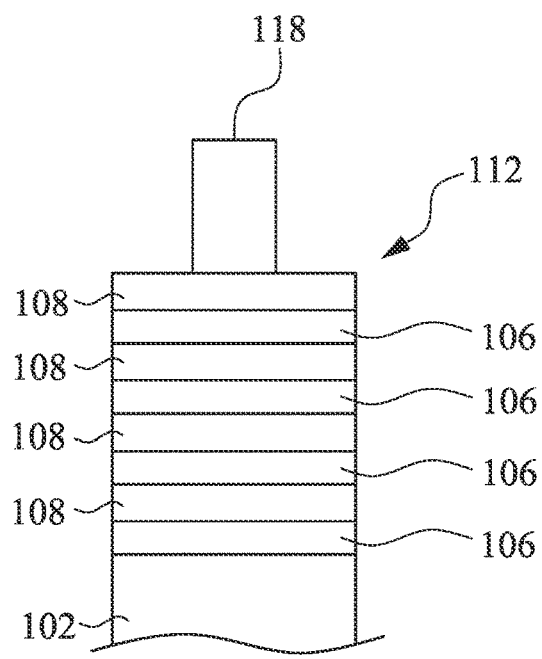
Figure 4C:
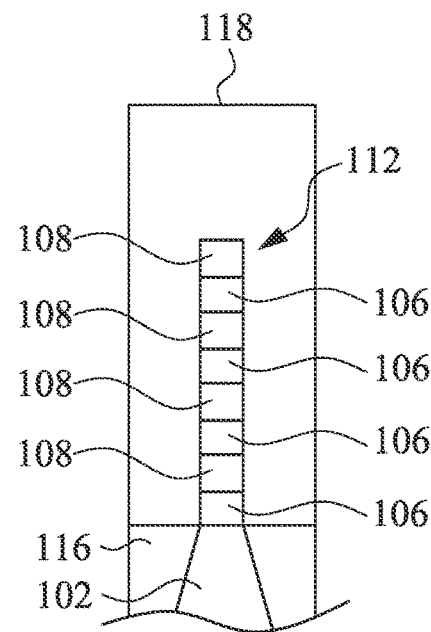
Figure 4D:
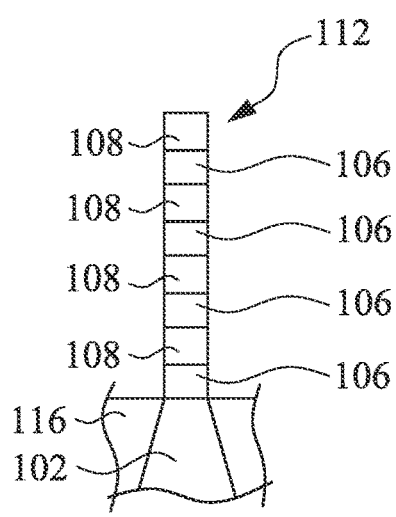

Reference is made to FIGS. 4A, 4B, 4C, and 4D, wherein FIGS. 4B, 4C, and 4D are cross-sectional views taken along lines 4B, 4C, and 4D in FIG. 4A. A gate stack 118 is formed. In some embodiments, the gate stack 118 is a dummy gate stack. That is, in some embodiments using a gate-last process, the gate stack 118 is a dummy gate stack and will be replaced by the final gate stack at a subsequent step. In some embodiments, the gate stack 118 may be replaced at a later step by a high-k dielectric layer and a metal gate electrode. In some embodiments, the gate stack 118 is formed over the substrate 102 and is at least partially disposed over the fin elements 112. Portions of the fin elements 112 underlying the gate stack 118 may be referred to as the channel regions or channels of GAA transistors. The gate stack 118 may also define source/drain regions of GAA transistors. In some embodiments, regions of the epitaxial stack 104 which are adjacent to the channel region and on opposite sides of the channel region may be referred to as the source/drain regions.

In some embodiments, the gate stack 118 includes one or more hard mask layers (e.g., oxide, nitride). In some embodiments, the gate stack 118 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or a combination thereof. In some embodiments, the patterning process for forming the gate stack 118 includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or a combination thereof. In some embodiments, the etching process may include dry etching (e.g., RIE etching), wet etching, and/or other etching methods.

As indicated above, the gate stack 118 may include an additional gate dielectric layer. In some embodiments, the gate stack 118 may include silicon oxide. In some embodiments, the additional gate dielectric layer of the gate stack 118 may include silicon nitride, a high-k dielectric material or other suitable material. In some embodiments, an electrode layer of the gate stack 118 may include polycrystalline silicon (polysilicon). In some embodiments, hard mask layers such as $SiO_2$, $Si_3N_4$, $SiO_xN_y$, alternatively include SiC, and/or other suitable compositions may also be included.

Figure 5A:
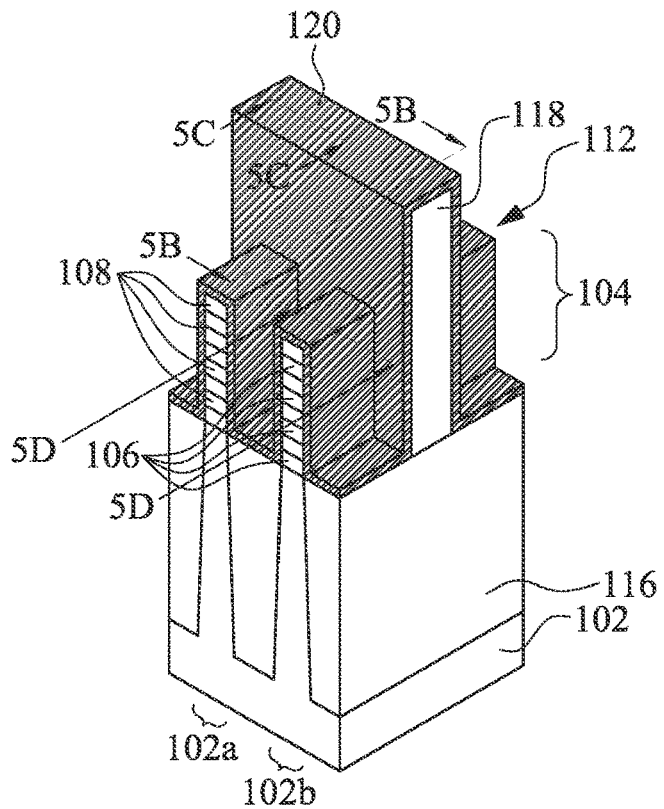
Figure 5B:
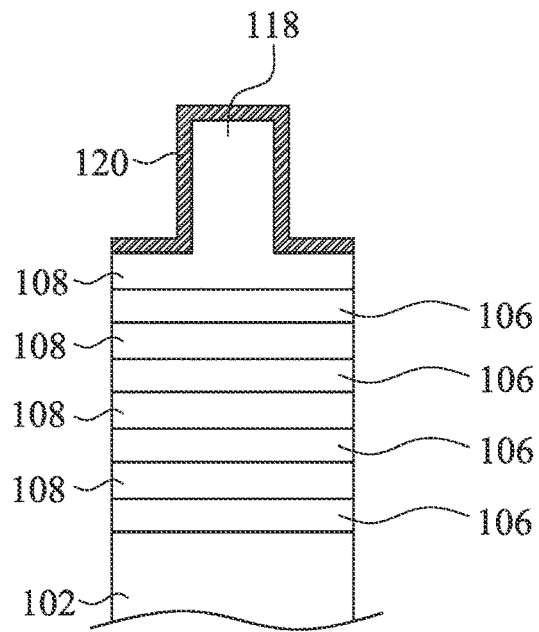
Figure 5C:
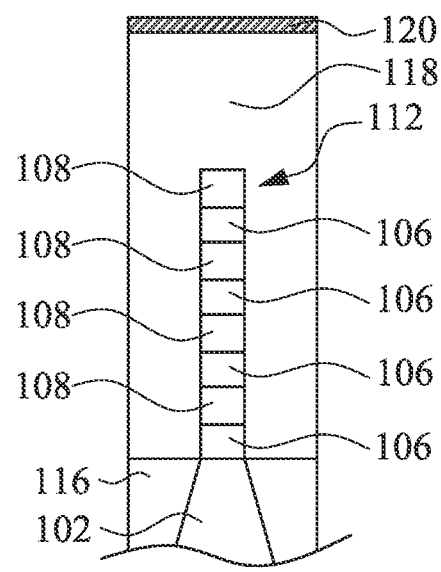
Figure 5D:
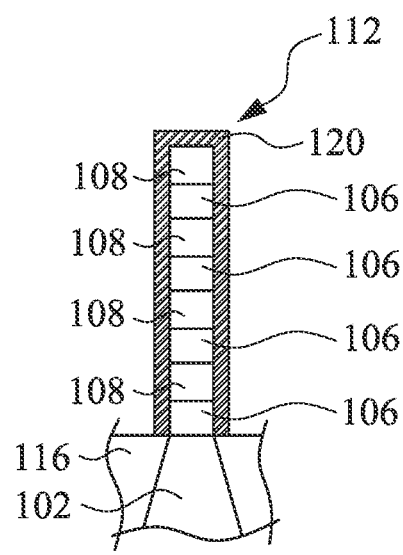

Reference is made to FIGS. 5A, 5B, 5C, and 5D, wherein FIGS. 5B, 5C, and 5D are cross-sectional views taken along lines 5B, 5C, and 5D in FIG. 5A. A spacer layer 120 is blanket formed over the substrate 102. The spacer layer 120 may include a dielectric material such as $SiO_2$, $Si_3N_4$, $SiO_xN_y$, SiC, SiCN films, SiOc, SiOCN films, and/or a combination thereof. In some embodiments, the spacer layer 120 includes multiple layers, such as main spacer walls, liner layers, and the like. In some embodiments, the spacer layer 120 may be formed by depositing a dielectric material over the gate stack 118 using processes such as, CVD process, a subatmospheric CVD (SACVD) process, a flowable CVD process, an ALD process, a PVD process, or other suitable process.

Figure 6A:
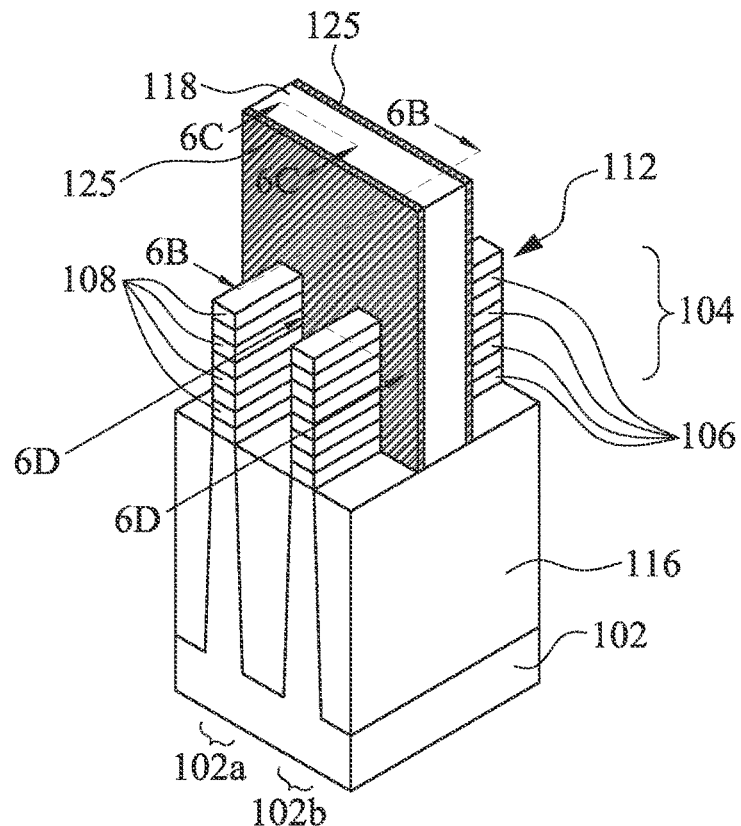
Figure 6B:
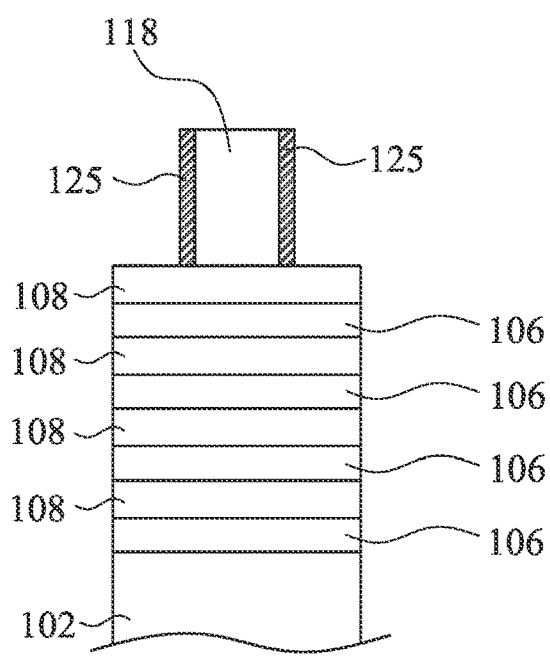
Figure 6C:
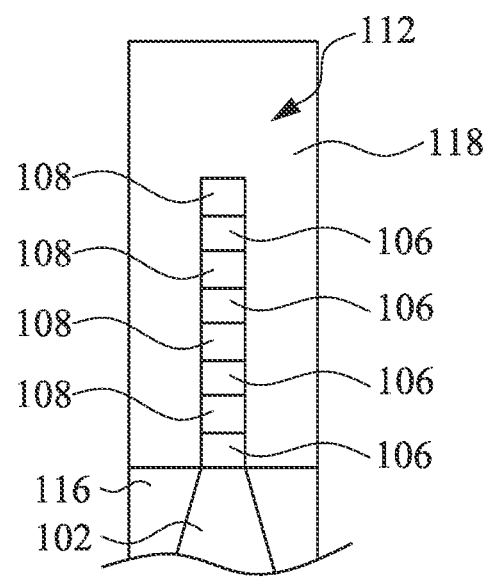
Figure 6D:
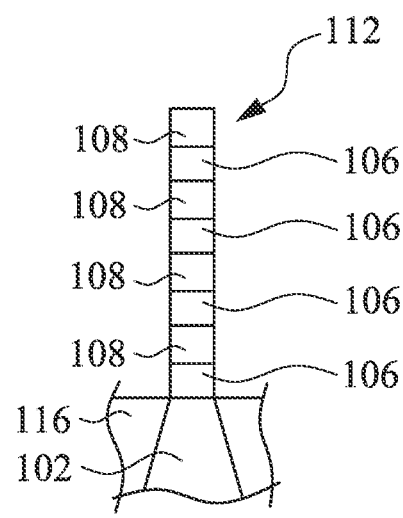

Reference is made to FIGS. 6A, 6B, 6C, and 6D, wherein FIGS. 6B, 6C, and 6D are cross-sectional views taken along lines 6B, 6C, and 6D in FIG. 6A. An etching-back process is performed to remove horizontal portions of the spacer layer 120, while remaining vertical portions of the spacer layer 120 on sidewalls of the gate stack 118 to act as spacers 125. That is, after the formation of the spacer layer 120, the spacer layer 120 may be etched-back to expose portions of the fin elements 112 adjacent to and not covered by the gate stack 118 (e.g., source/drain regions), and spacers 125 remain on the opposite sidewalls of the gate stack 118. In some embodiments, the etching-back process of the spacer layer 120 may include a wet etch process, a dry etch process, a multiple-step etch process, and/or a combination thereof. The spacer layer 120 may be removed from the top surface of the exposed epitaxial stack 104 and lateral surfaces of the exposed epitaxial stack 104, and the spacer layer 120 may be removed from the top surface of the gate stack 118. In some embodiments, the first epitaxial layers 106 and the second epitaxial layers 108 abut the sidewalls of the gate stack 118.

Figure 7A:
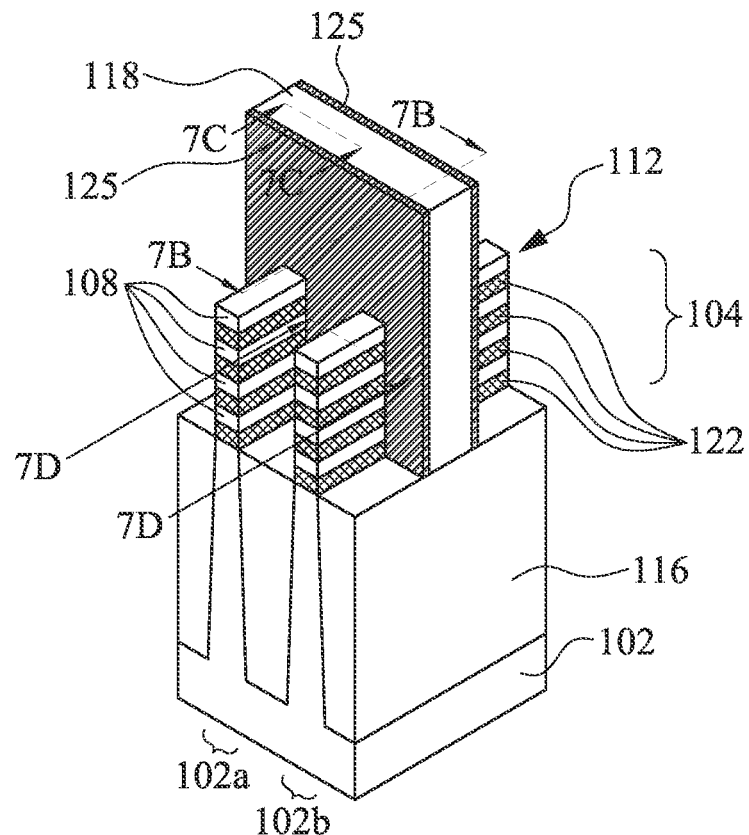
Figure 7B:
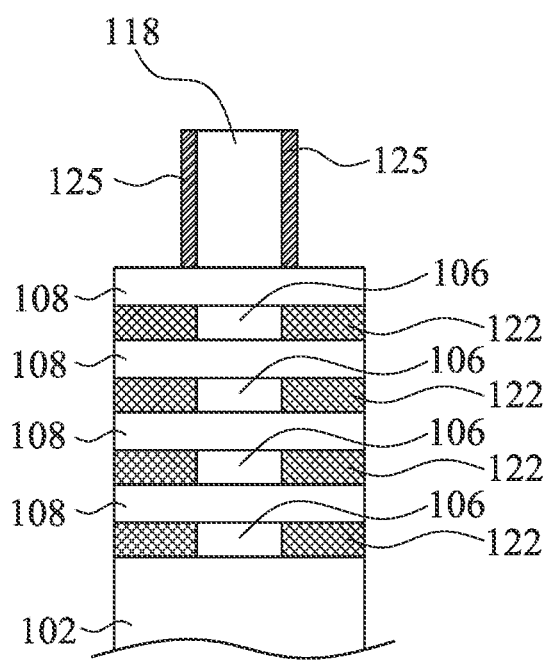
Figure 7C:
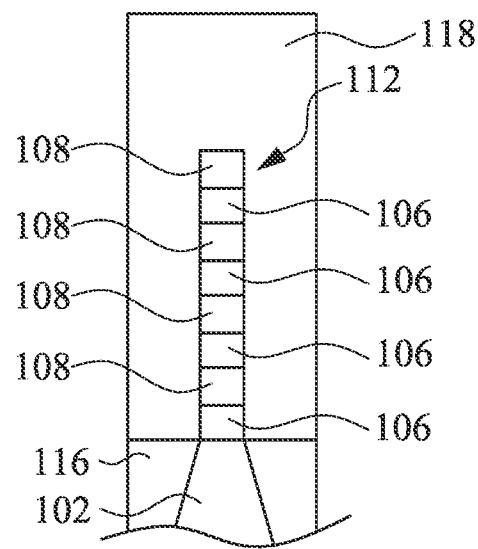
Figure 7D:
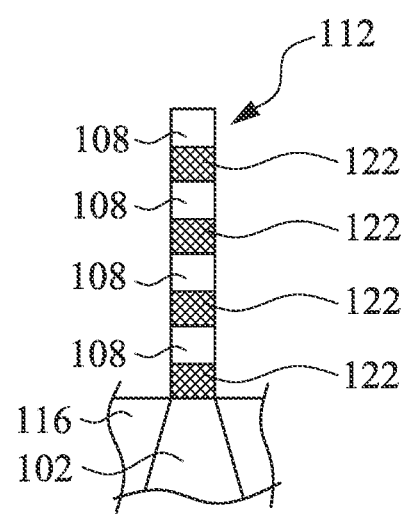

Reference is made to FIGS. 7A, 7B, 7C, and 7D, wherein FIGS. 7B, 7C, and 7D are cross-sectional views taken along lines 7B, 7C, and 7D in FIG. 7A. An oxidation process is performed. The oxidation process may be referred to as a selective oxidation as due to the varying oxidation rates of the layers of the epitaxial stack 104, and thus certain layers are oxidized. In some embodiments, the oxidation process may be performed by exposing the semiconductor device to a wet oxidation process, a dry oxidation process, or a combination thereof. In some embodiments, the epitaxial stack 104 exposed to a wet oxidation process using water vapor or steam as the oxidant, at a pressure of about 1 ATM, within a temperature range of about 400-600° C., and for a time from about 0.5-2 hours. It should be noted that the oxidation process conditions provided herein are merely exemplary, and are not meant to be limiting. In some embodiments, this oxidation process may extend such that the oxidized portion of the epitaxial layer(s) of the epitaxial stack 104 abuts the sidewall of the gate stack 118.

During the oxidation process, the first epitaxial layers 106 of the fin elements 112 are fully oxidized, and thus the first epitaxial layers 106 transform into an oxidized layers 122. The oxidized layers 122 extend to the gate stack 118, including, under the spacers 125. In some embodiments, the oxidized layers 122 extend to abut the sidewalls of the gate stack 118. In some embodiments, the oxidized layers 122 may include an oxide of silicon germanium ($SiGeO_x$).

By way of example, in some embodiments where the first epitaxial layers 106 include SiGe, and where the second epitaxial layers 108 includes Si, the faster SiGe oxidation rate (i.e., as compared to Si) ensures that the SiGe of the first epitaxial layers 106 become fully oxidized while minimizing or eliminating the oxidization of the second epitaxial layers 108. It will be understood that any of the plurality of materials discussed above may be selected for each of the epitaxial layers that provide different suitable oxidation rates.

Figure 8A:
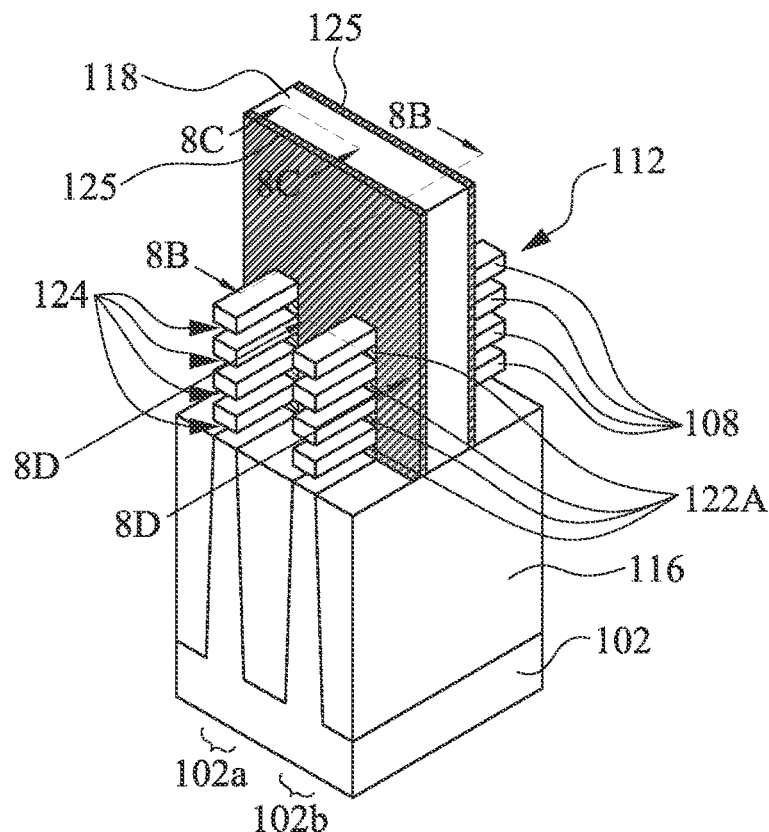
Figure 8B:
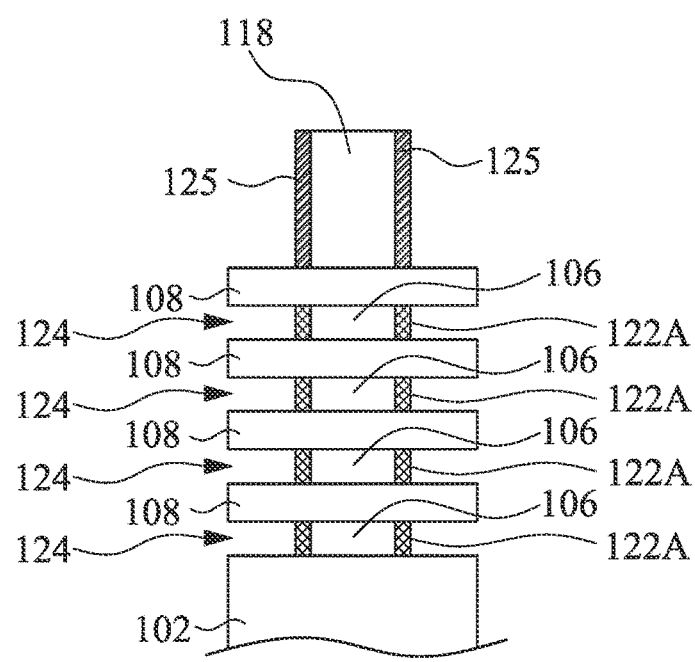
Figure 8C:
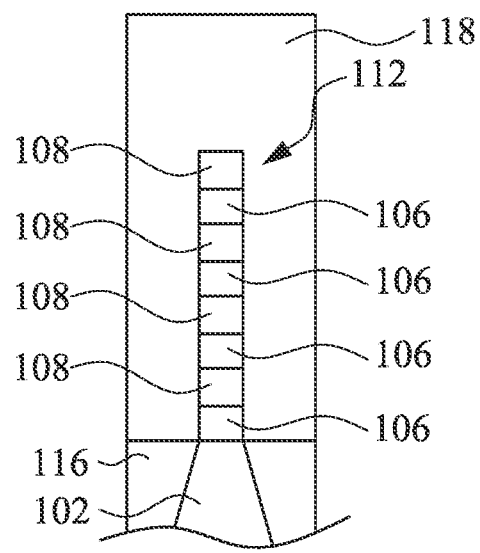
Figure 8D:
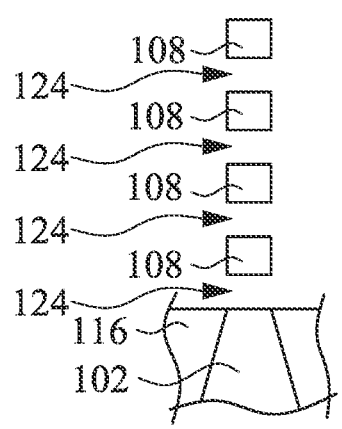

Reference is made to FIGS. 8A, 8B, 8C, and 8D, wherein FIGS. 8B, 8C, and 8D are cross-sectional views taken along lines 8B, 8C, and 8D in FIG. 8A. A selective etching process is performed. In some embodiments, the selective etching may etch the oxidized layers 122 (see FIG. 7A). In some embodiments, the oxidized layers 122 are removed from the source/drain regions (e.g., the regions of the fin elements 112 adjacent the channel regions underlying the gate stack 118). Portions of the oxidized layer 122 directly underlying the spacers 125 adjacent the gate stack 118 remain on the substrate 102 (e.g., during the etching process the spacers 125 act as masking elements). Removal of the oxidized layers 122 create gaps 124 in the places of removed portions of the oxidized layers 122, while portions 122A of the oxidized layer 122 (e.g., SiGeO) remain on the substrate 102. The gaps 124 may be filled with the ambient environment (e.g., air, $N_2$). In some embodiments, portions of the oxidized layers 122 are removed by a selective wet etching process.

Figure 9A:
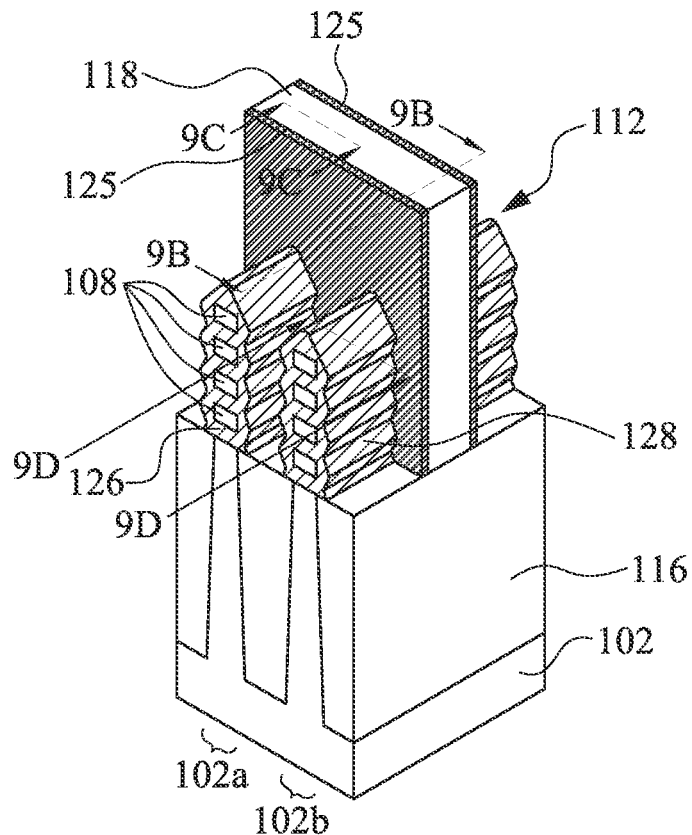
Figure 9B:
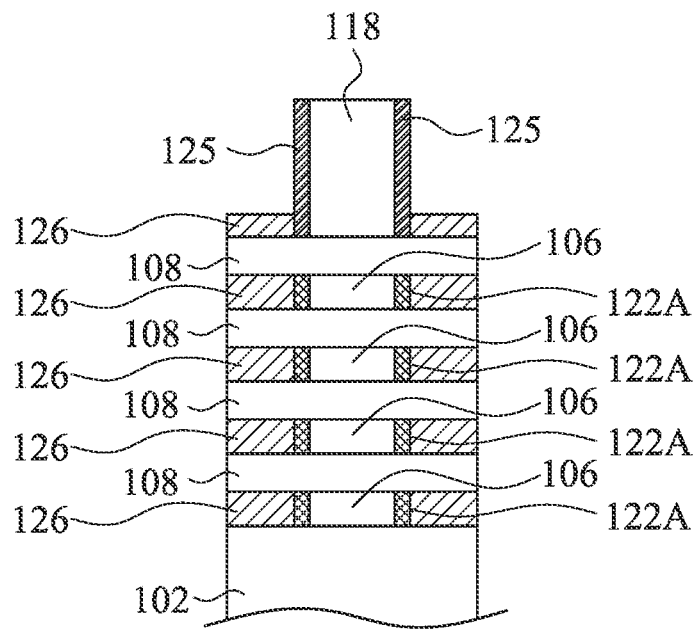
Figure 9C:
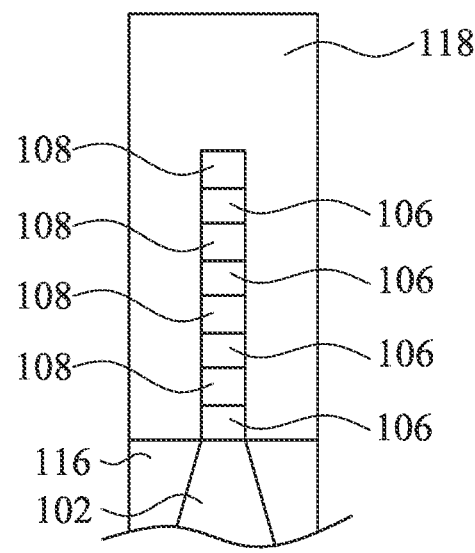
Figure 9D:
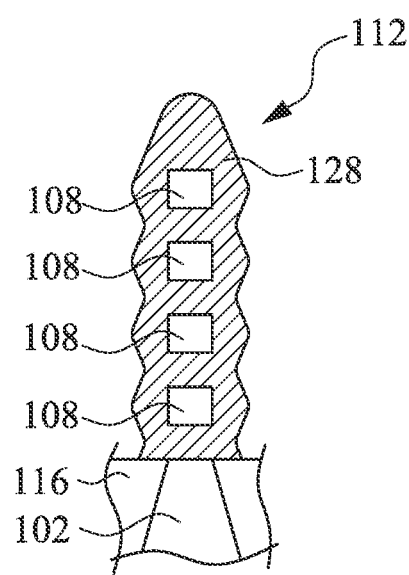

Reference is made to FIGS. 9A, 9B, 9C, and 9D, wherein FIGS. 9B, 9C, and 9D are cross-sectional views taken along lines 9B, 9C, and 9D in FIG. 9A. First epitaxial source/drain features 126 and second epitaxial source/drain features 128 are grown from the source/drain regions which are adjacent to the channel regions and on opposite sides of the channel regions. In some embodiments, growths of the first epitaxial source/drain features 126 and the second epitaxial source/drain features 128 includes growing one or more epitaxial materials. That is, the epitaxial material of the first epitaxial source/drain features 126 is grown on the second epitaxial layers 108 over the region 102a, and the epitaxial material is also grown within the gaps 124 over the 102a. Similarly, the epitaxial material of the second epitaxial source/drain features 128 is grown on the second epitaxial layers 108 over the region 102b, and the epitaxial material is also grown within the gaps 124 over the region 102b. The first epitaxial source/drain features 126 and the second epitaxial source/drain features 128 abut the oxidize portions 122A and/or the spacers 125. Thus, the oxidized portions 122A are interposed between the first epitaxial source/drain features 126 (or the second epitaxial source/drain features 128) and the gate stack 118.

In some embodiments, the growth of the first epitaxial source/drain features 126 and the growth of the second epitaxial source/drain features 128 are performed in different steps. For example, the first epitaxial source/drain features 126 can be grown prior to the growth of the second epitaxial source/drain features 128, and during the growth of the first epitaxial source/drain features 126, the epitaxy layers 108 over the region 102b can be protected using a suitable mask (not shown). The first and second epitaxial source/drain features 126 and 128 may be in-situ doped. The doping species include P-type dopants, such as boron or $BF_2$; N-type dopants, such as phosphorus or arsenic; and/or other suitable dopants including combinations thereof. If the epitaxial source/drain features are not in-situ doped, a second implantation process (i.e., a junction implant process) is performed to dope the epitaxial source/drain features. One or more annealing processes may be performed to activate the epitaxial source/drain features. The annealing processes include rapid thermal annealing (RTA) and/or laser annealing processes.

In some embodiments, the first epitaxial source/drain features 126 include a first semiconductor material, and the second epitaxial source/drain features 128 include a second semiconductor different than the first semiconductor material. If an n-type GAA transistor is to be formed on the region 102a, the first epitaxial source/drain features 126 may be formed using one or more epitaxy processes, such that Si features, silicon phosphate (SiP) features, silicon carbide (SiC) features, and/or other suitable features suitable for serving as source/drain regions of the n-type device can be formed in a crystalline state from the epitaxial layers 108 over the region 102a. In some embodiments, the lattice constants of the first epitaxial source/drain features 126 are different from the lattice constant of the fin elements 112, so that the channel regions of the fin elements 112 can be strained or stressed by the first epitaxial source/drain features 126 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the second epitaxial layers 108 over the region 102a. During this epitaxy process, a patterned mask (not shown) can be formed on the region 102b of the substrate 102 in some embodiments.

If a p-type GAA transistor is to be formed on the region 102b, the second epitaxial source/drain features 128 may be formed using one or more epitaxy processes, such that Si features, SiGe features, and/or other suitable features suitable for serving as source/drain regions of the p-type device can be formed in a crystalline state from the epitaxial layers 108 over the region 102b. In some embodiments, the lattice constants of the second epitaxial source/drain features 128 are different from the lattice constant of the fin elements 112, so that the channel regions of the fin elements 112 can be strained or stressed by the second epitaxial source/drain features 128 to improve carrier mobility of the semiconductor device and enhance the device performance. The epitaxy processes include suitable deposition techniques as stated above. The epitaxy process may use gaseous and/or liquid precursors, which interact with the composition of the second epitaxial layers 108 over the region 102b. During this epitaxy process, a patterned mask (not shown) can be formed on the region 102a of the substrate 102 in some embodiments.

Figure 10A:
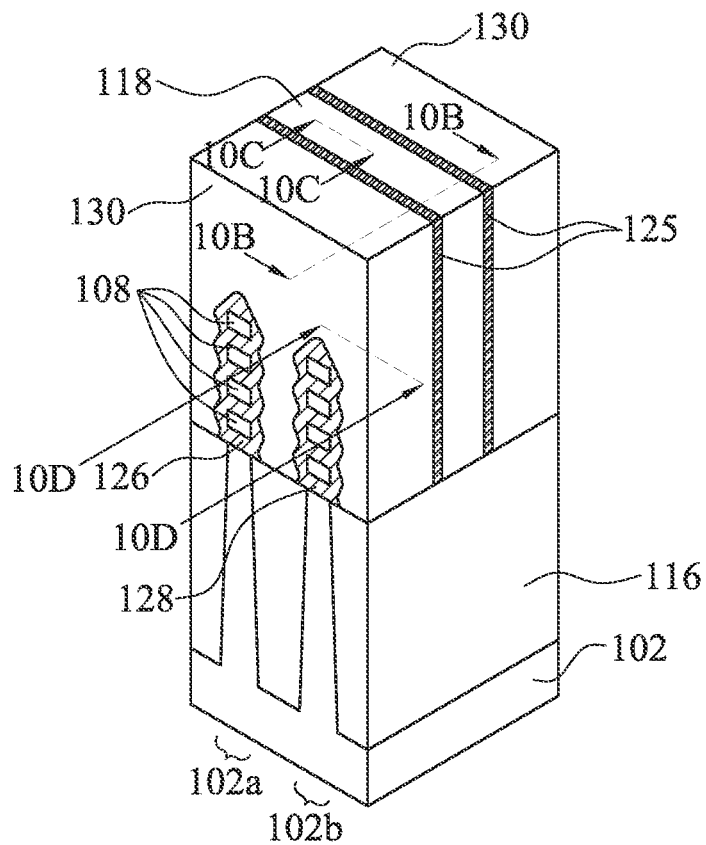
Figure 10B:
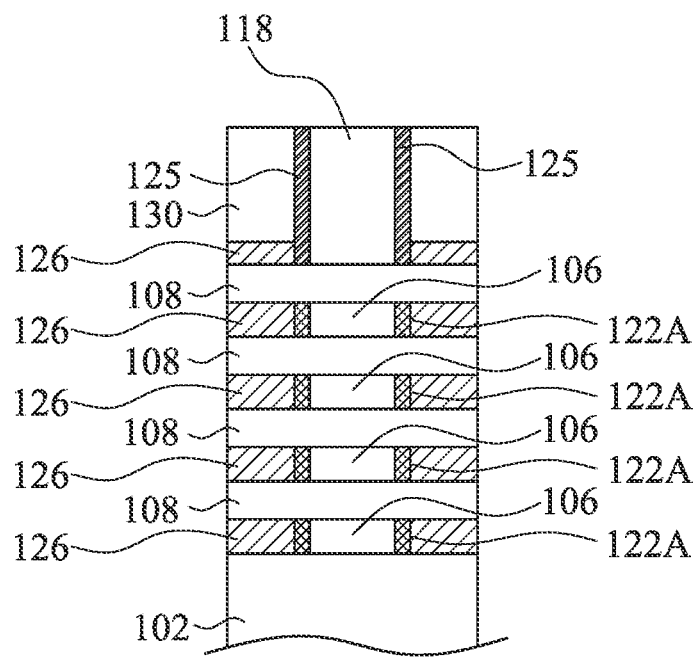
Figure 10C:
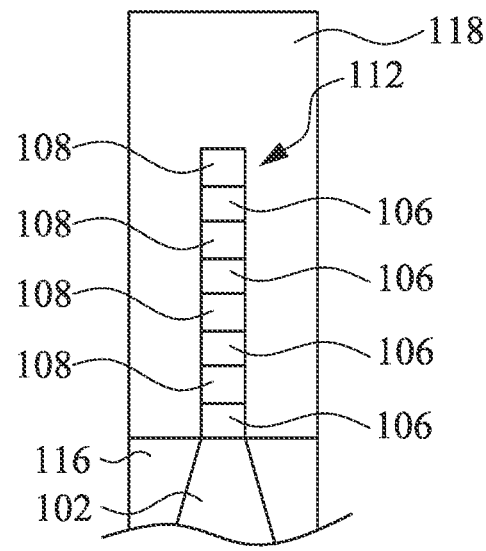
Figure 10D:
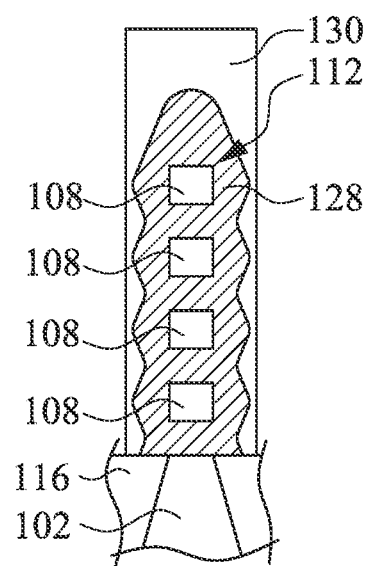

Reference is made to FIGS. 10A, 10B, 10C, and 10D, wherein FIGS. 10B, 10C, and 10D are cross-sectional views taken along lines 10B, 10C, and 10D in FIG. 10A. An inter-layer dielectric (ILD) layer 130 is formed. In some embodiments, a contact etch stop layer (CESL) is also formed over the substrate 102 prior to forming the ILD layer 130. In some embodiments, the CESL includes a silicon nitride layer, silicon oxide layer, a silicon oxynitride layer, and/or other materials. The CESL may be formed by plasma-enhanced chemical vapor deposition (PECVD) process and/or other suitable deposition or oxidation processes. In some embodiments, the ILD layer 130 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 130 may be deposited by a PECVD process or other suitable deposition technique. In some embodiments, after depositing the ILD layer 130 (and/or CESL or other dielectric layers), a planarization process may be performed to expose the top surface of the gate stack 118. For example, a planarization process includes a chemical mechanical polishing (CMP) process which removes portions of the ILD layer 130 (and CESL layer, if present) overlying the gate stack 118.

Figure 11A:
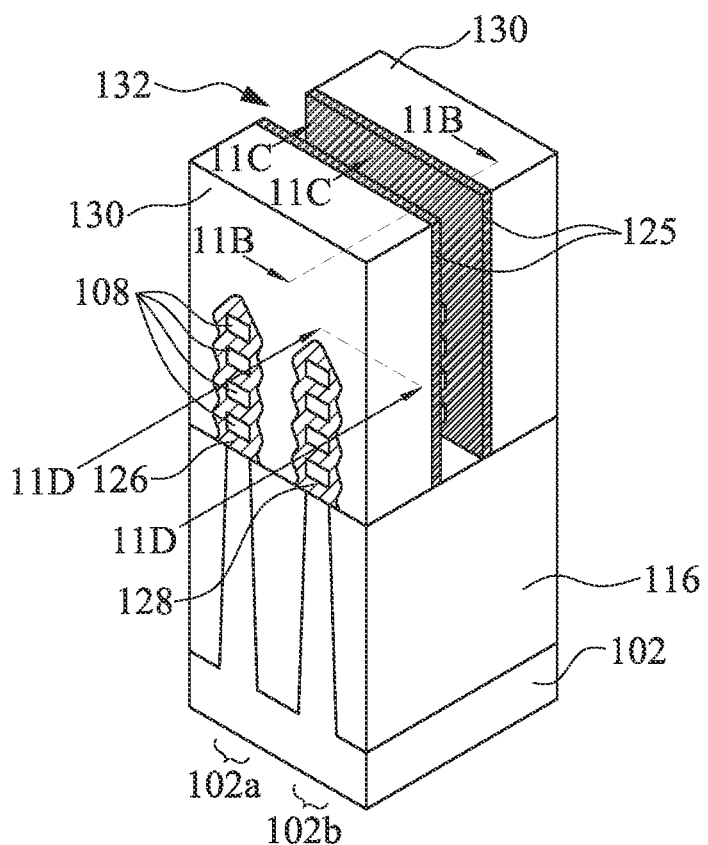
Figure 11B:
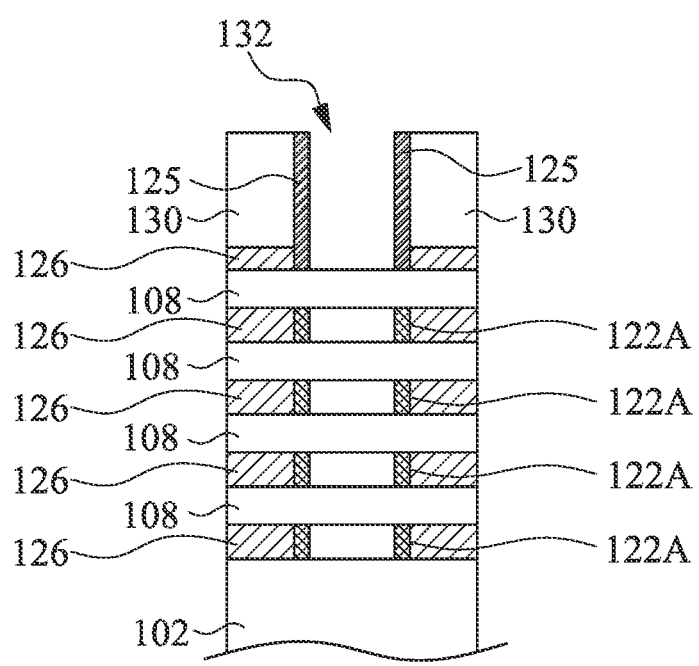
Figure 11C:
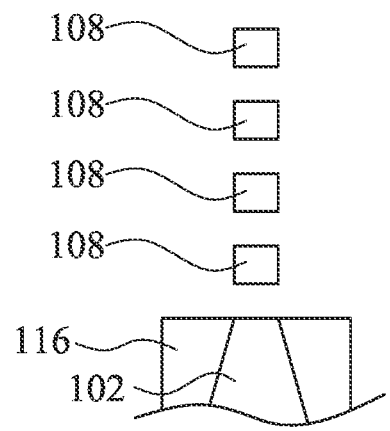
Figure 11D:
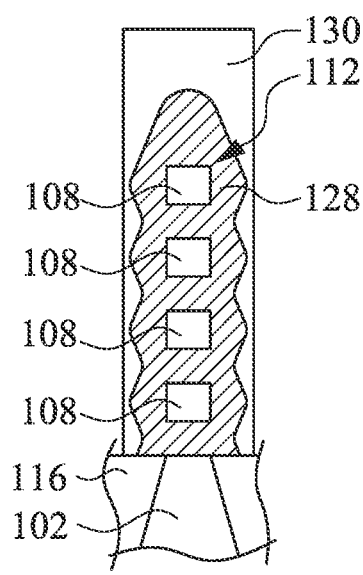

Reference is made to FIGS. 11A, 11B, 11C, and 11D, wherein FIGS. 11B, 11C, and 11D are cross-sectional views taken along lines 11B, 11C, and 11D in FIG. 11A. The gate stack 118 (see FIG. 10A) is removed by a suitable etching process to form a gate trench 132 therein. The first epitaxial layers 106 (see FIG. 10C) in the channel region of the semiconductor device are selectively removed. In some embodiments, the first epitaxial layers 106 are removed by a selective wet etching process. In some embodiments, the selective wet etching includes HF. In some embodiments, the first epitaxial layers 106 are SiGe and the second epitaxial layers 108 are silicon allowing for the selective removal of the SiGe of the first epitaxial layers 106. It should be noted that during the removal of the first epitaxial layers 106, gaps are provided between the adjacent nanowires in the channel region (e.g., gaps between second epitaxial layers 108). The gaps may be filled with the ambient environment conditions (e.g., air, nitrogen, etc).

After the removal of the first epitaxial layers 106, the second epitaxial layers 108 in the gate trench 132 are referred to as a plurality of nanowires in the channel region. In some embodiments, the second epitaxial layers 108 in the gate trench 132 and over the region 102a can be referred to as first nanowires 108A used for the n-type GAA transistor, and the second epitaxial layers 108 in the gate trench 132 and over the region 102b can be referred to as second nanowires 108B used for the p-type GAA transistor.

Figure 12:
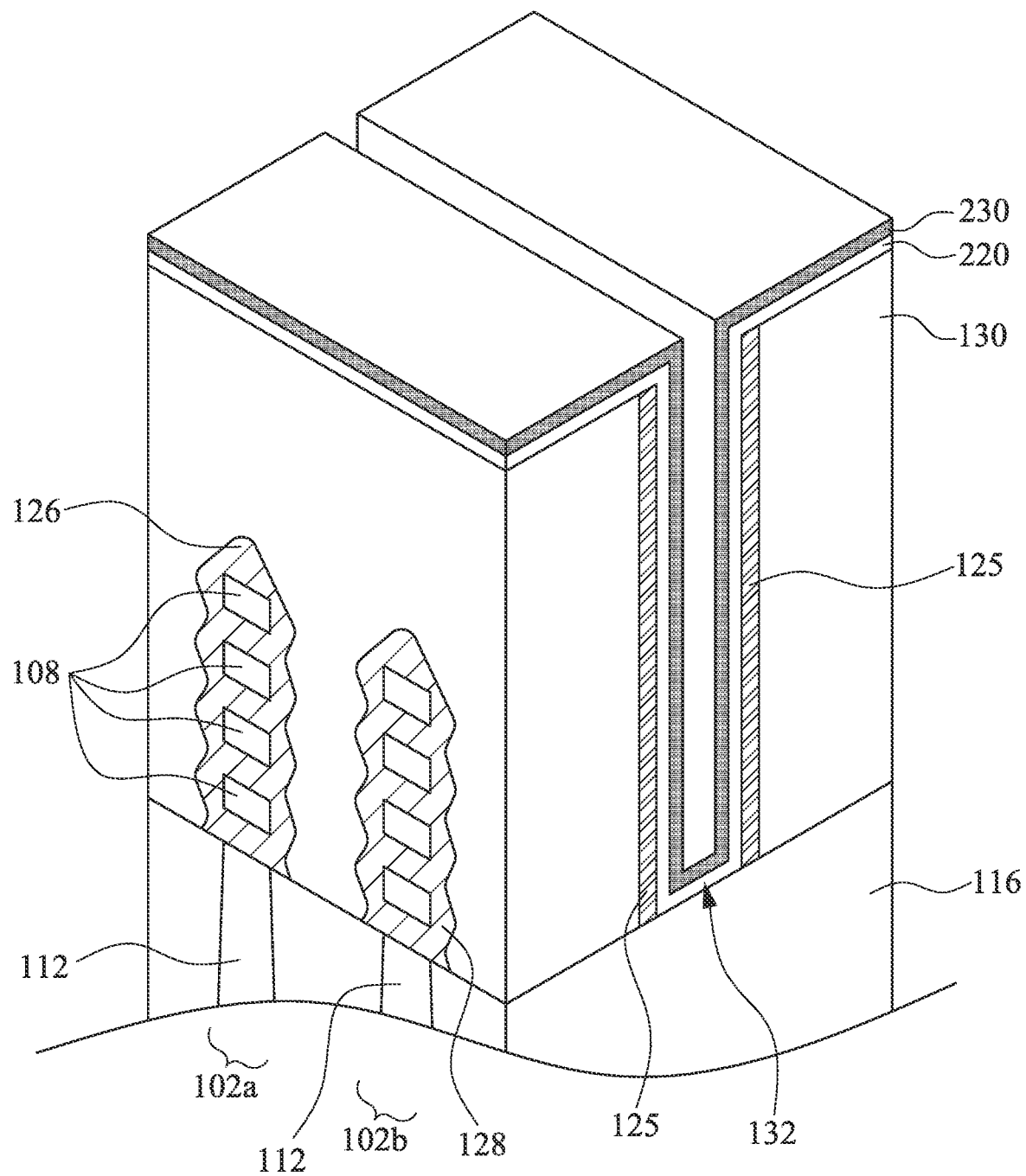
Figure 13:
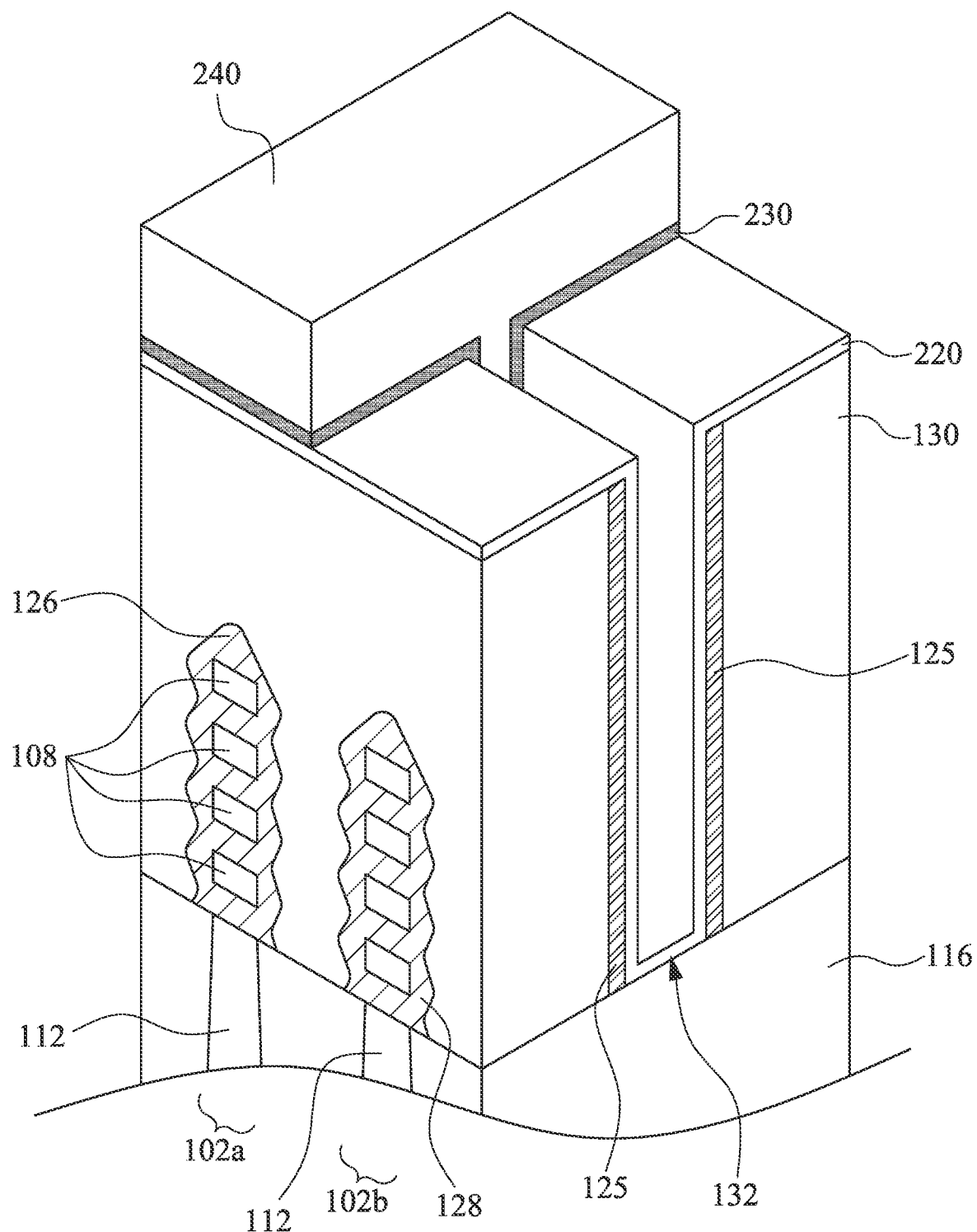
Figure 14A:
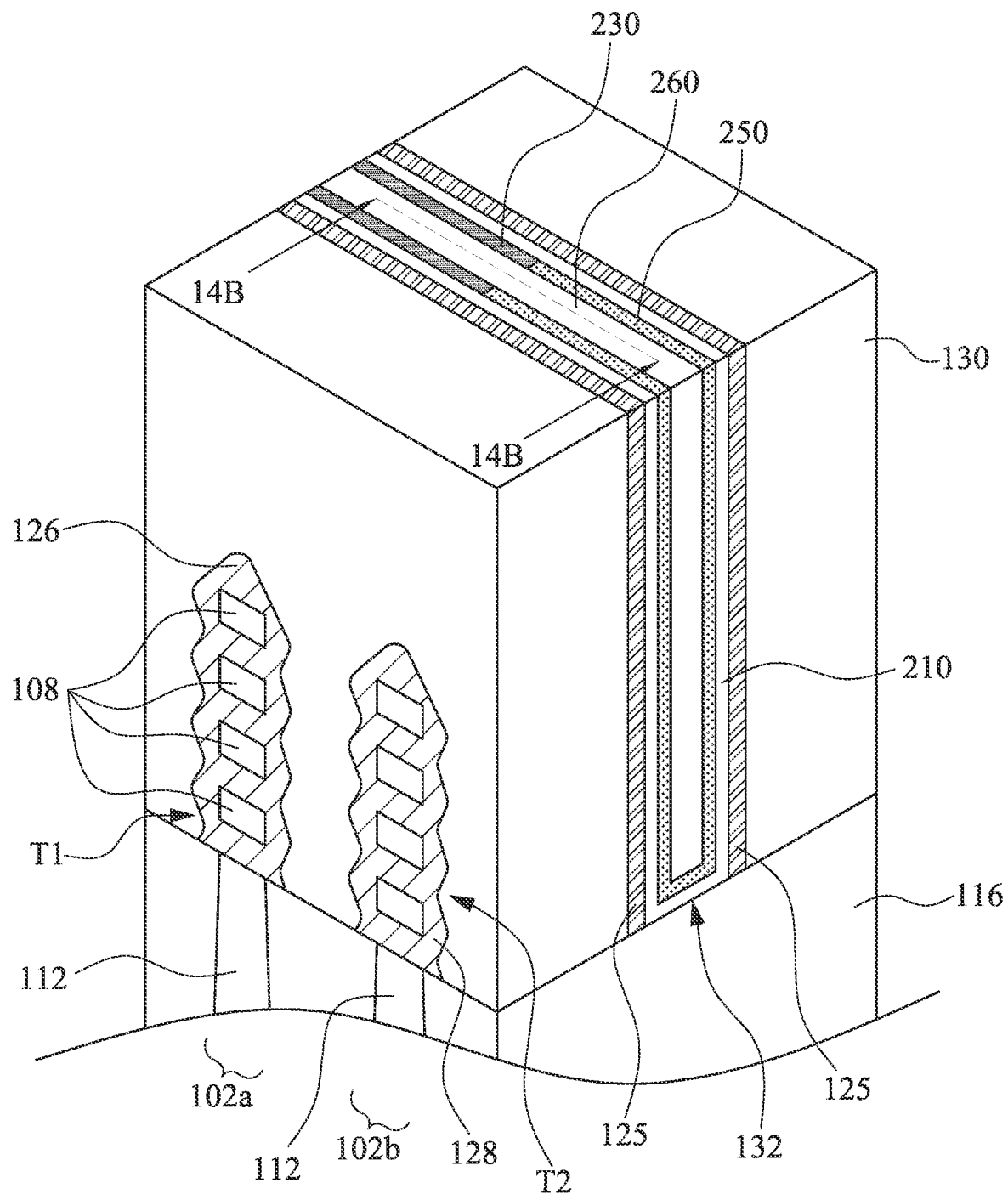

FIGS. 12-14A illustrate exemplary steps of forming a gate stack in the gate trench 132. As shown in FIG. 12, a high-k dielectric layer 220 and a first high-k dielectric sheath layer 230 are in sequence formed in the gate trench 132 using one or more deposition processes. Thereafter, a mask 240 is formed over the first high-k dielectric sheath layer 230 and patterned such that the device region 102a is masked while the device region 102b is exposed, as shown in FIG. 13. Afterwards, an exposed portion of the first high-k dielectric sheath layer 230 over the device region 102b is removed using an etching process, while a masked portion of the first high-k dielectric sheath layer 230 over the device region 102a remains. Next, a second high-k dielectric sheath layer 250 is formed over the device region 102b using a suitable deposition process, and the patterned mask 240 over the device region 102a is then removed. Thereafter, a metal layer 260 is formed using a suitable deposition process to fill the gate trench 132, and a planarization process, such as CMP, is performed to remove excess materials outside the gate trench 132, and the resulting structure is shown in FIGS. 14A and 14B, wherein FIG. 14B is a cross-sectional view taken along lines 14B in FIG. 14A.

In some embodiments, the high-k dielectric layer 220 includes $HfO_2$, $ZrO_2$, $La_2O_3$, $Al_2O_3$, $TiO_2$, $SrTiO_3$, $Y_2O_3$, the like, or a combination thereof. In some embodiments, the first high-k dielectric sheath layer 230 includes $Y_2O_3$, $Lu_2O_3$, $La_2O_3$, SrO, the like, or a combination thereof. In some embodiments, the second high-k dielectric sheath layer 250 includes $Al_2O_3$, $TiO_2$, $ZrO_2$, MgO, the like, or a combination thereof. The formation methods of these dielectric layers may include, for example, molecular beam deposition (MBD), ALD, PECVD, and the like.

In some embodiments, the metal layer 260 includes tungsten (W), cobalt (Co), ruthenium (Ru), aluminum (Al), the like, or a combination thereof. Formation of the metal layer 260 may include, for example, MBD, ALD, PECVD, and the like. In some embodiments, first interfacial layers 210a may respectively be formed around the first nanowires 108A before formation of the high-k dielectric layer 220, and second interfacial layers 210b may respectively be formed around the second nanowires 108B before formation of the high-k dielectric layer 220. The first and second interfacial layers 210a and 210b may include $SiO_2$, SiON, Y-doped $SiO_2$, $Si_xGe_yO_z$, $GeO_2$, SiHfO, SiHfON, the like, or a combination thereof. Additional layers, such as, an additional interfacial dielectric cap layer, may also be deposited (e.g., between the interfacial layer 210a (or 210b) and the high-k dielectric layer 220).

Figure 14B:
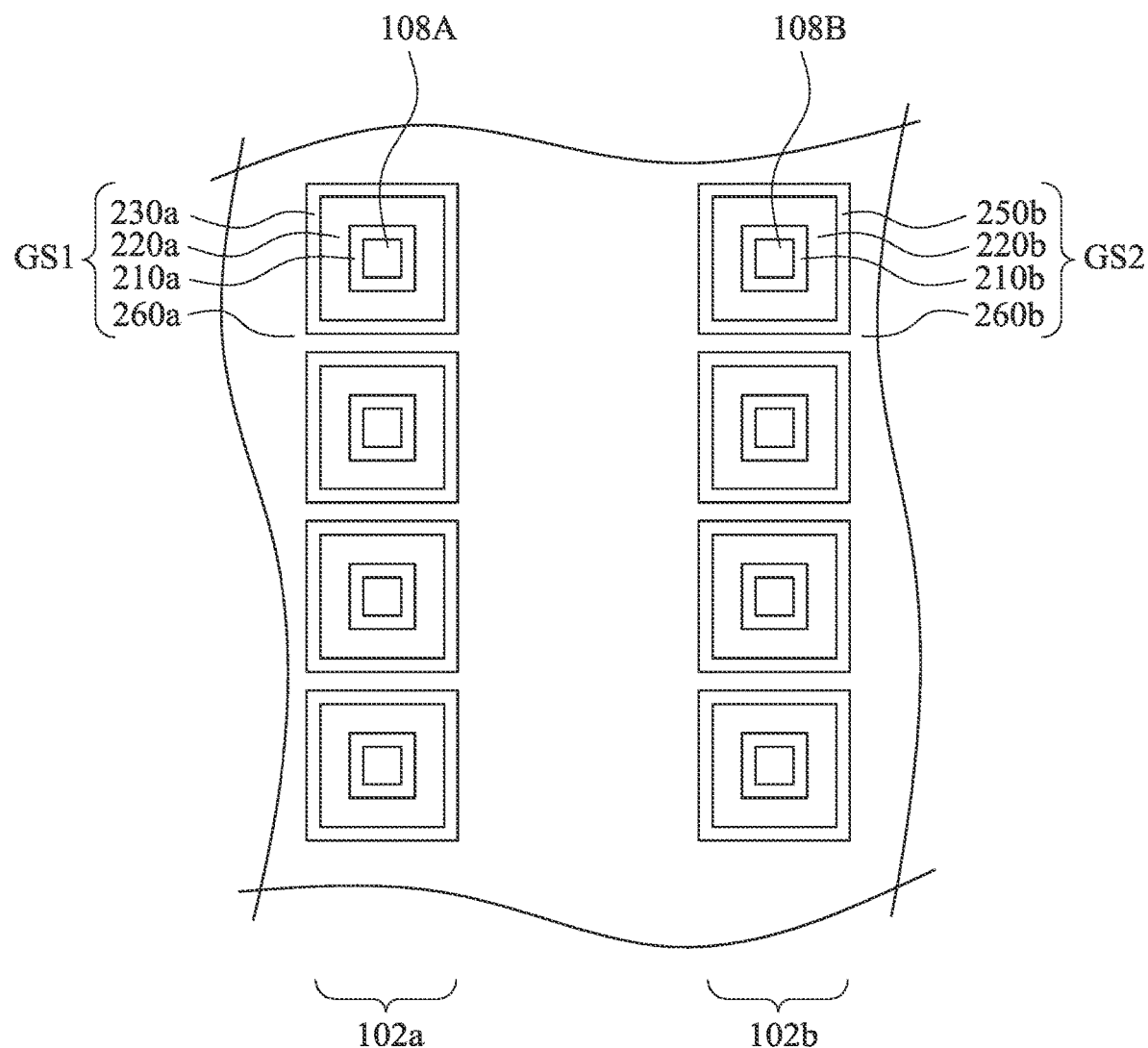

As illustrated in FIGS. 14A and 14B, portions of the high-k dielectric layer 220 respectively surround the first interfacial layers 210a and can be referred to as first high-k dielectric linings 220a, and other portions of the high-k dielectric layer 220 respectively surround the second interfacial layers 210b and can be referred to as second high-k dielectric linings 220b. Portions of the first high-k dielectric sheath layers 230 respectively surround the first high-k dielectric linings 220a and can be referred to as first high-k dielectric sheaths 230a, and portions of the second high-k dielectric sheath layers 250 respectively surround the second high-k dielectric linings 220b and can be referred to as second high-k dielectric sheaths 250b. A portion of the metal layer 260 surrounds the first high-k dielectric sheaths 230a and can be referred to as a first metal gate electrode 260a, and a portion of the metal layer 260 surrounds the second high-k dielectric sheaths 250b and can be referred to as a second metal gate electrode 260b.

The first interfacial layers 210a, first high-k dielectric linings 220a, first high-k dielectric sheaths 230a, and first metal gate electrode 260a can be in combination serve as a first gate stack GS1 for the first nanowires 108A. The second interfacial layers 210b, second high-k dielectric linings 220b, second high-k dielectric sheaths 250b, and second metal gate electrode 260b can be in combination serve as a second gate stack GS2 for the second nanowires 108B.

In some embodiments, the first and second high-k dielectric sheaths 230a and 250b include different materials used to adjust the work function of first and second gate stacks GS1 and GS2 to a desired value based on device design. For example, if the first gate stack GS1, the first epitaxial source/drain features 126 and the first nanowires 108A form an n-type GAA transistor T1, the first high-k dielectric sheaths 230a can include a material used to adjust the work function of the first gate stack GS1 suitable for the n-type device. The material of the first high-k dielectric sheaths 230a suitable for the n-type device may be, for example, $Y_2O_3$, $Lu_2O_3$, $La_2O_3$, SrO, Er, Sc, or a combination thereof. On the contrary, if the second gate stack GS2, the second epitaxial source/drain features 128 and the second nanowires 108B form a p-type GAA transistor T2, the second high-k dielectric sheaths 250b can include a material used to adjust the work function of the second gate stack GS2 suitable for the p-type device. The material of the second high-k dielectric sheaths 250b suitable for the p-type device may be, for example, $Al_2O_3$, $TiO_2$, $ZrO_2$, MgO, or a combination thereof. In some embodiments, the first high-k dielectric sheaths 230a are made of $La_2O_3$, and the second high-k dielectric sheaths 250b is made of $Al_2O_3$.

Because different work functions of the n-type and p-type GAA transistors T1 and T2 can be achieved by different materials of the first and second high-k dielectric sheaths 230a and 250b, the first and second metal gate electrodes 260a and 260b can be made of the same material in some embodiments. For example, the metal layer 260 may be a single metal layer having a single metal material, and the first and second metal gate electrodes 260a and 260b are made of the single metal material. In other words, a space between the first and second high-k dielectric sheaths 230a and 250b are filled with a single metal, such as tungsten (W), cobalt (Co), ruthenium (Ru), aluminum (Al) or the like. As a result, the metal layer 260 is a single-layered structure rather than a multi-layered structure, and hence deposition of the metal layer 260 can be eased.

Figure 14C:
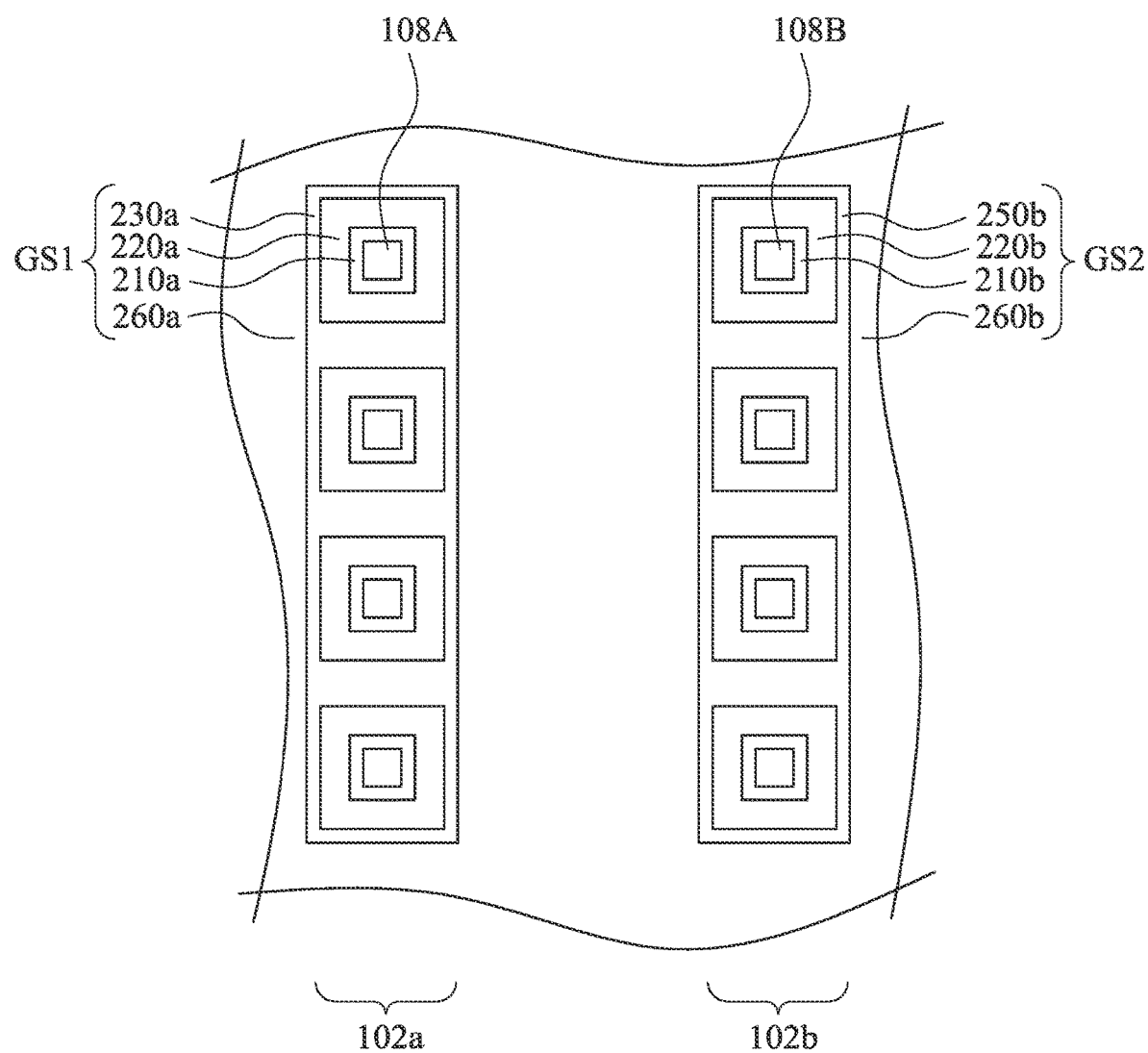

In some embodiments, outer surfaces of the first and second high-k dielectric sheaths 230a and 250b are respectively in contact with the first and second metal gate electrodes 260a and 260b, the first and second high-k dielectric linings 220a and 220b are in contact with inner surfaces of corresponding first and second high-k dielectric sheaths 230a and 250b. In some embodiments, the first high-k dielectric sheaths 230a surrounding different nanowires 108A are merged, and the second high-k dielectric sheaths 250b are merged, as illustrated in FIG. 14C. The merged first high-k dielectric sheaths 230a and the merged second high-k dielectric sheaths 250b can prevent metal from interposing neighboring nanowires, and parasitic capacitance can thus be reduced.

In some embodiments, the first and second interfacial layers 210a and 210b are made of the same material if they are formed in the same processing step. For example, the first and second interfacial layers 210a and 210b may be made of $SiO_2$, SiON, Y-doped $SiO_2$, $Si_xGe_yO_z$, $GeO_2$, SiHfO, SiHfON, the like, or a combination thereof. In some other embodiments, the first and second interfacial layers 210a and 210b are made of different materials. For example, the first interfacial layer 210a may initially be formed, and a portion of the first interfacial layer 210a over the device region 102b is then removed using a suitable patterning process (e.g., a combination of photolithography and etching), and the second interfacial layer 210b made of a different material than the first interfacial layer 210a is then formed over the device region 102b.

In some embodiments, the first and second high-k dielectric linings 220a and 220b are made of the same material because they are formed from the same high-k dielectric layer 220. For example, the first and second high-k dielectric linings 220a and 220b include $HfO_2$, $ZrO_2$, $La_2O_3$, $Al_2O_3$, $TiO_2$, SrTiO3, $Y_2O_3$, the like, or a combination thereof. In some other embodiments, the first and second high-k dielectric linings 220a and 220b are made of different materials. The first and second high-k dielectric linings 220a and 220b having different materials can be formed using any suitable deposition and patterning process, as discussed above.

In some embodiments, after formation of the first and second high-k dielectric sheath layers 230 and 250 and before formation of the metal layer 260, a thermal treatment, such as annealing, can be performed to the first and second high-k dielectric sheath layers 230 and 250. The thermal treatment can drive materials of the first and second high-k dielectric sheath layers 230 and 250 to diffuse into corresponding portions of the high-k dielectric layer 220, and hence the first and second high-k dielectric sheath layers 230 and 250 can then be removed to enlarge the process window for depositing the metal layer 260.

Figure 15:
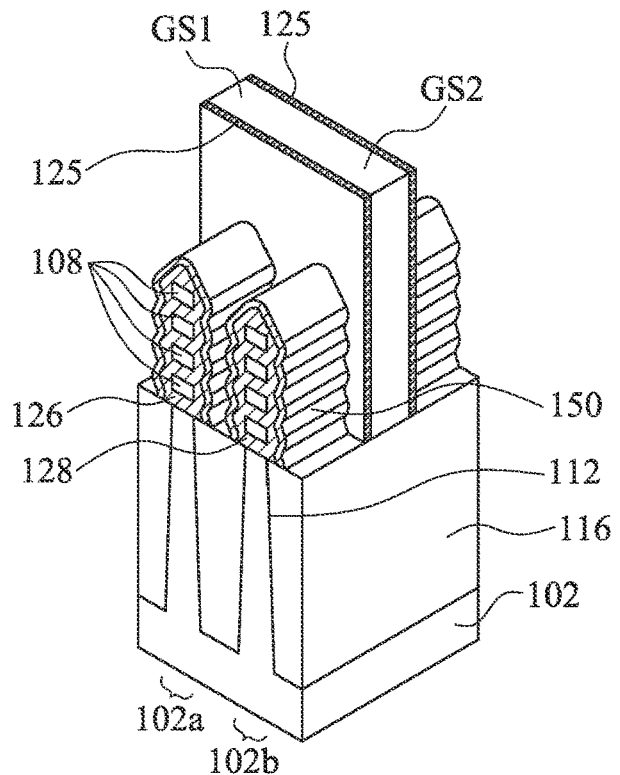

Reference is made to FIG. 15. The ILD layer 130 (see FIG. 14A) is removed and silicide features 150 are formed. In some embodiments, the ILD layer 130 is removed by using an etching process, such as a wet etching process, a dry etching process, or a combination thereof. After the removal of the ILD layer 130, the first epitaxial source/drain features 126 and the second epitaxial source/drain features 128 are exposed, and the silicide features 150 are formed from the exposed first epitaxial source/drain features 126 and the exposed second epitaxial source/drain features 128. In some embodiments, formation of the silicide features 150 includes using a metal to form self-aligned silicide materials to the exposed first epitaxial source/drain features 126 and the exposed second epitaxial source/drain features 128. The metal includes Ti, Co, Ta, Nb, or a combination thereof. In some embodiments, the formation of the silicide features 150 involves using an anneal to form the silicide features 150 and then removing the unreacted metal.

Figure 16:
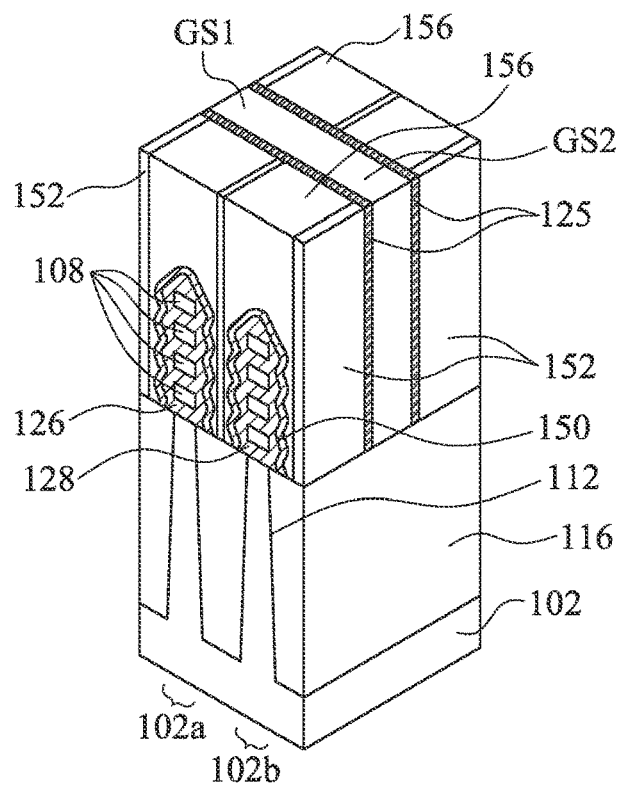

Thereafter, another ILD layer 152 is formed over the substrate 102, contact holes are formed in the ILD layer 152 to expose the silicide features 150, and source/drain contacts 156 are formed in the contact holes to contact with the silicide features 150. The resulting structure is shown in FIG. 16. In some embodiments, the ILD layer 152 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 152 may be deposited by a PECVD process or other suitable deposition technique. In some embodiments, a contact etch stop layer (CESL) is also formed over the substrate 102 prior to forming the ILD layer 152. In some embodiments, the CESL includes a silicon nitride layer, silicon oxide layer, a silicon oxynitride layer, and/or other materials. The CESL may be formed by plasma-enhanced chemical vapor deposition (PECVD) process and/or other suitable deposition or oxidation processes. In some embodiments, after depositing the ILD layer 152 (and/or CESL or other dielectric layers), a planarization process may be performed to expose the top surface of the first and second gate stacks GS1 and GS2. For example, a planarization process (e.g. CMP) can be performed to remove portions of the ILD layer 152 (and CESL layer, if present) overlying the gate stacks GS1 and GS2.

Figure 17:
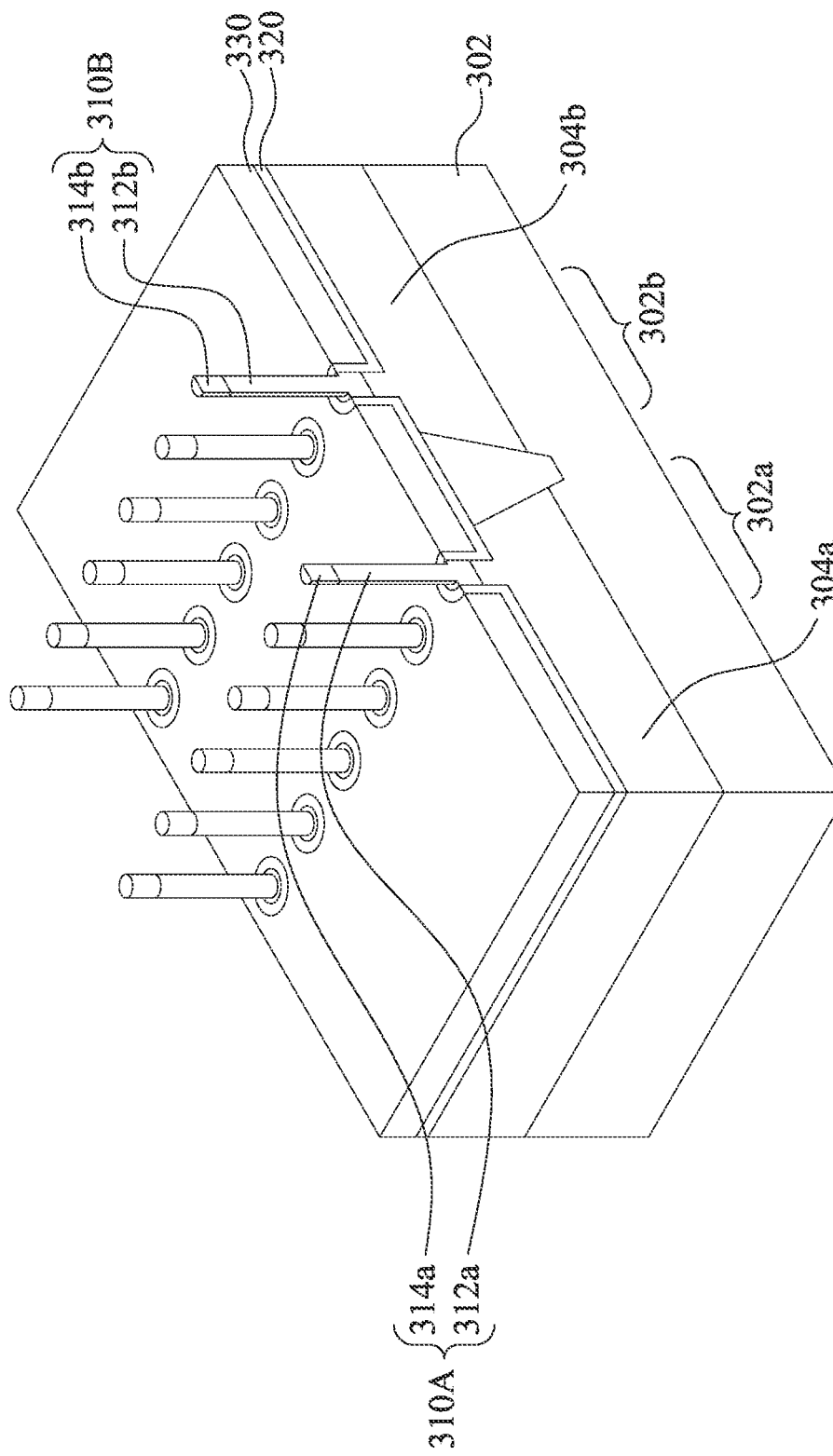
FIGS. 17-22 illustrate a method of forming a semiconductor device in accordance with some embodiments of the present disclosure.

FIGS. 17-22 illustrate a method of forming a semiconductor device in accordance with some embodiments of the present disclosure. As shown in FIG. 17, first and second bottom source/drain regions 304a and 304b are formed over a substrate 302 with an isolation feature 308 (e.g. STI feature) separating the first and second bottom source/drain regions 304a and 304b. In some embodiments, the substrate 302 is a bulk silicon substrate, such as a silicon wafer. In some embodiments, the substrate 302 includes an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or a combination thereof. In some embodiments, the substrate 302 includes a silicon-on-insulator (SOI) substrate. The SOI substrate is fabricated using separation by implantation of oxygen (SIMOX), wafer bonding, and/or other suitable methods.

First nanowires 310A are formed over the first bottom source/drain region 304a, and the second nanowires 310B are formed over the second bottom source/drain region 306b. Exemplary formation of the first and second nanowires 310A and 310B and the first and second bottom source/drain regions 304a and 304b includes forming a bottom semiconductor layer having the first and second bottom source/drain regions 304a and 304b disposed over device regions 302a and 302b, forming a middle semiconductor layer having channel regions 312b and 312b disposed over first and second bottom source/drain regions 304a and 304b, forming a top semiconductor layer having first and second top source/drain regions 314a and 314b disposed over channel regions 312b and 312b, and patterning the stack of bottom, middle and top semiconductor layers to form the first and second nanowires 310A and 320B.

In some embodiments, the patterning of stack of bottom, middle and top semiconductor layers may be done using a combination of photolithography and etching. For example, a hard mask and/or photoresist (not illustrated) may be disposed over the stack. The hard mask may comprise one or more oxide (e.g., silicon oxide) and/or nitride (e.g., silicon nitride) layers to prevent damage to the underlying semiconductor layers during patterning, and the hard mask may be formed using any suitable deposition process, such as, atomic layer deposition (ALD), CVD, high density plasma CVD (HDP-CVD), physical vapor deposition (PVD), and the like. The photoresist may comprise any suitable photosensitive material blanket deposited using a suitable process, such as, spin on coating, and the like. In some embodiments, the bottom, middle and top semiconductor layers may be formed using metal-organic (MO) chemical vapor deposition (CVD), molecular beam epitaxy (MBE), liquid phase epitaxy (LPE), vapor phase epitaxy (VPE), selective epitaxial growth (SEG), combinations thereof, and the like.

The first bottom and top source/drain regions 304a and 314a in the device region 302a may be doped with a n-type dopant (e.g., P, As, Si, Ge, C, O, S, Se, Te, Sb, combinations thereof, and the like) at a suitable concentration (e.g., about $1\times10^{18}$ atoms $cm^{-3}$ to about $1\times10^{22}$ atoms $cm^{-3}$). Suitable materials for the first bottom and top source/drain regions 304a and 314a (e.g., n-type epitaxy materials) may include Si, SiP, SiPC, Ge, GeP, a III-V material (e.g., InP, GaAs, AlAs, InAs, InAlAs, InGaAs, and the like), combinations thereof, and the like. In other embodiments, the first bottom and top source/drain regions 304a and 314a may comprise a different material, different dopants, and/or a different doping concentration depending on device design.

The second bottom and top channel regions 304b and 314b in the device region 302b may be doped with a p-type dopant (e.g., B, $BF_2$, Si, Ge, C, Zn, Cd, Be, Mg, In, combinations thereof, and the like) at a suitable concentration (e.g., about $1\times10^{18}$ atoms/$cm^2$ to about $1\times10^{22}$ atoms/$cm^2$). Suitable epitaxy materials for the second bottom and top channel regions 304b and 314b (e.g., p-type epitaxy materials) may include Si, SiGe, SiGeB, Ge, GeB, a III-V material (e.g., InSb, GaSb, InGaSb, and the like), combinations thereof, and the like. In other embodiments, the second bottom and top channel regions 304b and 314b may comprise a different material, different dopants, and/or a different doping concentration depending on device design.

The channel region 312a in device region 302a and the channel region 312b in device region 302b may be doped with either n-type or p-type dopants depending on device design. For example, for accumulation mode devices, the channel region 312a may be doped with n-type dopants (e.g., P, As, Si, Ge, C, 0, S, Se, Te, Sb, combinations thereof, and the like) while the channel region 312b may be doped with p-type dopants (e.g., B, $BF_2$, Si, Ge, C, Zn, Cd, Be, Mg, In, combinations thereof, and the like). As another example, for inversion mode devices, the channel region 312a may be doped with p-type dopants (e.g., B, $BF_2$, Si, Ge, C, Zn, Cd, Be, Mg, In, combinations thereof, and the like) while the channel region 312b may be doped with n-type dopants (e.g., P, As, Si, Ge, C, O, S, Se, Te, Sb, combinations thereof, and the like). In some embodiments, a dopant concentration of channel regions 312a and 312b may be about $1\times10^{12}$ atoms $cm^{-3}$ to about $1\times10^{18}$ atoms $cm^{-3}$, for example. Suitable materials for channel regions 312a and 312b may include Si, SiP, SiPC, SiGe, SiGeB, Ge, GeB, GeP, a III-V material (e.g., InP, GaAs, AlAs, InAs, InAlAs, InGaAs, InSb, GaSb, InGaSb, and the like), combinations thereof, and the like. The material of channel region 312a and/or the channel region 312b may depend on the desired type of the respective region. In other embodiments, channel regions 312a and 312b may comprise a different material, different dopants, and/or a different doping concentration depending on device design.

After formation the nanowires, a contact etch stop layer (CESL) 320 is blanket formed over the substrate 302. Next, a dielectric layer 330 is formed over the CESL 320. Thereafter, upper portions of the CESL 320, and upper portions of the dielectric layer 330 are removed using wet and/or dry etching processes to expose sidewalls of the first and second channel regions 312a and 314a.

In some embodiments, the CESL 320 comprises a material that can be selectively etched from a material of the dielectric layer 330. For example, in some embodiments where the dielectric layer 330 comprises an oxide, the CESL 320 may comprise SiN, SiC, SiCN, or the like. The CESL 320 may be deposited using a conformal process, such as CVD, plasma enhanced CVD, PECVD, PVD, or the like.

The dielectric layer 330 may comprise a low-k dielectric having a k-value less than about 3.9, such as about 2.8 or even less. In some embodiments, the dielectric layer 330 comprises a flowable oxide formed using, for example, flowable chemical vapor deposition (FCVD). The dielectric layer 330 may fill the space between adjacent nanowires (e.g., nanowires 310A and 310B in FIG. 17).

Figure 18:
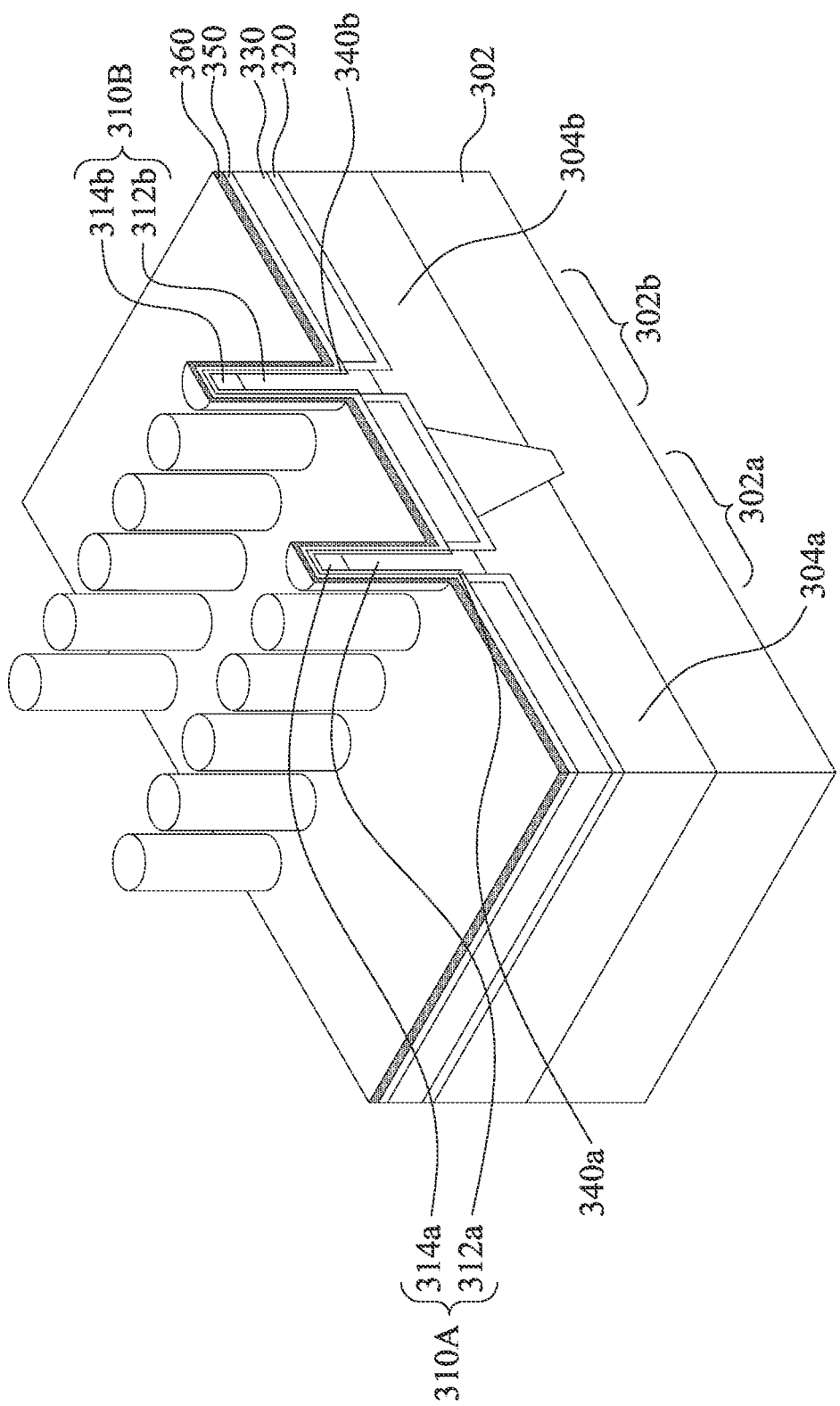

Reference is made to FIG. 18. A high-k gate dielectric layer 350 and a first-high-k dielectric sheath layer 360 are in sequence formed over the substrate 302. In some embodiments, the high-k dielectric layer 350 includes $HfO_2$, $ZrO_2$, $La_2O_3$, $Al_2O_3$, $TiO_2$, $SrTiO3$, $Y_2O_3$, the like, or a combination thereof. In some embodiments, the first high-k dielectric sheath layer 360 includes $Y_2O_3$, $Lu_2O_3$, $La_2O_3$, SrO, the like, or a combination thereof. The formation methods of high-k dielectric layer 350 and the first-high-k dielectric sheath layer 360 may include, for example, molecular beam deposition (MBD), ALD, PECVD, and the like.

In some embodiments, before formation of the high-k layers, first interfacial layers 340a are respectively formed around the first nanowires 310A using any suitable technique, such as thermal oxidation. Similarly, before formation of the high-k layers, second interfacial layers 340b are respectively formed around the second nanowires 320A using any suitable technique, such as thermal oxidation.

Figure 19:
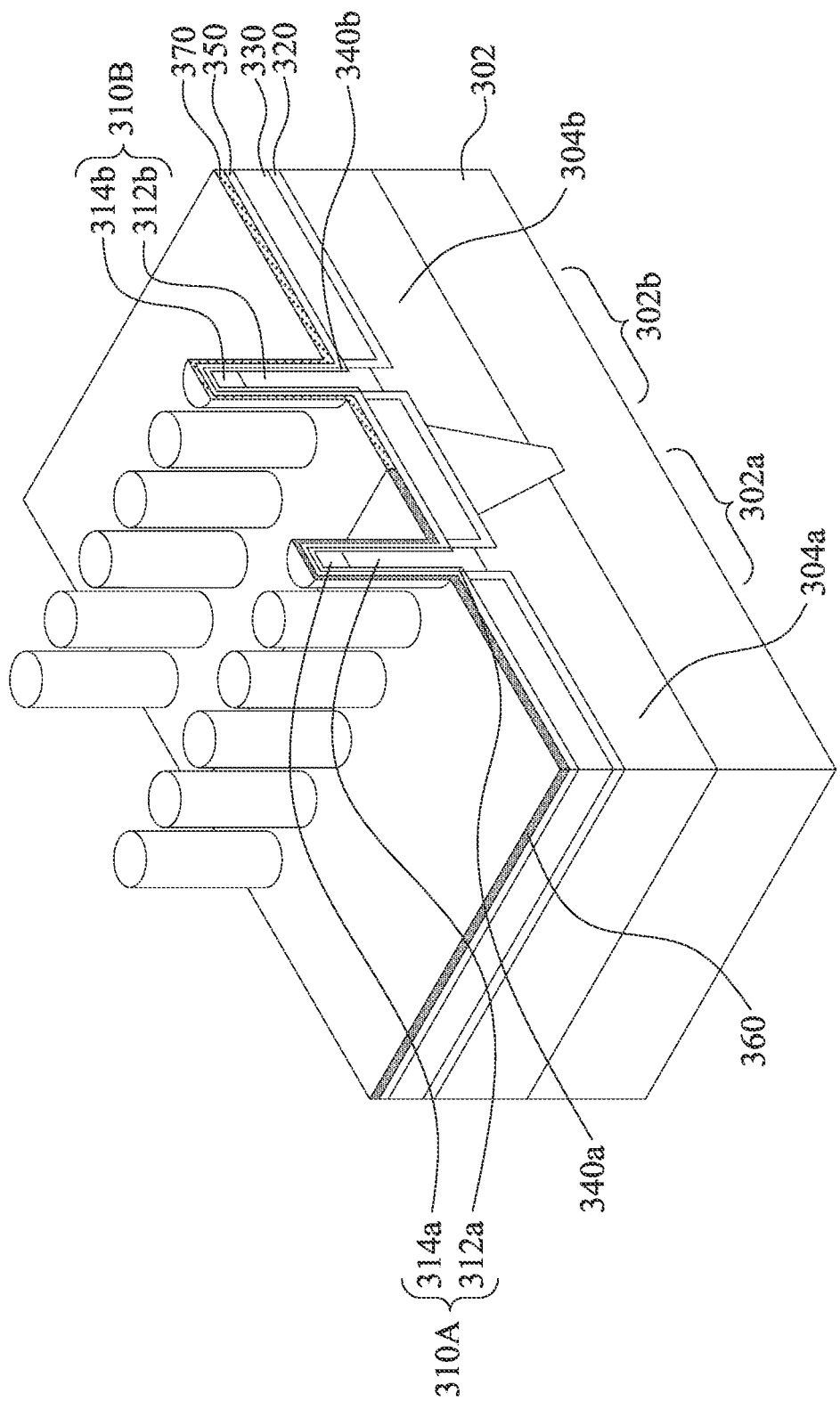

Thereafter, a portion of the first high-k dielectric sheath layer 360 over the device region 302b is removed using a suitable patterning process (e.g., a combination of photolithography and etching), and a second high-k dielectric sheath layer 370 is then formed over the device region 302b. The resulting structure is shown in FIG. 19. In some embodiments, the second high-k dielectric sheath layer 370 includes $Al_2O_3$, $TiO_2$, $ZrO_2$, MgO, the like, or a combination thereof. The formation method of the second high-k dielectric sheath layer 370 may include, for example, molecular beam deposition (MBD), ALD, PECVD, and the like.

Figure 20:
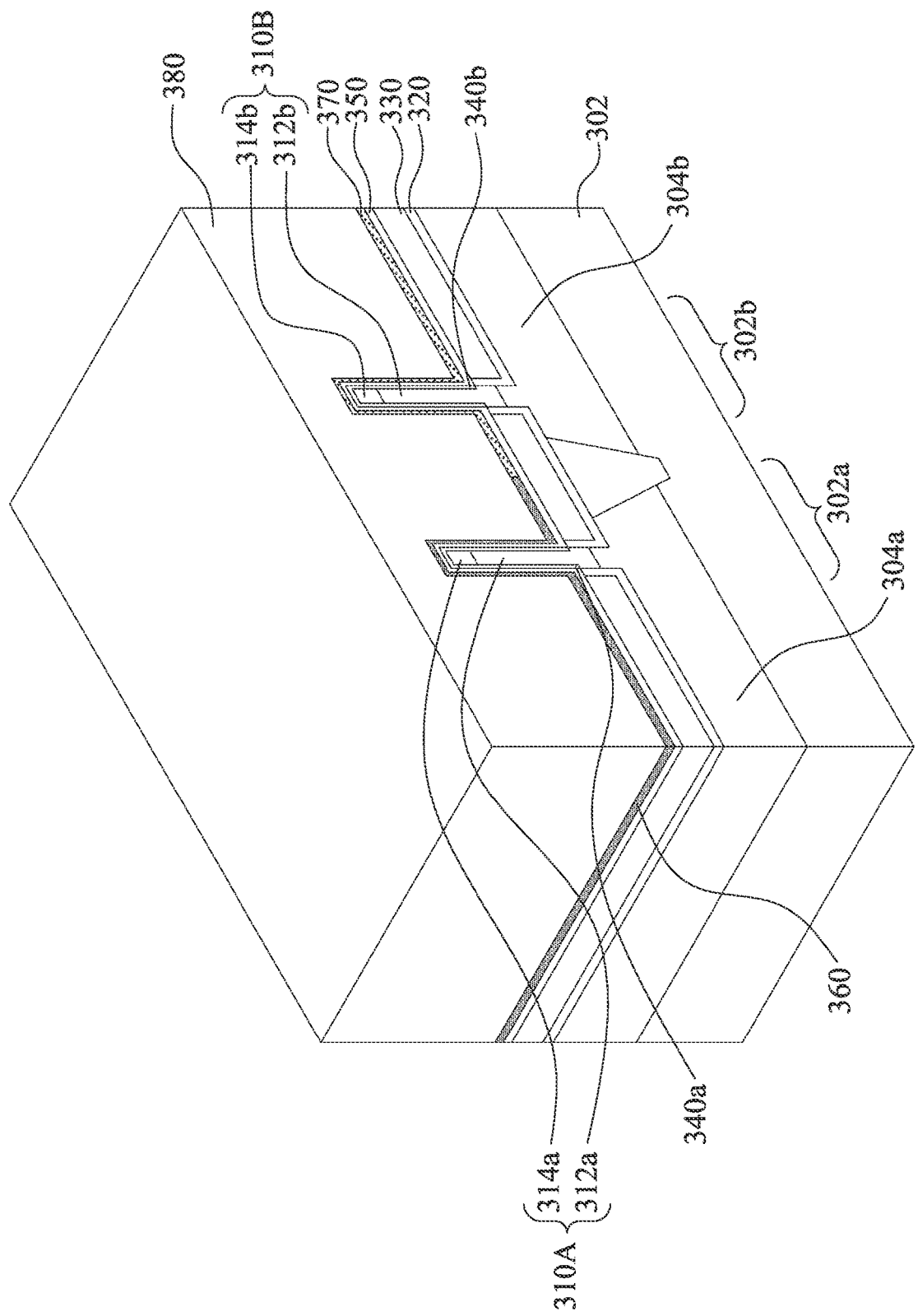
Figure 21:
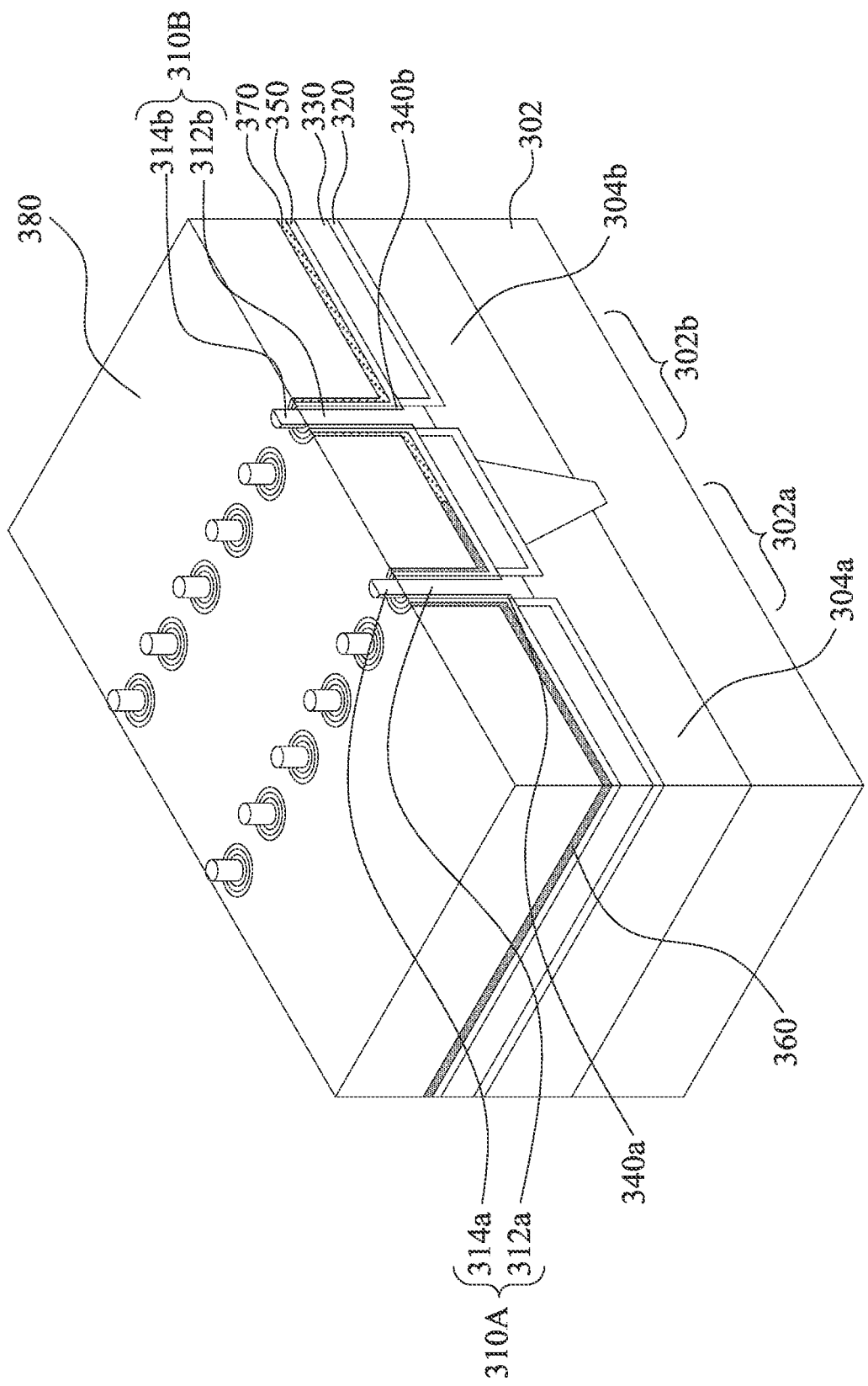

Next, as shown in FIG. 20, a metal layer 380 is formed over the substrate 302 to surround the first and second nanowires 310A and 310B. In some embodiments, the metal layer 380 includes tungsten (W), cobalt (Co), ruthenium (Ru), aluminum (Al), the like, or a combination thereof. Formation of the metal layer 380 may include, for example, MBD, ALD, PECVD, and the like. Thereafter, the metal layer 380 is etched back to expose the first and second top source/drain regions 314a and 314b, and the resulting structure is shown in FIG. 21. In the resulting structure, the metal layer 380 may not share any interface with the top and bottom source/drain regions 304a/304b/314a/314b (e.g., top and bottom source/drain regions). After the etching back, an ILD layer (not shown) can be formed to cover the exposed top source/drain regions 314a and 314b.

Figure 22:
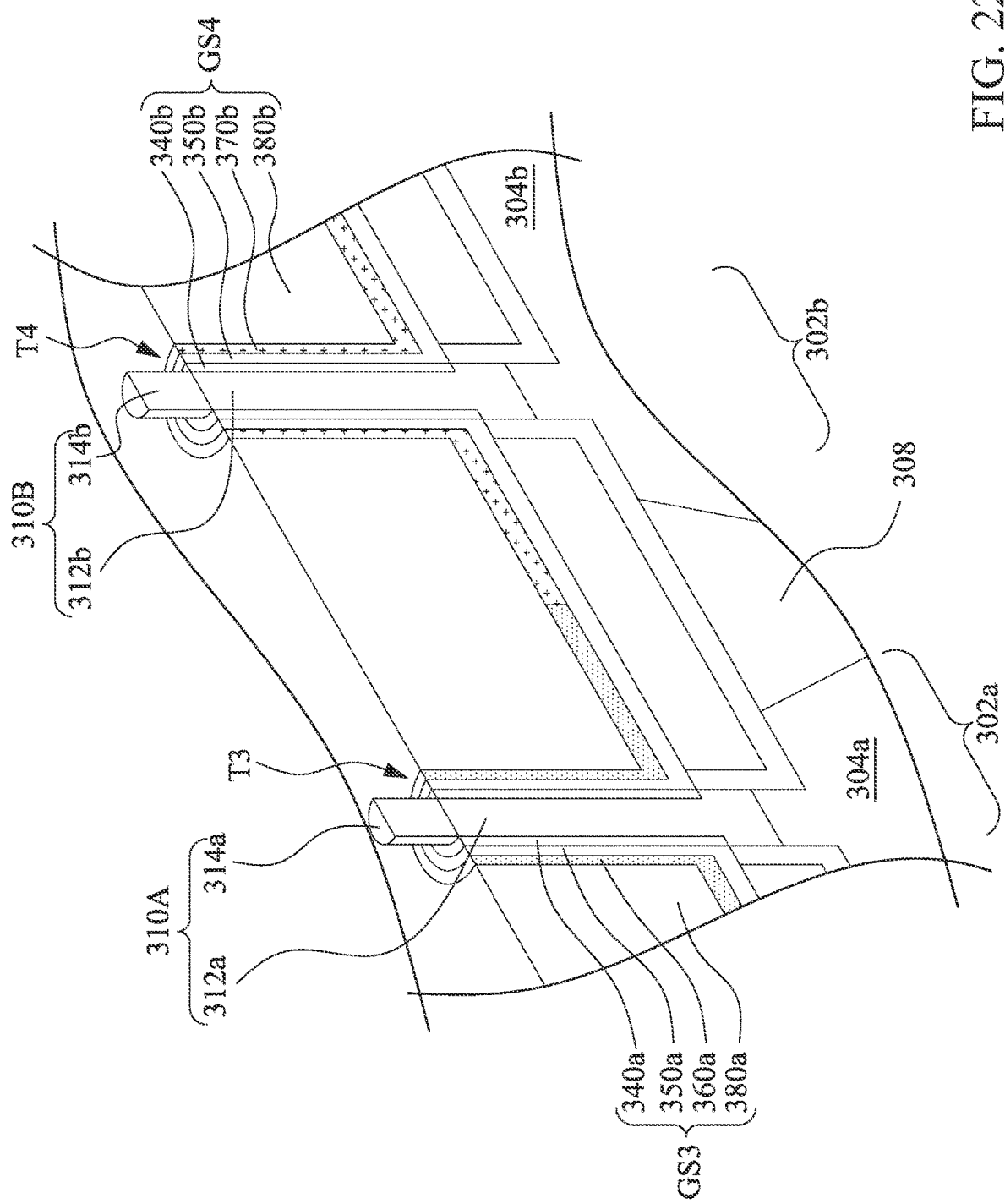

FIG. 22 is an enlarged view of FIG. 21. As illustrated, portions of the high-k dielectric layer 350 respectively surround the first interfacial layers 340a and can be referred to as first high-k dielectric linings 350a, and other portions of the high-k dielectric layer 350 respectively surround the second interfacial layers 340b and can be referred to as second high-k dielectric linings 350b. Portions of the first high-k dielectric sheath layers 360 respectively surround the first high-k dielectric linings 350a and can be referred to as first high-k dielectric sheaths 360a, and portions of the second high-k dielectric sheath layers 370 respectively surround the second high-k dielectric linings 350b and can be referred to as second high-k dielectric sheaths 370b. A portion of the metal layer 380 surrounds the first high-k dielectric sheaths 360a and can be referred to as a first metal gate electrode 380a, and a portion of the metal layer 380 surrounds the second high-k dielectric sheaths 370b and can be referred to as a second metal gate electrode 380b.

The first interfacial layers 340a, first high-k dielectric linings 350a, first high-k dielectric sheaths 360a, and first metal gate electrode 380a can be in combination serve as a first gate stack GS3 for the channel regions 312a of the first nanowires 310A. The second interfacial layers 340b, second high-k dielectric linings 350b, second high-k dielectric sheaths 370b, and second metal gate electrode 380b can be in combination serve as a second gate stack GS4 for the channel regions 312b of the second nanowires 310B.

In some embodiments, the first and second high-k dielectric sheaths 360a and 370b include different materials used to adjust the work function of first and second gate stacks GS3 and GS4 to a desired value based on device design. For example, if the first gate stack GS3, the first nanowires 310A and the first bottom source/drain region 304a form an n-type GAA transistor T3, the first high-k dielectric sheaths 360a can include a material used to adjust the work function of the first gate stack GS3 suitable for the n-type device. The material of the first high-k dielectric sheaths 360a suitable for the n-type device may be, for example, $Y_2O_3$, $Lu_2O_3$, $La_2O_3$, SrO, Er, Sc, or a combination thereof. On the contrary, if the second gate stack GS4, the second nanowires 310B and the second bottom source/drain region 304b form a p-type GAA transistor T4, the second high-k dielectric sheaths 370 can include a material used to adjust the work function of the second gate stack GS4 suitable for the p-type device. The material of the second high-k dielectric sheaths 370b suitable for the p-type device may be, for example, $Al_2O_3$, $TiO_2$, $ZrO_2$, MgO, or a combination thereof. In some embodiments, the first high-k dielectric sheaths 360a are made of $La_2O_3$, and the second high-k dielectric sheaths 370b is made of $Al_2O_3$.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a single metal layer can be used as a gate electrode of a GAA transistor, and hence deposition of the gate electrode can be eased compared to multi-layered gate electrode. Another advantage is that different high-k dielectric sheaths are respectively used for n-type and p-type GAA transistors, and different work functions of gate stacks of the n-type and p-type GAA transistors can be achieved. Yet another advantage is that the high-k dielectric sheaths around the neighboring nanowires can be merged, and hence no metal interposes neighboring nanowires. This may be beneficial for reducing parasitic capacitance.

Figure 23:
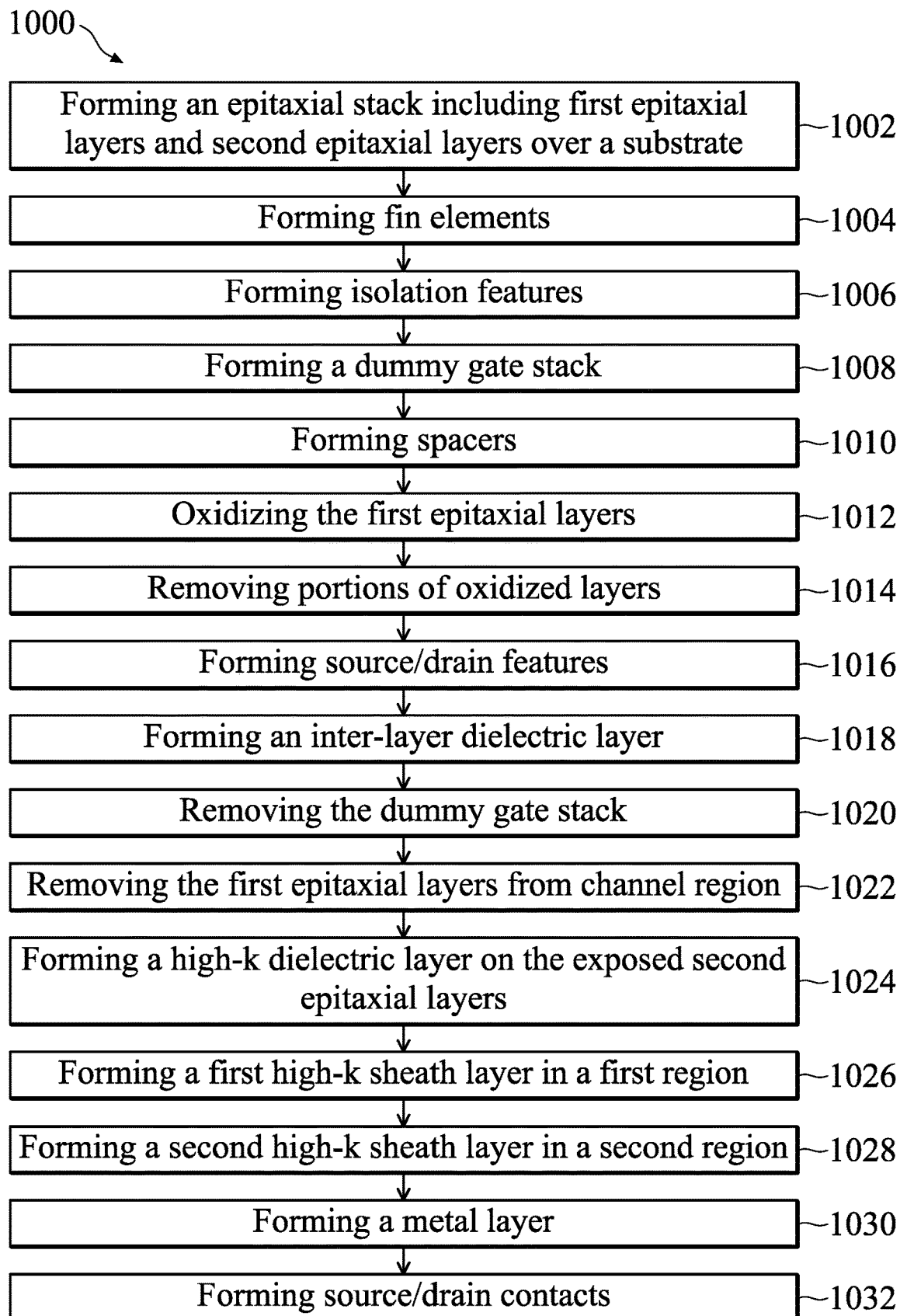
FIG. 23 illustrates a flow chart outlining a method for forming a semiconductor device in accordance with some embodiments of the present disclosure.

FIG. 23 illustrates a flow chart outlining a method 1000 for forming a semiconductor device in accordance with some embodiments of the present disclosure. The method 1000 is used to form the semiconductor device as described previously with respect to FIGS. 1-16, in accordance with some embodiments.

In operation 1002, an epitaxial stack 104 including first epitaxial layers 106 and second epitaxial layers 108 are formed over a substrate 102, as shown in FIG. 1, in accordance with some embodiments. In operation 1004, fin elements 112 are formed by patterning the epitaxial stack 104, as shown in FIGS. 2A-2C, in accordance with some embodiments. In operation 1006, isolation features 116 are formed, as shown in FIGS. 3A-3C, in accordance with some embodiments.

In operation 1008, a dummy gate stack 118 is formed across the fin elements 112, as shown in FIGS. 4A-4D, in accordance with some embodiments. In operation 1010, spacers 125 are formed along the dummy gate stack 118, as shown in FIGS. 5A-6D, in accordance with some embodiments.

In operation 1012, the first epitaxial layers 106 are oxidized to form oxidized layers 122, as shown in FIGS. 7A-7D, in accordance with some embodiments. In operation 1014, portions of the oxidized layers 122 are removed from source/drain regions and portions 122A of the oxidized layers 122 remain under the spacers 125, as shown in FIGS. 8A-8D, in accordance with some embodiments.

In operation 1016, source/drain features 126 and 128 are formed in a region 102a and a region 102b respectively, as shown in FIGS. 9A-9D, in accordance with some embodiments. In operation 1018, an inter-layer dielectric layer 130 is formed over the source/drain features 126 and 128, as shown in FIGS. 10A-10D, in accordance with some embodiments.

In operation 1020, the dummy gate stack 118 is removed, as shown in FIGS. 11A-11D, in accordance with some embodiments. In operation 1022, the first epitaxial layers 106 are removed from a channel region to expose the second epitaxial layers 108, as shown in FIGS. 11A-11D, in accordance with some embodiments.

In operation 1024, interfacial layers 210 are formed around the exposed second epitaxial layers 108 and high-k dielectric layers 220 are formed around the interfacial layers 210, as shown in FIG. 12, in accordance with some embodiments. In operation 1026, first high-k dielectric sheath layers 230 are formed around the high-k dielectric layers 220 in the first region 102a, as shown in FIGS. 12-13, in accordance with some embodiments. In operation 1028, second high-k dielectric sheath layers 250 are formed around the high-k dielectric layers 220 in the second region 102b, as shown in FIGS. 14A-14C, in accordance with some embodiments. In operation 1030, a metal layer 260 is formed around the first high-k dielectric sheath layers 230 and the second high-k dielectric sheath layers 250, as shown in FIGS. 14A-14C, in accordance with some embodiments.

In operation 1032, the inter-layer dielectric layer 130 is removed; silicide features 150 are formed on the source/drain features 126 and 128; an inter-layer dielectric layer 152 is formed over the source/drain features 126 and 128;

and source/drain contacts 1032 are formed to the silicide features 150, as shown in FIGS. 15-16, in accordance with some embodiments.

Embodiments of a semiconductor device may be provided below. The semiconductor device includes a set of nanostructures with middle portions thinner than end portions, a plurality of semiconductor capping layers formed around the thinner middle portions of the nanostructures, and a gate structure formed around the semiconductor capping layers. Since the middle portion is thinner than the end portions, the space between the middle portions of neighboring nanostructures may be filled with more work function adjustment layers. Therefore, various transistors having different threshold voltages in a semiconductor substrate may be achieved.

Figure 24:
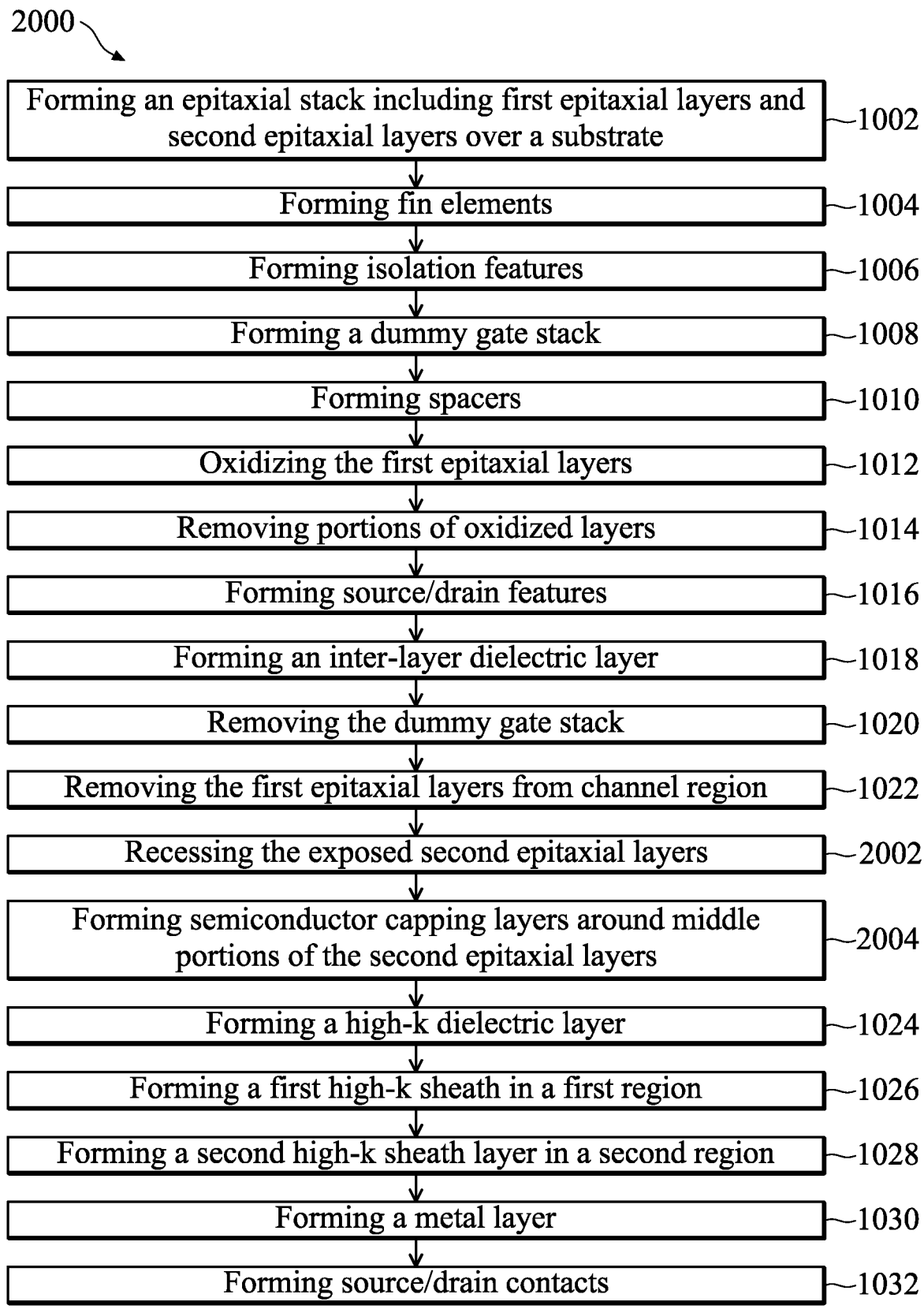
FIG. 24 illustrates a flow chart outlining a method for forming a semiconductor device in accordance with some embodiments of the present disclosure.

FIG. 24 illustrates a flow chart outlining a method 2000 for forming a semiconductor device in accordance with some embodiments of the present disclosure. The method 2000 differs from the method 1000 in that the method 2000 further includes, after operation 1022 and before operation 1024, operation 2002 and operation 2004, in accordance with some embodiments. Since operations 1002 to 1032 of the method 2000 are similar to operations 1002 to 1032 of method 1000 described previously with respect to FIGS. 1-16, a detailed description thereof is omitted herein for the sake of brevity.

FIGS. 25A-1 to 25D-3 illustrate one or more steps of forming a semiconductor device during the method 2000 in accordance with some embodiments of the present disclosure.

Figures 1, 25A:
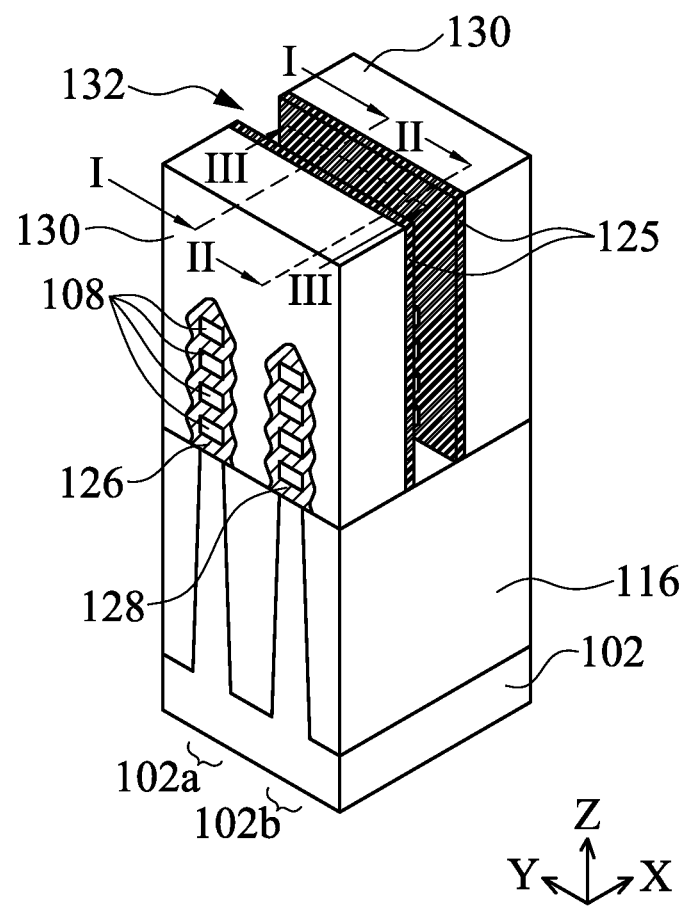

FIG. 25A-1 illustrates a perspective view of a semiconductor structure after operation 1022 of the method 2000 in which the first epitaxial layers 106 are removed from the channel region to expose the second epitaxial layers 108, in accordance with some embodiments. For a better understanding of the semiconductor structure, an X-Y-Z coordinate reference is provided in FIG. 25A-1. The X-axis and Y-axis are generally orientated along the lateral directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

FIG. 25A-1 further illustrates reference cross-sections that are used in later figures. Cross-sections I-I and II-II are in planes along the longitudinal axes of the second epitaxial layers 108 in the region 102a and the region 102b, respectively, in accordance with some embodiments. Cross-section III-III is in a plane across the channel region of the second epitaxial layers 108 and is along the longitudinal axis of a gate structure, in accordance with some embodiments.

Figures 2, 3, 25A:
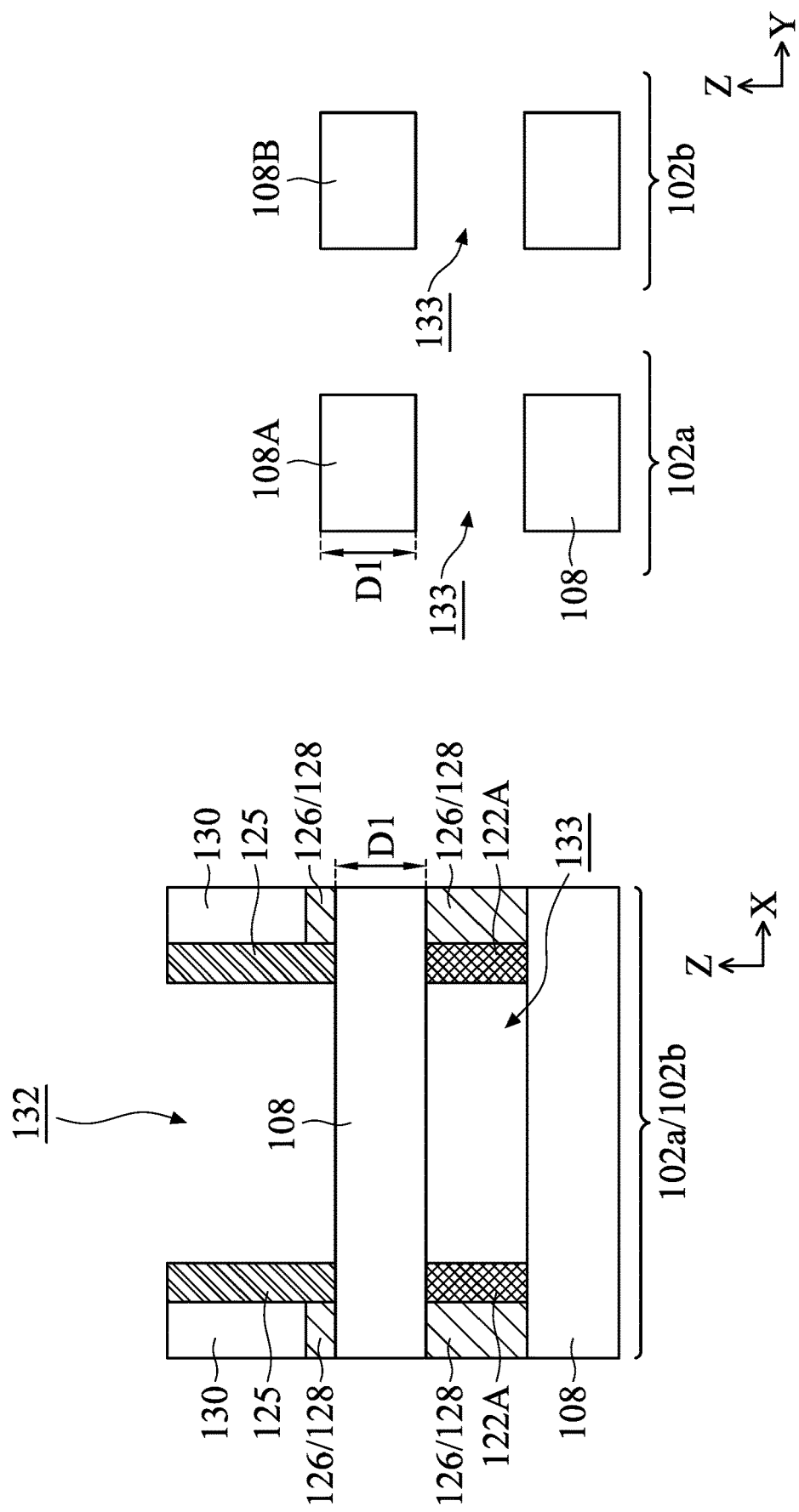

FIG. 25A-2 is a cross-sectional view corresponding to cross-section I-I or II-II of FIG. 25A-1, and FIG. 25A-3 is a cross-sectional view corresponding to cross-section III-III of FIG. 25A-1. For the sake of simplicity and clarity, FIGS. 25A-2 and 25A-3 only illustrate the uppermost two of the second epitaxial layers 108 and neighboring features.

The first epitaxial layers 106 are removed from the channel region thereby exposing the four main surfaces of the second epitaxial layers 108 and forming gaps 133, as shown in FIGS. 25A-1 to 25A-3, in accordance with some embodiments. The gaps 133 are formed between two neighboring second epitaxial layers 108, in accordance with some embodiments. The exposed second epitaxial layers 108 form nanostructures that function as channel layers of the resulting semiconductor devices (e.g., GAA transistors), in accordance with some embodiments. As the term is used herein, "nanostructures" refers to semiconductor layers that have cylindrical shape, bar shaped and/or sheet shape. Portions of nanostructures 108 surrounded by the source/drain features 126 and 128 are also used to form the source/drain terminals of the resulting semiconductor devices, in accordance with some embodiments. In some embodiments, the second epitaxial layers 108 have a thickness D1 along Z direction in a range of about 2 nm to about 20 nm.

Figures 1, 2, 25B:
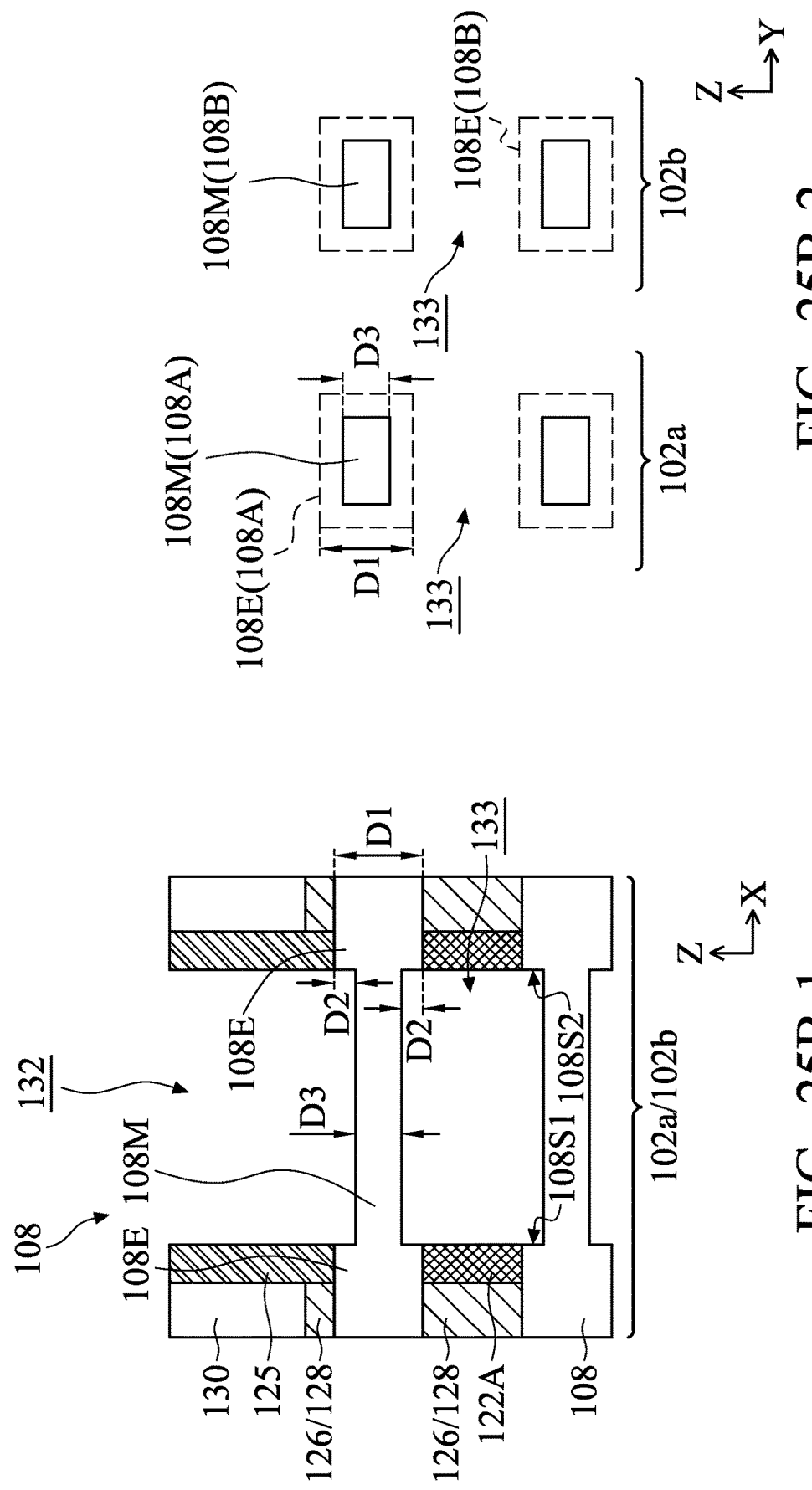

FIGS. 25B-1 and 25B-2 illustrate cross-sectional views of a semiconductor structure after operation 2002 of the method 2000 in which the exposed second epitaxial layers 108 are recessed, in accordance with some embodiments. FIG. 25B-1 corresponds to cross-section I-I or II-II of FIG. 25A-1, and FIG. 25B-2 corresponds to cross-section III-III of FIG. 25A-1.

An etching process is performed on the semiconductor structure of FIGS. 25A-1 to 25A-3, in accordance with some embodiments. Middle portions of the second epitaxial layers 108 at the channel region are recessed to form recessed middle portions 108M, as shown in FIGS. 25B-1 and 25B-2, in accordance with some embodiments. Because covered by the gate spacers 125 and the source/drain features 126 or 128, end portions 108E of the second epitaxial layers 108 on the opposite sides of the middle portions 108M of the second epitaxial layers 108 are not recessed during the etching process, in accordance with some embodiments. FIG. 25B-2 illustrates the end portions 108E of the second epitaxial layers 108 with dashed lines because the end portions 108E of the second epitaxial layers 108 are located outside the cross-sectional view of FIG. 25B-2.

In some embodiments, the etching process is an isotropic etching process that thins down the middle portions of the second epitaxial layers 108 from the four main surfaces of the second epitaxial layers 108 toward the interior of the second epitaxial layers 108. The isotropic etching process may be wet etching, dry chemical etching, or another suitable etching technique. In some embodiments, the middle portions of the second epitaxial layers 108 are recessed to an etching depth D2 that is in a range of about 0.5 nm to about 3 nm. In some embodiments, the ratio of the etching depth D2 to the thickness D1 of the second epitaxial layers 108 is in a range of about 0.1 to about 0.16. That is, the total etching amount (twice the etching depth D2) is from about 0.2 to about 0.33 of the thickness D1. In some embodiments, the recessed middle portions 108M of the second epitaxial layers 108 have a thickness D3 in a range of about 1.5 nm to about 17 nm, as shown in FIG. 25B-1 and 25B-2. In some embodiments, the ratio of thickness D3 to thickness D1 is in a range of about 0.67 to about 0.8. If the ratio of thickness D3 to thickness D1 is too low, the current flowing through the channel layer, which is formed from the middle portions 108M of the second epitaxial layers 108, may decrease, which may affect device performance (e.g., speed). If the ratio of thickness D3 to thickness D1 is too high, the gap 133 may not provide enough space to accommodate more work function adjustment layers.

After the etching process, a distance between the recessed middle portions 108M of neighboring two second epitaxial layers 108 is greater than a distance between the end portions 108E of neighboring two second epitaxial layers 108, in accordance with some embodiments. That is, the etching process enlarges the gaps 133, in accordance with some embodiments.

The etching process creates inner side surfaces 108S1 and 108S2 of the end portions 108E facing the channel regions, as shown in FIG. 25B-1, in accordance with some embodiments. The inner side surfaces 108S1 and 108S2 face one another, in accordance with some embodiments. In some embodiments, the inner side surfaces 108S1 and 108S2 are aligned below the inner sidewalls of the gate spacers 125 facing the channel region.

FIGS. 25C-1 and 25C-2 illustrate cross-sectional views of a semiconductor structure after operation 2004 of the method 2000 in which the semiconductor capping layers 404 are formed around the middle portions 108M of the second epitaxial layers 108, in accordance with some embodiments. FIG. 25C-1 corresponds to cross-section I-I or II-II of FIG. 25A-1, and FIG. 25C-2 corresponds to cross-section III-III of FIG. 25A-1.

Semiconductor capping layers 404 are formed on the recessed middle portions 108M of the second epitaxial layers 108 using an epitaxial growth process, as shown in FIGS. 25C-1 and 25C-2, in accordance with some embodiments. In some embodiments, the semiconductor capping layers 404 are made of silicon germanium. Portions of the semiconductor capping layers 404 formed in the region 102a are denoted as 404a while portions of the semiconductor capping layers 404 formed in the region 102b are dented as 404b, in accordance with some embodiments.

The semiconductor capping layers 404 are epitaxially grown from the semiconductor surface of the second epitaxial layers 108 and substantially not grown from dielectrics, e.g., the spacers 125, the oxidized layers 122A, and/or the inter-layer dielectric layer 130, in accordance with some embodiments. The semiconductor capping layer 404 extends along the middle portion 108M of the second epitaxial layer 108 from the inner side surface 108S1 to the inner side surface 108S2, in accordance with some embodiments. In some embodiments, the semiconductor capping layer 404 interfaces the second epitaxial layer 108 at the outer surface of the middle portion 108M and the inner side surfaces 108S1 and 108S2 of the end portions 108E.

The semiconductor capping layers 404 are configured as work function adjustment layers to adjust the effective work functions of the gate structures for transistors, which may allow for various transistors over a substrate to have different threshold voltages, in accordance with some embodiments. The gaps 133 are enlarged by recessing the middle portions of the second epitaxial layers 108, and therefore provide more space to accommodate more work function adjustment layers, such as the semiconductor capping layers 404 and materials subsequently formed over the semiconductor capping layers 404 (such as the high-k dielectric layer, high-k sheath layer, and/or the metal layer). As a result, the embodiments of the present disclosure may provide greater processing flexibility to achieve various transistors having different threshold voltages in a semiconductor substrate.

In addition, the semiconductor capping layers 404 also serve as portions of the channel layers of transistors, and therefore the loss of current flowing through the channels layers of the transistors due to recessing the middle portions of the second epitaxial layers 108 may be compensated.

In some embodiments, the semiconductor capping layers 404 are formed to have a thickness D4 in a range of about 0.5 nm to about 3 nm, as shown in FIGS. 25C-1 and 25C-2. In some embodiments, the thickness D4 is substantially equal to the etching depth D2. In some embodiments, the germanium concentration of the semiconductor capping layers 404 is in a range of about 10 atomic % to about 60 atomic %. In some embodiments, the semiconductor capping layers 404 may be formed separately for N-type FETs and P-type FETs such that the semiconductor capping layers 404a and the semiconductor capping layers 404b may have different thicknesses and germanium concentrations. For example, the semiconductor capping layers 404a in the region 102a (such as NMOS region) may be thinner than the semiconductor capping layers 404b in the region 102b (such as PMOS region). The germanium concentration of semiconductor capping layer 404a in the region 102a (such as NMOS region) may be less than the concentration of the semiconductor capping layer 404b in the region 102b (such as PMOS region).

Figures 1, 2, 25D:
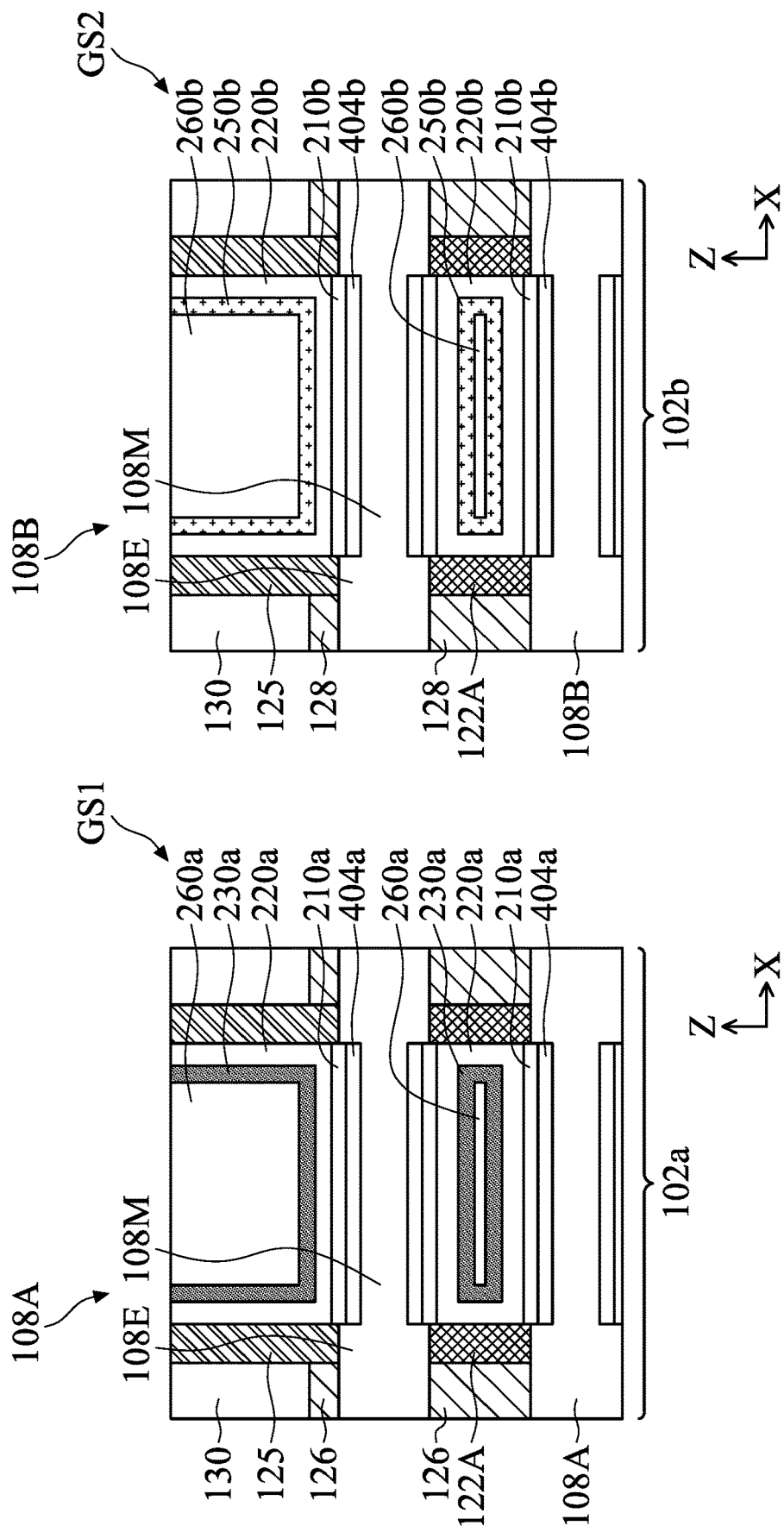
Figures 3, 25D:
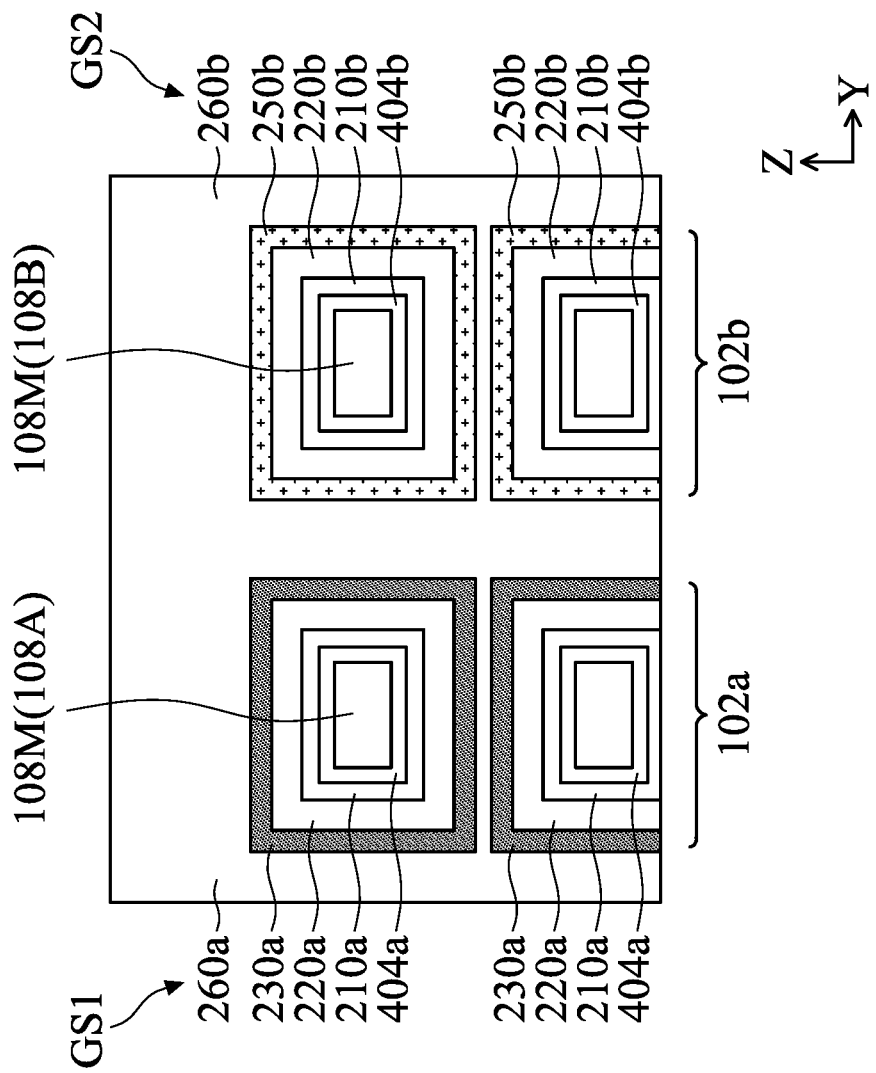

After the semiconductor capping layers 404 are formed, operations 1024-1030 of the method 2000, which are described previously with respect to FIGS. 12-14C, may be performed on the semiconductor structure of FIGS. 25C-1 and 25C-2. FIGS. 25D-1 to 25D-3 illustrate cross-sectional views of a semiconductor structure after operations 1030 of the method 2000 in which gate structures GS1 and GS2 are formed, in accordance with some embodiments. FIG. 25D-1 corresponds to cross-section I-I of FIG. 25A-1, FIG. 25D-2 corresponds to cross-section II-II of FIG. 25A-1, and FIG. 25D-3 corresponds to cross-section III-III of FIG. 25A-1.

A gate structure GS1 is formed to fill the gate trench 132 and the gaps 133 in the region 102a, and it is thereby wrapped around the nanostructures of the second epitaxial layers 108A, as shown in FIGS. 25D-1 and 25D-3, in accordance with some embodiments. A gate structure GS2 is formed to fill the gate trench 132 and the gaps 133 in the region 102b, and it is thereby wrapped around the nanostructures of the second epitaxial layers 108B, as shown in FIGS. 25D-2 and 25D-3, in accordance with some embodiments. The gate structure GS1 includes interfacial layers 210a disposed around the semiconductor capping layers 404a, high-k dielectric layer 220a disposed around the interfacial layers 210a, high-k dielectric sheath layers 230a disposed around the high-k dielectric layer 220a, and metal electrodes 260a disposed around the high-k dielectric sheath layers 230a, in accordance with some embodiments. The gate structure GS2 includes interfacial layers 210b formed around the semiconductor capping layers 404b, high-k dielectric layers 220b formed around the interfacial layers 210b, high-k dielectric sheath layers 250b formed around the high-k dielectric layer 220b, and metal electrodes 260b formed around the high-k dielectric sheath layers 230b, in accordance with some embodiments. The metal layer 260, used to form metal gate electrodes 260a and 260b of the gate structure GS1 and GS2, continuously extends across the semiconductor capping layers 404a and the semiconductor capping layers 404b, in accordance with some embodiments. The gate structure GS1, interposing the source/drain features 126, combines with the source/drain features 126 to form a FET, e.g., n-type GAA FET/nanostructure transistor, in accordance with some embodiments. The gate structure GS2, interposing the source/drain features 128, combines with the source/drain features 128 to form a FET, e.g., p-type GAA FET/nanostructure transistor, in accordance with some embodiments.

The gate structure GS1 and GS2 shown in FIGS. 25D-1 to 25D-3 are similar to those shown in FIGS. 14A-14C, except from the interfacial layers 210, in accordance with some embodiments. The interfacial layers 210 (including 210a in the region 102a and 210b in the region 102b) of the gate structures GS1 and GS2 are formed around the semiconductor capping layers 404, as shown in FIGS. 25D-1 to 25D-3, in accordance with some embodiments. The interfacial layers 210 are formed by oxidizing the outer portions of the semiconductor capping layers 404 such that the interfacial layers 210 wrap around unoxidized portions of the semiconductor capping layers 404, in accordance with some embodiments. In some embodiments, the interfacial layers 210 is germanium oxide, silicon oxide and/or silicon germanium oxide. The interfacial layers 210 extend along the semiconductor capping layers 404 between the end portions 108E of the second epitaxial layers 108, in accordance with some embodiments. After the gate structure GS1 and GS2 are formed, operation 1032 is performed on the semiconductor structure of FIGS. 25D-1 to 25D-3, to form source/drain contacts, in accordance with some embodiments.

FIGS. 26A-1 to 26B-3 illustrate one or more steps of forming a semiconductor device during the method 2000 in accordance with some embodiments of the present disclosure. The structures shown in FIGS. 26A-1 to 26B-3 are similar to those shown in FIGS. 25C-1 to 25D-3 except for the thickness of the semiconductor capping layers 404, in accordance with some embodiments.

FIGS. 26A-1 and 26A-2 illustrate cross-sectional views of a semiconductor structure after operation 2004 of the method 2000 in which semiconductor capping layers 404 are formed on the middle portions 108M of the second epitaxial layers 108, in accordance with some embodiments. FIG. 26A-1 corresponds to cross-section I-I or II-II of FIG. 25A-1, and FIG. 26A-2 corresponds to cross-section III-III of FIG. 25A-1.

Semiconductor capping layers 404 are formed around the recessed middle portions 108M of the second epitaxial layers 108 at the channel region, as shown in FIGS. 26A-1 and 26A-2, in accordance with some embodiments. In some embodiments, the semiconductor capping layers 404 are formed to have a thickness D5 in a range of about 0.5 nm to about 3 nm, as shown in FIGS. 26A-1 and 26A-2. In some embodiments, the thickness D5 is less than the etching depth D2 (FIG. 25B-1).

The semiconductor capping layers 404 are formed to conform to the profile of the second epitaxial layers 108, in accordance with some embodiments. The semiconductor capping layer 404 includes extending portions 404E along the inner side surfaces 108S1 and 108S2 of the end portions 108E of the second epitaxial layers 108 and a flat portion 404F located laterally between the extending portions 404E, in accordance with some embodiments. A dimension of the extending portion 404E along Z direction is greater than a dimension of the flat portion 404F along Z direction, in accordance with some embodiments. That is, a portion of the semiconductor capping layer 404 at its edge is thicker than a portion of the semiconductor capping layer 404 at its center, such that the semiconductor capping layer 404 has a concave outer surface, in accordance with some embodiments.

After the semiconductor capping layers 404 are formed, operations 1024-1030 of the method 2000 may be performed on the semiconductor structure of FIGS. 25A-1 and 26A-2. FIGS. 26B-1 to 26B-3 illustrate cross-sectional views of a semiconductor structure after operations 1030 of the method 2000 in which gate structures GS1 and GS2 are formed, in accordance with some embodiments. FIG. 26B-1 corresponds to cross-section I-I of FIG. 25A-1, FIG. 26B-2 corresponds to cross-section II-II of FIG. 25A-1, and FIG. 26B-3 corresponds to cross-section III-III of FIG. 25A-1.

Figures 1, 2, 26B:
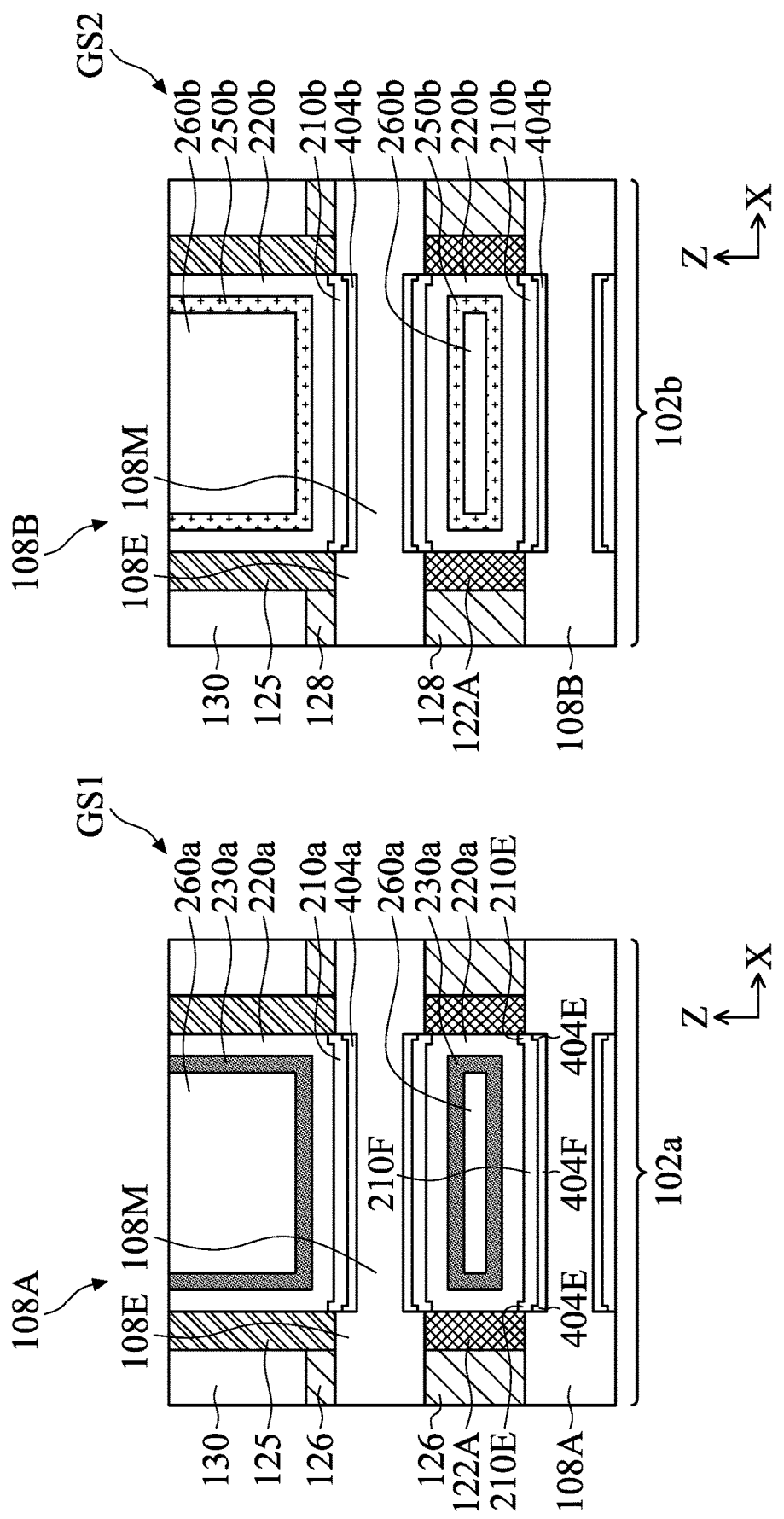
Figures 3, 26B:
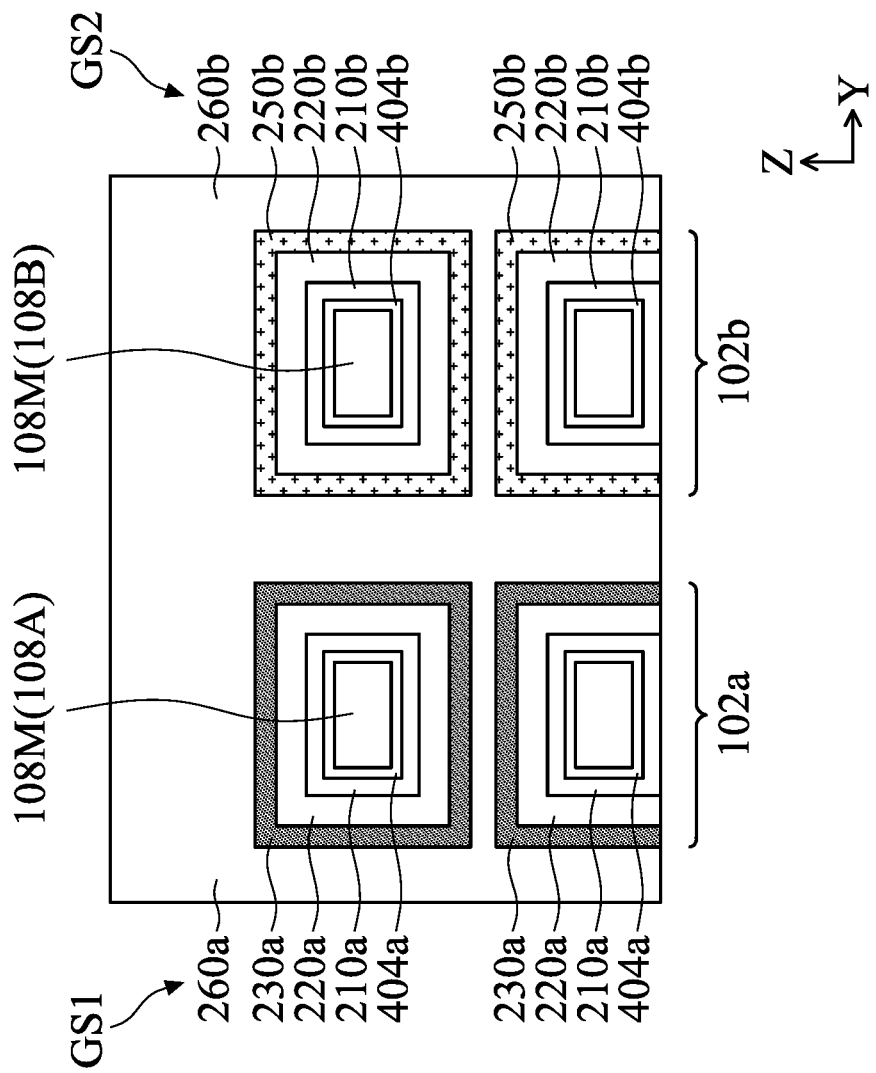

A gate structure GS1 is formed to fill the gate trench 132 and the gaps 133 in the region 102a, and it thereby wraps around the nanostructures of the second epitaxial layers 108A, as shown in FIGS. 26B-1 and 26B-3, in accordance with some embodiments. A gate structure GS2 is formed to fill the gate trench 132 and the gaps 133 in the region 102b, and it thereby wraps around the nanostructures of the second epitaxial layers 108B, as shown in FIGS. 26B-2 and 26B-3, in accordance with some embodiments.

The interfacial layers 210 of the gate structures GS1 and GS2 are formed to conform to the profile of the semiconductor capping layers 404, in accordance with some embodiments. The interfacial layers 210 include extending portions 210E along the inner side surfaces 108S1 and 108S2 of the end portions 108E of the second epitaxial layer 108 and a flat portion 210F located laterally between the extending portions 210E, in accordance with some embodiments.

FIGS. 27A-1 to 27B-3 illustrate one or more steps of forming a semiconductor device during the method 2000 in accordance with some embodiments of the present disclosure. The structures shown in FIGS. 27A-1 to 27B-3 are similar to those shown in FIGS. 25C-1 to 25D-3 except for the thickness of the semiconductor capping layers 404, in accordance with some embodiments.

Figures 1, 2, 27A:
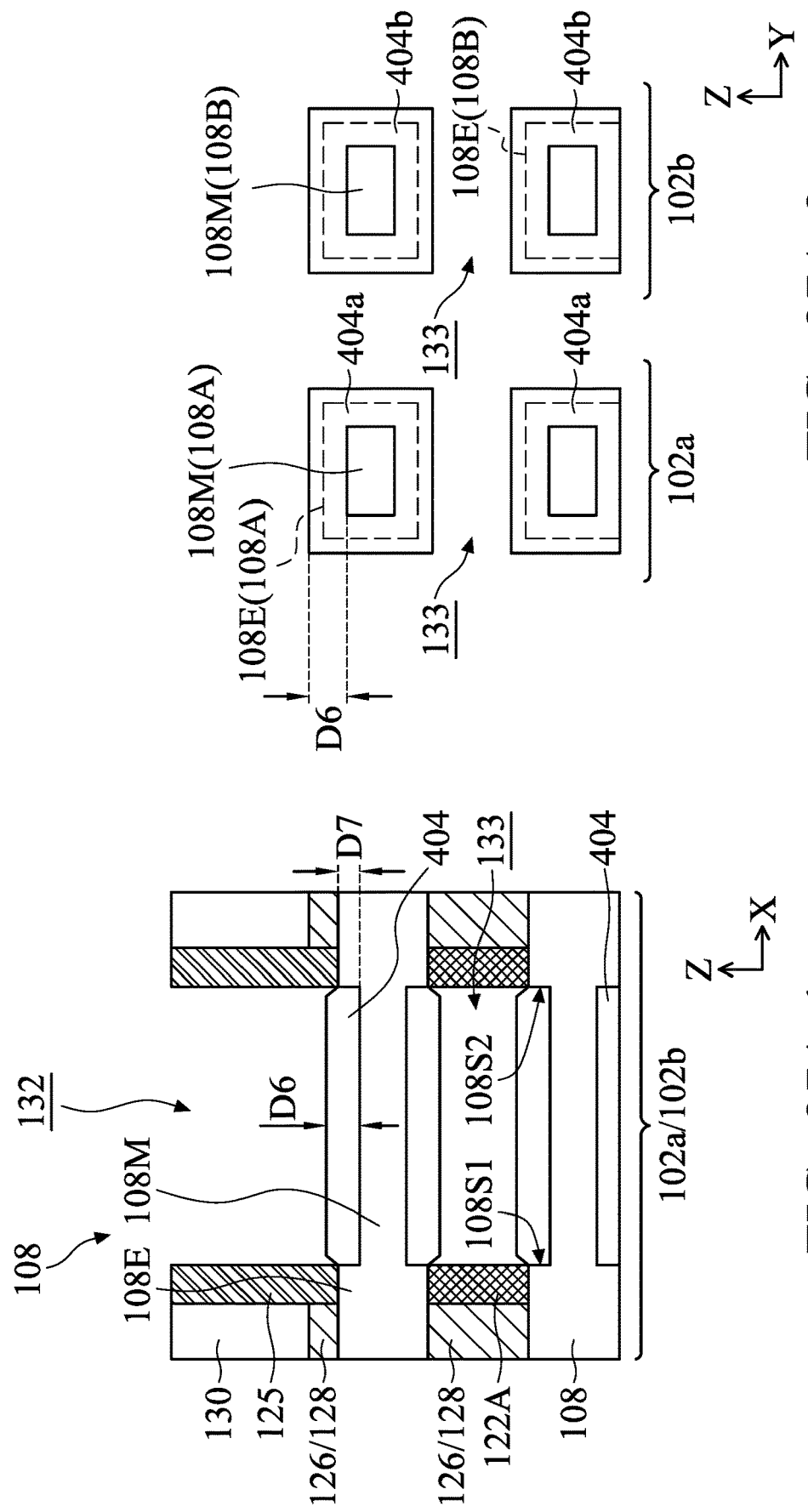

FIGS. 27A-1 and 27A-2 illustrate cross-sectional views of a semiconductor structure after operation 2004 of the method 2000 in which semiconductor capping layers 404 are formed on the middle portions 108M of the second epitaxial layers 108, in accordance with some embodiments. FIG. 27A-1 corresponds to cross-section I-I or II-II of FIG. 25A-1, and FIG. 27A-2 corresponds to cross-section III-III of FIG. 25A-1.

Semiconductor capping layers 404 are formed around the recessed middle portions 108M of the second epitaxial layers 108 at channel region, as shown in FIGS. 27A-1 and 27A-2, in accordance with some embodiments. In some embodiments, the semiconductor capping layers 404 are formed to have a thickness D6 in a range of about 0.5 nm to about 3 nm, as shown in FIG. 27A-1 and 27A-2. In some embodiments, the thickness D6 is greater than the etching depth D2 (FIG. 25B-1).

A portion of the semiconductor capping layer 404 at its edge is thinner than a portion of the semiconductor capping layer 404 at its center, such that the semiconductor capping layer 404 has a convex outer surface, in accordance with some embodiments.

Figures 1, 2, 27B:
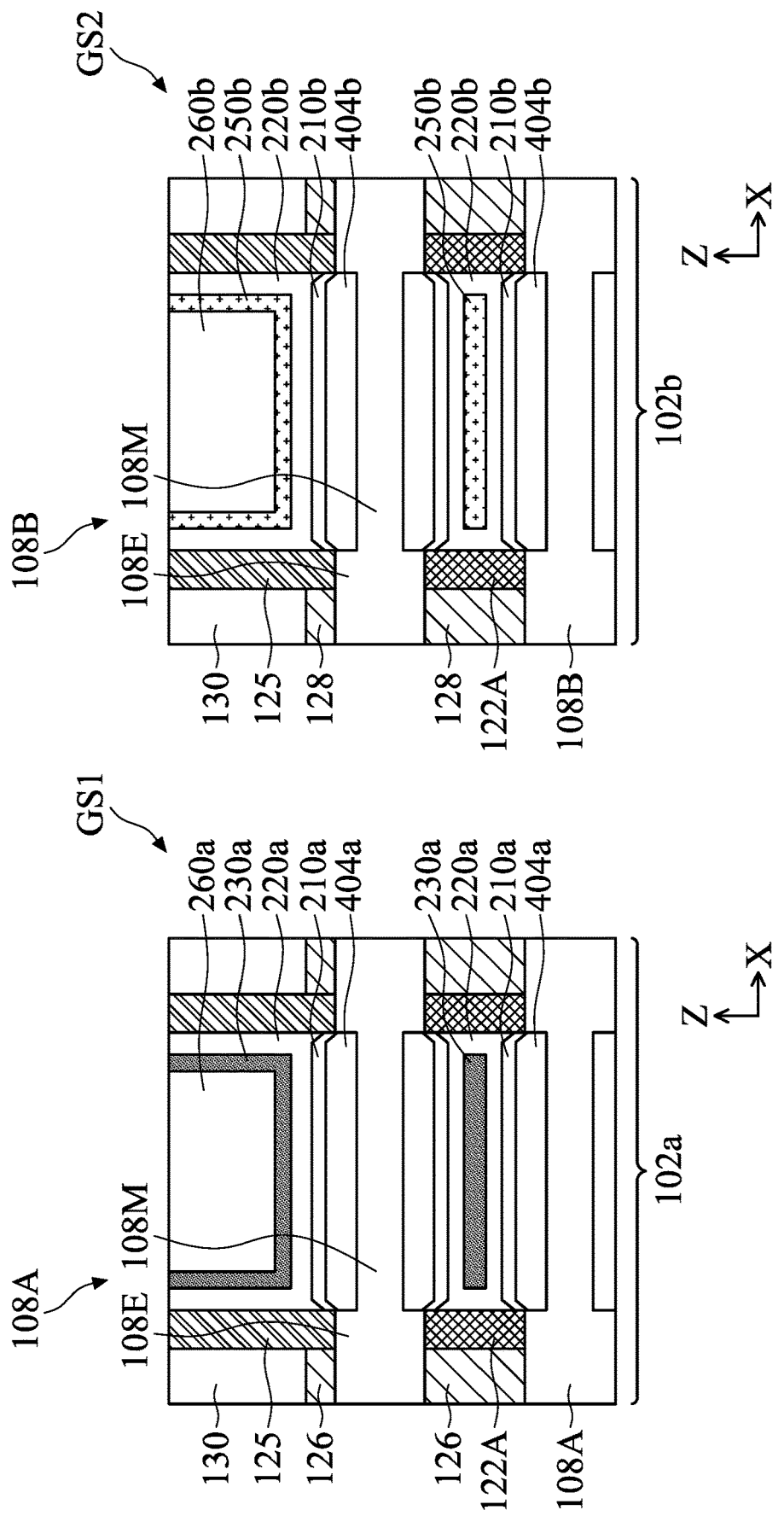
Figures 3, 27B:
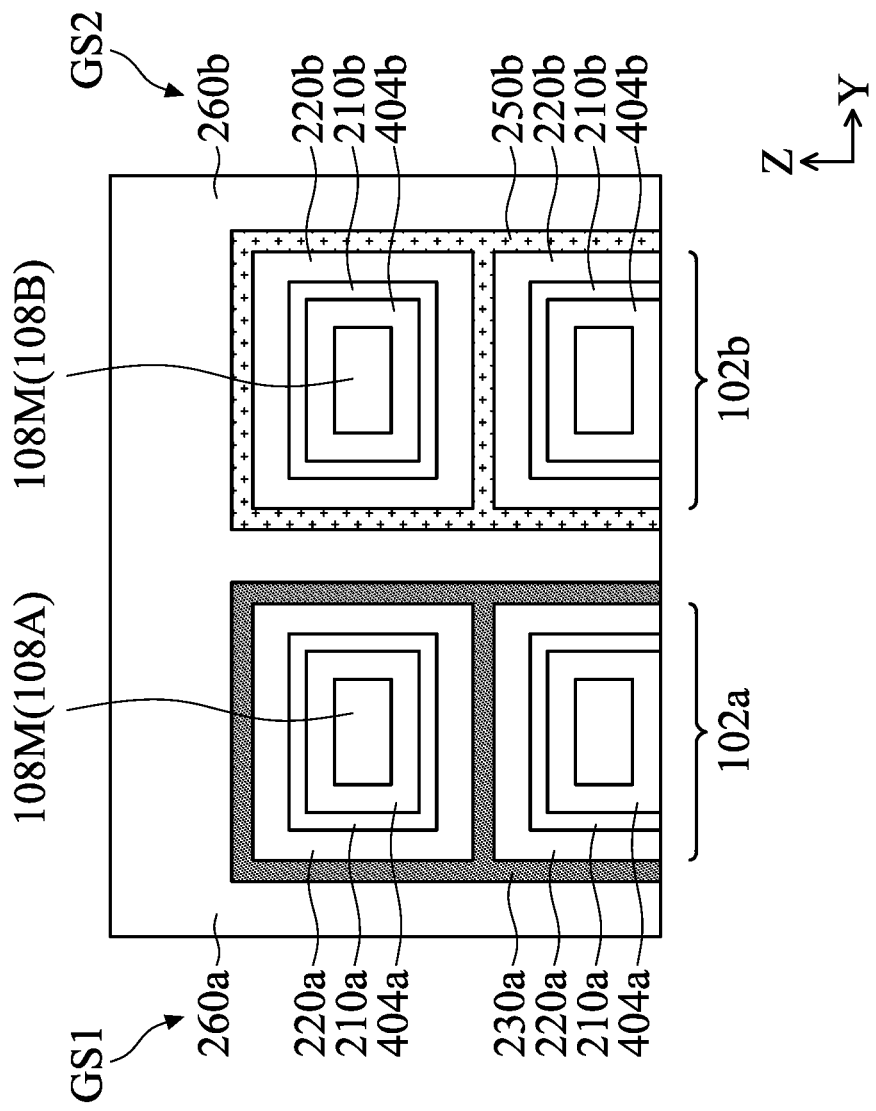

FIGS. 27B-1 to 27B-3 illustrate cross-sectional views of a semiconductor structure after operations 1030 of the method 2000 in which gate structures GS1 and GS2 are formed, in accordance with some embodiments. FIG. 27B-1 corresponds to cross-section I-I of FIG. 25A-1, FIG. 27B-2 corresponds to cross-section II-II of FIG. 25A-1, and FIG. 27B-3 corresponds to cross-section III-III of FIG. 25A-1.

A gate structure GS1 is formed to fill the gate trench 132 and the gaps 133 in the region 102a, and it thereby wraps around the nanostructures of the second epitaxial layers 108A, as shown in FIGS. 27B-1 and 27B-3, in accordance with some embodiments. A gate structure GS2 is formed to fill the gate trench 132 and the gaps 133 in the region 102b, and it thereby wraps around the nanostructures of the second epitaxial layers 108B, as shown in FIGS. 27B-2 and 27B-3, in accordance with some embodiments.

In some embodiments, portions of the high-k dielectric sheath layers 230a (or the dielectric sheath layers 250b) formed around neighboring second epitaxial layers 108 and are in contact with and merged with each other, as shown in FIGS. 27B-1 to 27B-3, in accordance with some embodiments. Therefore, the metal layer 260 partially surrounds the second epitaxial layers 108a and 108b and the gaps 133 are free of the metal layer 260, in accordance with some embodiments.

Figures 1, 2, 28:
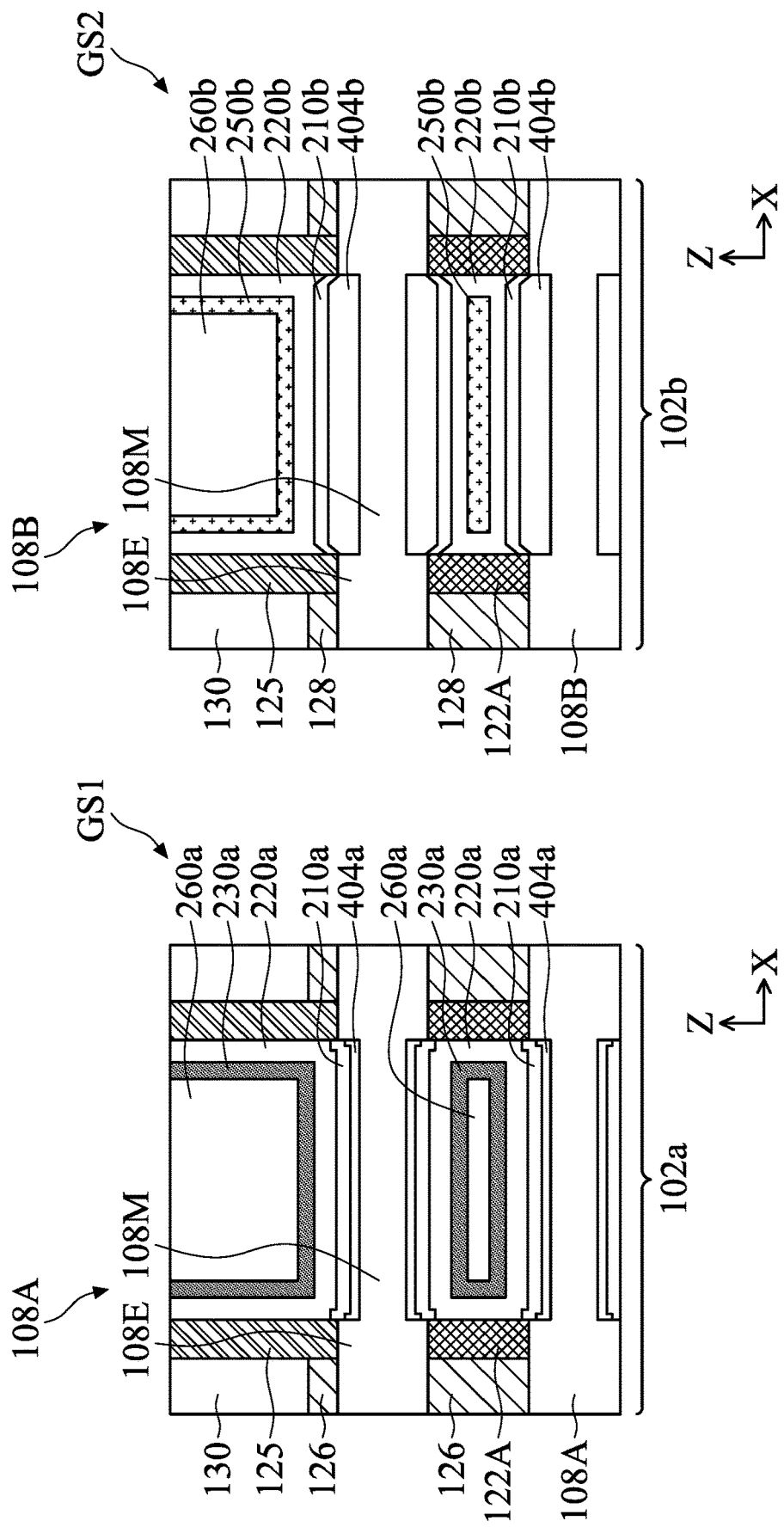
Figures 3, 28:
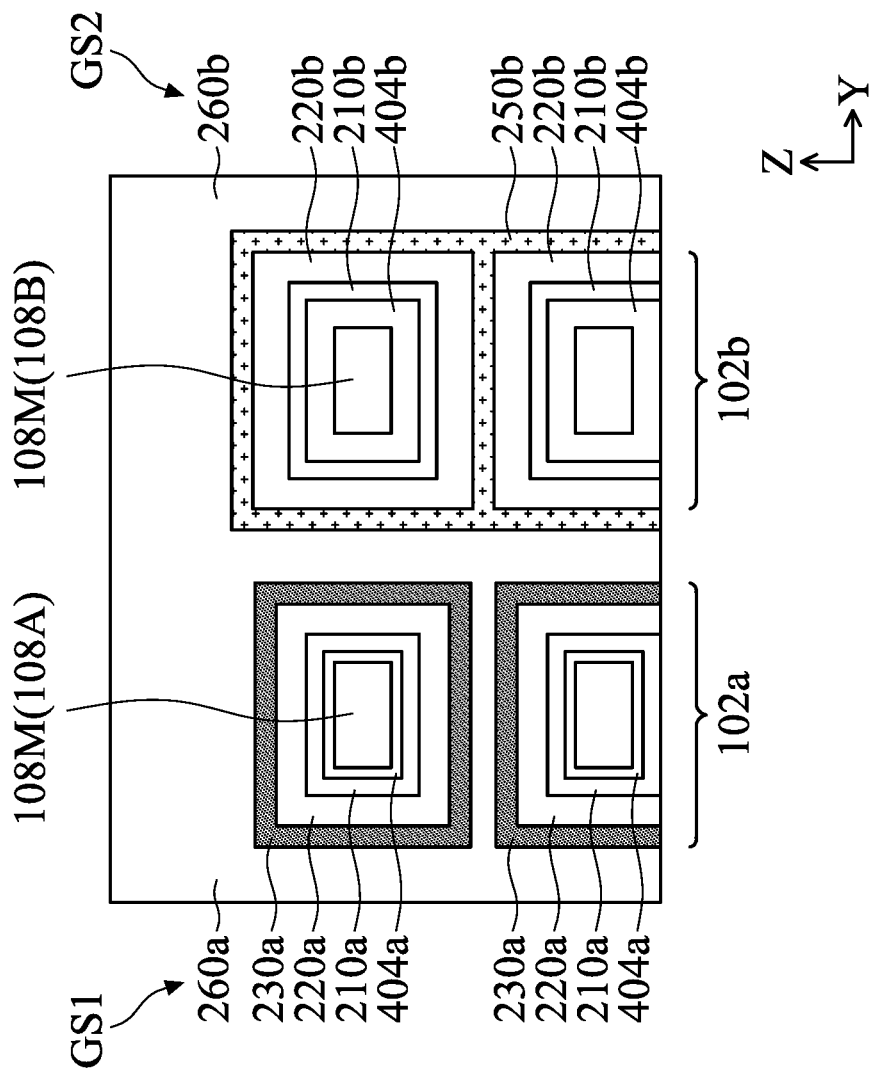
Figures 1, 2, 31:
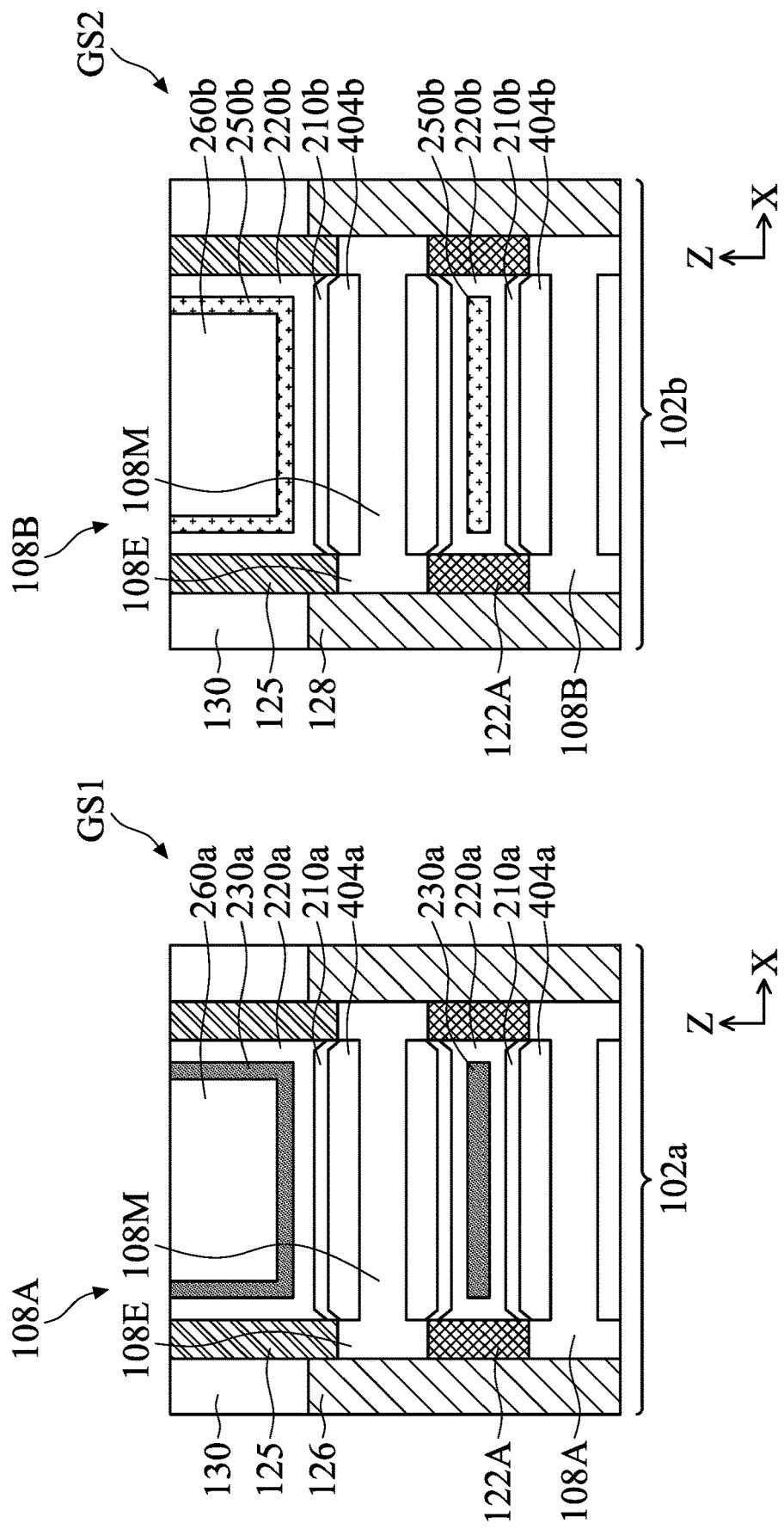
Figures 1, 2, 32:
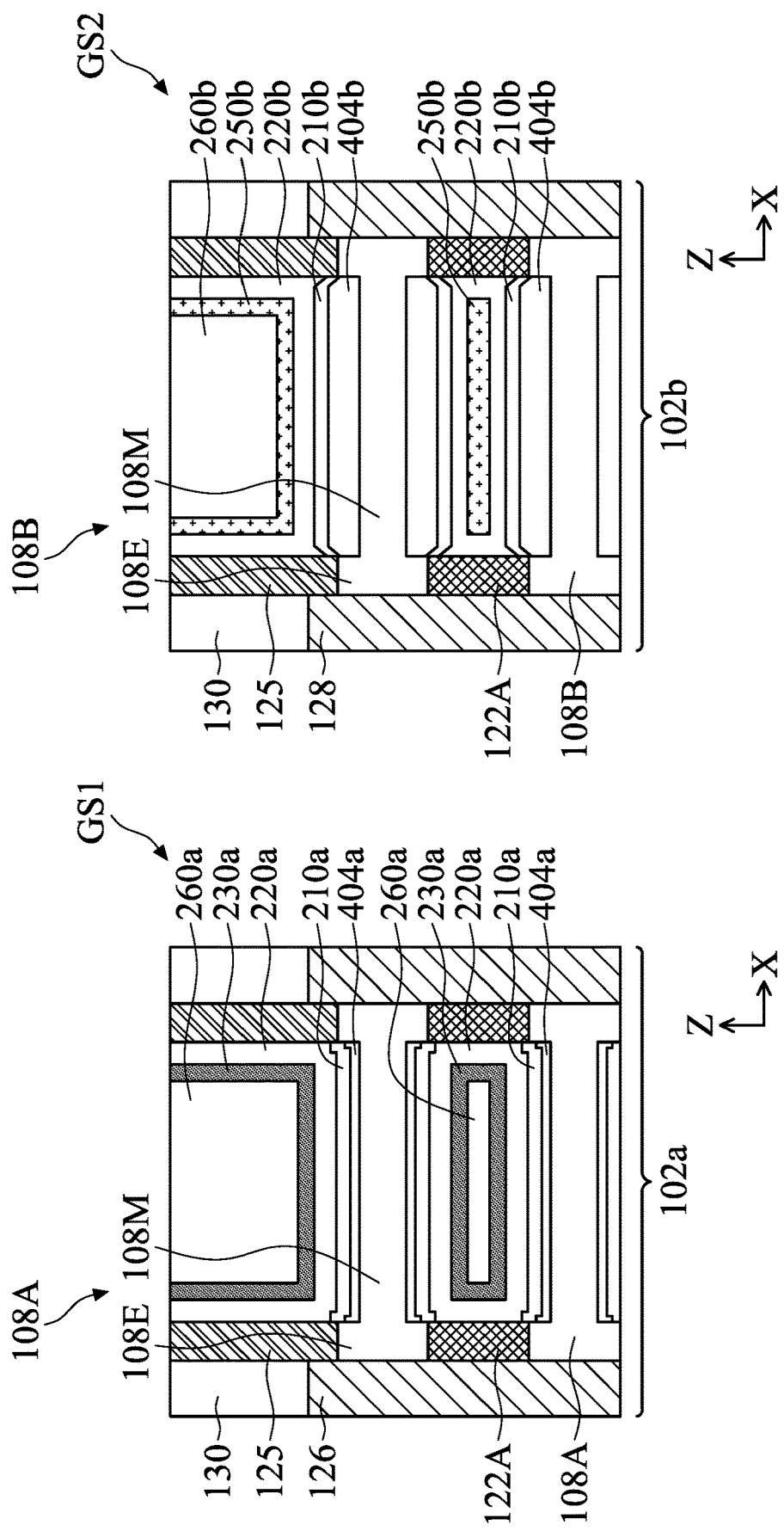

FIGS. 28A-1 to 28A-3 illustrate one or more steps of forming a semiconductor device during the method 2000 in accordance with some embodiments of the present disclosure. The structures shown in FIGS. 28A-1 to 28A-3 are similar to those shown in FIGS. 27B-1 to 27B-3 except for the semiconductor capping layers 404a having a thinner thickness than the semiconductor capping layers 404b, in accordance with some embodiments.

The semiconductor capping layers 404a in the region 102a (such as NMOS region) and the semiconductor capping layers 404b in the region 102b (such as PMOS region) are formed separately to adjust the effective work functions of the gate structures GS1 and GS2 for N-type FET and P-type FET, in accordance with some embodiments. The semiconductor capping layers 404a are formed to be thinner (e.g., thickness D5 shown in FIG. 26A-1), and the semiconductor capping layers 404b are formed to be thicker (e.g., thickness D6 shown in FIG. 27A-1), in accordance with some embodiments. In some embodiments, the germanium concentration of semiconductor capping layer 404a is less than the concentration of the semiconductor capping layer 404b.

FIGS. 29-1 and 29-2, FIGS. 30-1 and 30-2, FIGS. 31-1 to 31-2, and FIGS. 32-1 and 32-2 are cross-sectional views of modifications of the semiconductor devices of FIGS. 25D-1 and 25D-2, FIGS. 26B-1 and 26B-2, FIGS. 27B-1 to 27B-2, and FIGS. 28-1 to 28-2, respectively, where the source/drain features 126 (or 128) shown in FIG. 29-1 through 32-2 are formed adjoining to but not surrounding the nanostructures 108A (or 108B). The formation of the source/drain features 126 and 128 includes recessing the fin elements 112 including the epitaxial layers 106 and 108 (FIG. 6A) to form source/drain recesses (not shown) at the source/drain regions, in accordance with some embodiments. The dummy gate stack 118 and the spacers 125 may be used as etching mask. Afterward, one or more semiconductor material for the source/drain features 126 and 128 are grown on the fin elements 112 from the source/drain recesses using epitaxial growth processes, in accordance with some embodiments. The source/drain features 126 adjoin the end portions 108E of the nanostructures 108A, in accordance with some embodiments. The source/drain features 128 adjoin the end portions 108E of the nanostructures 108B, in accordance with some embodiments.

FIGS. 29-1 and 29-2, FIGS. 30-1 and 30-2, FIGS. 31-1 to 31-2, and FIGS. 32-1 and 32-2 are cross-sectional views of modifications of the semiconductor devices of FIGS. 25D-1 and 25D-2, FIGS. 26B-1 and 26B-2, FIGS. 27B-1 to 27B-2, and FIGS. 28-1 to 28-2, respectively, where the source/drain features 126 (or 128) shown in FIG. 29-1 through 32-2 are formed adjoining to but not surrounding the nanostructures 108A (or 108B). The formation of the source/drain features 126 and 128 includes recessing the fin elements 112 including the epitaxial layers 106 and 108 (FIG. 6A) to form source/drain recesses (not shown) at the source/drain regions, in accordance with some embodiments. The dummy gate stack 118 and the spacers 125 may be used as etching mask. Afterward, one or more semiconductor material for the source/drain features 126 and 128 are grown on the fin elements 112 from the source/drain recesses using epitaxial growth processes, in accordance with some embodiments. Because the portions of the fin elements 112 uncovered by the dummy gate stack 118 and the spacers 125 are removed, the end portion 108E of the nanostructures 108 are formed below the spacers 125. The source/drain features 126 adjoin the end portions 108E of the nanostructures 108A, in accordance with some embodiments. The source/drain features 128 adjoin the end portions 108E of the nanostructures 108B, in accordance with some embodiments.

As described above, the semiconductor device includes a set of nanostructures 108A, and each of the set of nanostructures 108 includes end portions 108E and a middle portion 108M between the end portions 108E. The end portions 108E are thicker than the middle portion 108M. The semiconductor device also includes a plurality of semiconductor capping layers 404 formed around the middle portions 108M of the set of nanostructures 108A, and a gate structure GS1 or GS2 formed around the plurality of semiconductor capping layers 404a. Because the middle portion 108M is thinner than the end portions 108E, the space between the middle portions 108M of neighboring nanostructures (i.e., the enlarged gap 133) may be filled with more work function adjustment layers, e.g., the semiconductor capping layers 404, the dielectric sheath layers 230 or 250, and/or metal layer 260. Therefore, the embodiments of the present disclosure may provide greater processing flexibility to achieve various transistors having different threshold voltages in a semiconductor substrate.

Embodiments of a semiconductor device may be provided. The semiconductor device includes a set of nanostructures with middle portions thinner than end portions, a plurality of semiconductor capping layers formed around the thinner middle portions of the nanostructures, and a gate structure formed around the semiconductor capping layers. Since the middle portion is thinner than the end portions, the space between the middle portions of neighboring nanostructures may be filled with more work function adjustment layers. Therefore, various transistors having different threshold voltages in a semiconductor substrate may be achieved.

According to various embodiments of the present disclosure, a semiconductor device includes a first set of nanostructures stacked over a substrate in a vertical direction, and each of the first set of nanostructures comprises a first end portion and a second end portion, and a first middle portion laterally between the first end portion and the second end portion. The first end portion and the second end portion are thicker than the first middle portion. The semiconductor device also includes a first plurality of semiconductor capping layers around the first middle portions of the first set of nanostructures, and a gate structure around the first plurality of semiconductor capping layers.

According to various embodiments of the present disclosure, a semiconductor device includes nanostructures stacked over a substrate in a vertical direction. The nanostructures comprise a first nanostructure, and the first nanostructure comprises a first end portion having a first inner side surface, a second end portion having a second inner side surface facing the first inner side surface, and a middle portion laterally between the first end portion and the second end portion. The semiconductor device also includes a first gate spacer and a second gate spacer covering the first end portion and the second end portion of the first nanostructure respectively, and a silicon germanium layer extending from the first inner side surface of the first end portion of the first nanostructure to the second inner side surface of the second end portion of the first nanostructure.

According to various embodiments of the present disclosure, a method for manufacturing a semiconductor device includes alternatingly stacking first epitaxial layers and second epitaxial layers over a substrate in a vertical direction; patterning the first epitaxial layers and the second epitaxial layers to form a fin structure; removing the first epitaxial layers of the fin structure thereby forming nanostructures from the second epitaxial layers of the fin structure; recessing middle portions of the nanostructures to form recessed middle portions of the nanostructures; forming silicon germanium layers around the recessed middle portions of the nanostructures; and forming a gate structure around the silicon germanium layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    alternatingly stacking first epitaxial layers and second epitaxial layers over a substrate in a vertical direction;
    patterning the first epitaxial layers and the second epitaxial layers to form a fin structure;
    removing the first epitaxial layers of the fin structure thereby forming nanostructures from the second epitaxial layers of the fin structure;
    recessing middle portions of the nanostructures to form recessed middle portions of the nanostructures;
    forming silicon germanium layers around the recessed middle portions of the nanostructures; and
    forming a gate structure around the silicon germanium layers.

2. The method for forming the semiconductor device as claimed in claim 1, further comprising:
    forming a dummy gate structure across the fin structure;
    forming gate spacer layers along opposite sides of the dummy gate structure; and
    removing the dummy gate structure,
    wherein the gate spacer layers cover first end portions and second end portions of the nanostructures while the middle portions of the nanostructures are being recessed, and the recessed middle portions of the nanostructures are formed between the first end portions and the second end portions of the nanostructures.

3. The method for manufacturing the semiconductor device as claimed in claim 2, wherein the silicon germanium layers are formed between the first end portions and the second end portions of the nanostructures.

4. The method for manufacturing the semiconductor device as claimed in claim 1, wherein forming the gate structure comprises:
    oxidizing portions of the silicon germanium layers to form interfacial layers.

5. The method for manufacturing the semiconductor device as claimed in claim 4, wherein forming the gate structure comprises:
    forming gate dielectric layers around the interfacial layers;
    forming dielectric sheath layers around the gate dielectric layers, wherein the dielectric sheath layers are made of $Y_2O_3$, $Lu_2O_3$, $La_2O_3$, SrO, $Al_2O_3$, $TiO_2$, $ZrO_2$, or MgO; and
    forming a metal gate electrode around the dielectric sheath layers.

6. A method for manufacturing a semiconductor device, comprising:
    forming a first channel region over a substrate;
    etching the first channel region to a first etching depth thereby forming an inner side surface;
    growing a first semiconductor capping layer on the first channel region to cover the inner side surface, wherein the first semiconductor capping layer is made of a different material than the first channel region;
    forming a first interfacial layer on the first semiconductor capping layer;
    forming a first high-k dielectric layer on the first interfacial layer; and
    forming a first metal layer on the first high-k dielectric layer.

7. The method for manufacturing the semiconductor device as claimed in claim 6, wherein forming the first interfacial layer comprises:
    oxidizing the first semiconductor capping layer.

8. The method for manufacturing the semiconductor device as claimed in claim 6, wherein the first semiconductor capping has a thickness that is substantially equal to the first etching depth.

9. The method for manufacturing the semiconductor device as claimed in claim 6, wherein the first semiconductor capping layer has a convex top surface.

10. The method for manufacturing the semiconductor device as claimed in claim 6, wherein the first semiconductor capping layer has a concave top surface.

11. The method for manufacturing the semiconductor device as claimed in claim 6, further comprising:
    forming a second channel region over a PMOS region of the substrate, wherein the first channel region is formed over an NMOS region of the substrate;
    etching the second channel region to the first etching depth;
    growing a second semiconductor capping layer on the second channel region,
    forming a second interfacial layer on the second semiconductor capping layer;
    forming a second high-k dielectric layer on the second interfacial layer; and
    forming a second metal layer on the second high-k dielectric layer.

12. The method for manufacturing the semiconductor device as claimed in claim 11, wherein the second semiconductor capping layer is thicker than the first semiconductor capping layer.

13. The method for manufacturing the semiconductor device as claimed in claim 11, further comprising:
    forming a first high-k dielectric sheath layer between the first high-k dielectric layer and the first metal layer; and
    forming a second high-k dielectric sheath layer between the second high-k dielectric layer and the second metal layer, wherein the first high-k dielectric sheath layer is made of a different material than the second high-k dielectric sheath layer.

14. The method for manufacturing the semiconductor device as claimed in claim 6, wherein the first channel region is wrapped by the first semiconductor capping layer.

15. A method for manufacturing a semiconductor device, comprising:
    forming a fin structure including first semiconductor layers and a second semiconductor layer sandwiched between the first semiconductor layers;

forming a dummy gate structure over the fin structure;
forming gate spacer layers alongside the dummy gate structure;
removing the dummy gate structure;
removing the first semiconductor layers;
etching a center portion of the second semiconductor layer to form a recess between end portions of the second semiconductor layer directly below the gate spacer layers; and
forming a third semiconductor layer to at least partially fill the recess.

16. The method for manufacturing the semiconductor device as claimed in claim 15, wherein the third semiconductor layer is made of SiGe and has a germanium concentration in a range from about 10 atomic % to about 60 atomic %.

17. The method for manufacturing the semiconductor device as claimed in claim 15, further comprising:
forming source/drain features to wrap around the end portions of the second semiconductor layer.

18. The method for manufacturing the semiconductor device as claimed in claim 15, further comprising:
forming an interfacial layer to surround the third semiconductor layer;
forming a high-k dielectric layer to surround the first interfacial layer;
forming a dielectric sheath layer to surround the high-k dielectric layer, wherein the dielectric sheath layer is made of a different material than the high-k dielectric layer; and
forming a first metal layer to surround the first dielectric sheath layer.

19. The method for manufacturing the semiconductor device as claimed in claim 15, wherein the recess is overfilled by the third semiconductor layer.

20. The method for manufacturing the semiconductor device as claimed in claim 15, wherein the recess has an etching depth that is about 0.1 to about 0.16 of a thickness of the end portions of the second semiconductor layer.

* * * * *